(12) United States Patent
Sasaki

(10) Patent No.: US 9,653,612 B2
(45) Date of Patent: May 16, 2017

(54) SEMICONDUCTOR DEVICE

(71) Applicant: Japan Display Inc., Tokyo (JP)

(72) Inventor: Toshinari Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/961,406

(22) Filed: Dec. 7, 2015

(65) Prior Publication Data

US 2016/0172499 A1   Jun. 16, 2016

(30) Foreign Application Priority Data

Dec. 12, 2014   (JP) ................................ 2014-251929

(51) Int. Cl.
*H01L 29/786* (2006.01)
*H01L 29/423* (2006.01)
*H01L 29/66* (2006.01)

(52) U.S. Cl.
CPC .... *H01L 29/7869* (2013.01); *H01L 29/42348* (2013.01); *H01L 29/66742* (2013.01); *H01L 29/78642* (2013.01); *H01L 29/78696* (2013.01)

(58) Field of Classification Search
None
See application file for complete search history.

(56) References Cited

U.S. PATENT DOCUMENTS

| 2011/0101338 A1* | 5/2011 | Yamazaki | H01L 27/1225 257/43 |
| 2011/0127526 A1* | 6/2011 | Kawae | H01L 29/78606 257/43 |
| 2013/0207111 A1* | 8/2013 | Yamazaki | H01L 29/78681 257/57 |

FOREIGN PATENT DOCUMENTS

JP   2010-062229 A   3/2010

* cited by examiner

*Primary Examiner* — Johannes P Mondt
(74) *Attorney, Agent, or Firm* — Typha IP LLC

(57) ABSTRACT

A semiconductor device includes a gate electrode having a first side wall at an end thereof, a gate insulating layer on a top surface and the first side wall of the gate electrode, an oxide semiconductor layer facing the first side wall, the gate insulating layer being between the first side wall and the oxide semiconductor layer, a first insulating layer on the oxide semiconductor layer, the oxide semiconductor layer being between the gate insulating layer and the first insulating layer, a first electrode connected with a first portion of the oxide semiconductor layer, and a second electrode connected with a second portion of the oxide semiconductor layer.

13 Claims, 42 Drawing Sheets

SEMICONDUCTOR DEVICE

CROSS REFERENCE TO RELATED APPLICATIONS

This application is based upon and claims the benefit of priority from the prior Japanese Patent Application No. 2014-251929 filed on Dec. 12, 2014, the entire contents of which are incorporated herein by reference.

FIELD

The present invention relates to a semiconductor device, and an embodiment disclosed herein relates to a structure and a layout of a semiconductor device.

BACKGROUND

Recently, a driving circuit of a display device, a personal computer or the like includes a semiconductor device such as a transistor, a diode or the like as a microscopic switching element. Especially in a display device, a semiconductor device is used as a selective transistor that supplies a voltage or a current in accordance with the gray scale of each of pixels and also used in a driving circuit that selects a pixel that supplies the voltage or the current. The characteristics required of a semiconductor vary in accordance with the use thereof. For example, a semiconductor used as a selective transistor is required to have a low off-current or little variance from another selective semiconductor. A semiconductor used in a driving circuit is required to have a high on-current.

To be used in a display device as described above, a semiconductor device including a channel formed of amorphous silicon, low-temperature polysilicon or single crystalline silicon has been conventionally developed. The semiconductor device including a channel formed of amorphous silicon or low-temperature polysilicon is formed in a process of 600° C. or lower, and therefore can be formed by use of a glass substrate. Especially, a semiconductor device including a channel formed of amorphous silicon can be formed with a simpler structure and in a process of 400° C. or lower, and therefore can be formed, for example, by use of a large glass substrate referred to as an eighth-generation glass substrate (2160×2460 mm). However, such a semiconductor device including a channel formed of amorphous silicon has a low mobility and is not usable in a driving circuit.

A semiconductor device including a channel formed of low-temperature polysilicon or single crystalline silicon has a higher mobility than the semiconductor device including a channel formed of amorphous silicon, and therefore is usable as a selective transistor and also in a driving circuit. However, such a semiconductor device including a channel formed of low-temperature polysilicon or single crystalline silicon has a complicated structure and needs a complicated process to be manufactured. In addition, such a semiconductor device needs to be formed in a process of 500° C. or higher, and therefore cannot be formed by use of a large glass substrate as described above. A semiconductor device including a channel formed of amorphous silicon, low-temperature polysilicon or single crystalline silicon has a high off-current. In the case where such a semiconductor device is used as a selective transistor, it is difficult to keep the applied voltage for a long time.

For the above-described reasons, a semiconductor device including a channel formed of an oxide semiconductor, instead of amorphous silicon, low-temperature polysilicon or single crystalline silicon, has been progressively developed recently (e.g., Japanese Laid-Open Patent Publication No. 2010-062229). It is known that a semiconductor device including a channel formed of an oxide semiconductor can be formed with a simple structure and in a low-temperature process like a semiconductor device including a channel formed of amorphous silicon, and has a mobility higher than that of a semiconductor device including a channel formed of amorphous silicon. It is also known that such a semiconductor device including a channel formed of an oxide semiconductor has a very low off-current.

However, the mobility of the semiconductor device including a channel formed of an oxide semiconductor is lower than that of the semiconductor device including a channel formed of low-temperature polysilicon or single crystalline silicon. Therefore, in order to provide a higher on-current, the semiconductor device including a channel formed of an oxide semiconductor needs to have a shorter channel length (L length). In order to shorten the channel length of the semiconductor device described in Japanese Laid-Open Patent Publication No. 2010-062229, a distance between a source and a drain needs to be shortened.

The distance between a source and a drain is determined by a photolithography step and an etching step. In the case where patterning is performed by photolithography, size reduction is restricted by the size of a mask pattern of an exposure device. Especially in the case where patterning is performed on a glass substrate by photolithography, the minimum size of a mask pattern is about 2 μm, and the reduction in the channel length of the semiconductor device is restricted by such a size of the mask pattern. The channel length of the semiconductor device is restricted by photolithography, and therefore, is influenced by the in-plane variance of the substrate in the photolithography step.

SUMMARY

A semiconductor device in an embodiment according to the present invention includes a gate electrode having a first side wall at an end thereof, a gate insulating layer on a top surface and the first side wall of the gate electrode, an oxide semiconductor layer facing the first side wall, the gate insulating layer being between the first side wall and the oxide semiconductor layer, a first insulating layer on the oxide semiconductor layer, the oxide semiconductor layer being between the gate insulating layer and the first insulating layer, a first electrode connected with a first portion of the oxide semiconductor layer, and a second electrode connected with a second portion of the oxide semiconductor layer.

A semiconductor device in an embodiment according to the present invention includes a gate electrode having a first side wall at an end thereof, an oxide semiconductor layer along the first side wall, a gate insulating layer between the gate electrode and the oxide semiconductor layer, a first insulating layer on the oxide semiconductor layer, the oxide semiconductor layer being between the gate electrode and the first insulating layer, a first electrode connected with a first portion of the oxide semiconductor layer, and a second electrode connected with a second portion of the oxide semiconductor layer.

DESCRIPTION OF EMBODIMENTS

Figure 1A:
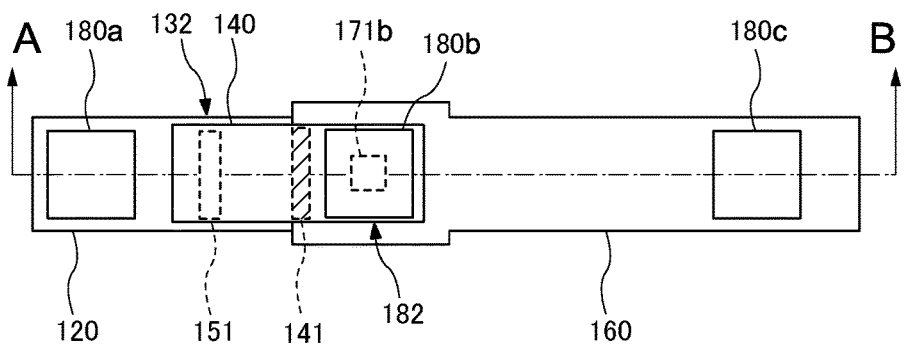
FIG. 1A is a plan view showing an overview of a semiconductor device in an embodiment according to the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted. The following embodiments are presented for the purpose of providing a semiconductor device capable of increasing the on-current or providing a semiconductor device capable of suppressing the in-plane variance of the channel length.

Embodiment 1

Figure 1B:
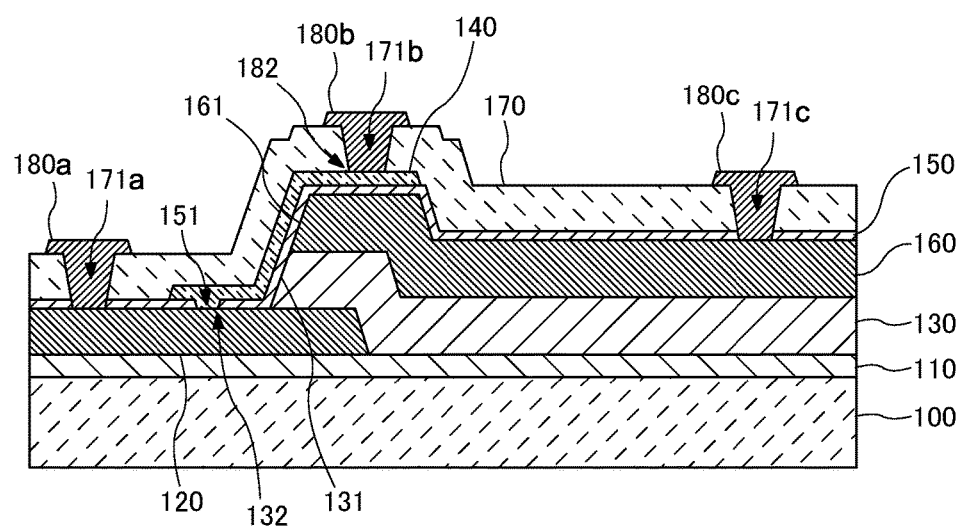
FIG. 1B is a cross-sectional view taken along line A-B in FIG. 1A.

With reference to FIG. 1A and FIG. 1B, an overview of a semiconductor device 10 in embodiment 1 according to the present invention will be described. The semiconductor device 10 in embodiment 1 is usable in a pixel or a driving circuit of a liquid crystal display device (LCD), a spontaneous display device using an organic light-emitting diode (OLED) such as an organic EL element, a quantum dot or the like for a display unit, or a reflection-type display device such as an electronic paper or the like.

It should be noted that a semiconductor device according to the present invention is not limited to being used in a display device, and may be used in, for example, an integrated circuit (IC) such as a microprocessing unit (MPU) or the like. The semiconductor device 10 in embodiment 1 is described as having a structure including a channel formed of an oxide semiconductor. The semiconductor device 10 in embodiment 1 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 1, the semiconductor device 10 is a transistor. This does not limit the semiconductor device according to the present invention to a transistor.

[Structure of the Semiconductor Device 10]

FIG. 1A and FIG. 1B are respectively a plan view and a cross-sectional view showing an overview of the semiconductor device 10 in embodiment 1 according to the present invention. As shown in FIG. 1B, the semiconductor device 10 includes a substrate 100, an underlying layer 110 located on the substrate 100, a first electrode (lower electrode 120) located on the underlying layer 110, and an insulating layer (second insulating layer 130) located on the underlying layer 110 and a part of the lower electrode 120 and having a side wall (second side wall 131) at an end thereof.

The semiconductor device 10 also includes a gate electrode 160 having a side wall (first side wall 161) at an end thereof, a gate insulating layer 150 located on a top surface and the first side wall 161 of the gate electrode 160 and also on the second side wall 131 of the second insulating layer 130, an oxide semiconductor layer 140 facing the first side wall 161 and the second side wall 131, with the gate insulating layer 150 being located therebetween, and connected with the lower electrode 120 via a first opening 151 provided in the gate insulating layer 150, and an insulating layer (first insulating layer 170) located on the oxide semiconductor layer 140 on the side opposite to the gate insulating layer 150. In the above-described structure, the lower electrode 120 may be described as being connected with a portion (first portion) of the oxide semiconductor layer 140.

As shown in FIG. 1B, the second insulating layer 130 is located between the gate electrode 160 and the lower electrode 120. As shown in FIG. 1A, the gate electrode 160 overlaps the lower electrode 120 as seen in a plan view. As shown in FIG. 1B, the lower electrode 120 and the gate electrode 160 are insulated from each other by the second insulating layer 130.

The semiconductor device 10 further includes second electrodes (upper electrodes 180) located in second openings 171 provided in the first insulating layer 170. The upper electrodes 180 specifically include upper electrodes 180a, 180b and 180c, but may be collectively referred to as the "upper electrodes 180" in the case where the upper electrodes 180a, 180b and 180c are not specifically distinguished from each other. The upper electrodes 180a, 180b and 180c are respectively connected with the lower electrode 120, the oxide semiconductor layer 140 and the gate electrode 160. The second openings 171 specifically include second openings 171a, 171b and 171c, but may be collectively referred to as the "second openings 171" in the case where the second openings 171a, 171b and 171c are not specifically distinguished from each other. In the above-described structure, the upper electrode 180b may be described as being connected with another portion (second portion) of the oxide semiconductor layer 140.

The above-described structure may also be expressed as follows. The oxide semiconductor layer 140 is located along a part of the top surface of the gate electrode 160 and along the first side wall 161. The gate insulating layer 150 is located between the gate electrode 160 and the oxide semiconductor layer 140. The first insulating layer 170 is located on the oxide semiconductor layer 140 on the side opposite to the gate electrode 160.

Herein, an expression that "a first member and a second member are connected with each other" indicates that the first member and the second member are at least electrically connected with each other. Namely, the first member and the second member may be physically connected with each other directly, or another member may be provided between the first member and the second member. For example, an expression that the oxide semiconductor layer 140 is connected with the lower electrode 120 may indicate that the oxide semiconductor layer 140 and the lower electrode 120 are in direct contact with each other, or that another member is provided between the oxide semiconductor layer 140 and the lower electrode 120. Similarly, for example, an expression that the upper electrode 180a is connected with the lower electrode 120 may indicate that the upper electrode 180a and the lower electrode 120 are in direct contact with each other, or that another member is provided between the upper electrode 180a and the lower electrode 120.

As shown in FIG. 1B, both of, or one of, the first side wall 161 and the second side wall 131 has a tapered inclining surface tending to close upward. Such a shape may be referred to as "forward tapered". In this case, the oxide semiconductor layer 140 and the gate insulating layer 150 may be described as being located on the first side wall 161 and the second side wall 131. The first insulating layer 170 may be described as being located on the oxide semiconductor layer 140. In the example shown in FIG. 1B, the first insulating layer 170 is in contact with the oxide semiconductor layer 140.

As shown in FIG. 1A, as seen in a plan view, the lower electrode 120 is connected with the oxide semiconductor layer 140, in a first region 132 outer to the gate electrode 160, via the first opening 151 provided in the gate insulating layer 150. Also as seen in a plan view, the upper electrode 180b is connected with the oxide semiconductor layer 140, in a second region 182 inner to an outer perimeter of the gate electrode 160, via the second opening 171b provided in the first insulating layer 170.

As shown in FIG. 1A, as seen in a plan view, the upper electrode 180a is located inner to an outer perimeter of the lower electrode 120. Also as seen in a plan view, the upper electrodes 180b and 180c are located inner to the outer perimeter of the gate electrode 160. It should be noted that the upper electrode 180a does not need to be located inner to the outer perimeter of the lower electrode 120, and may be partially located outer to the lower electrode 120. Similarly, neither the upper electrode 180b nor the upper electrode 180c needs to be located inner to the outer perimeter of the gate electrode 160, and both of, or one of, the upper electrodes 180b and 180c may be located outer to the gate electrode 160.

In the example shown in FIG. 1A and FIG. 1B, the gate electrode 160 and the second insulating layer 130 have substantially the same pattern, and the first side wall 161 and the second side wall 131 have the same plane. The gate electrode 160 and the second insulating layer 130 are not limited to having such a structure. The gate electrode 160 and the second insulating layer 130 may have different patterns from each other. The first side wall 161 and the second side wall 131 may have different planes. In the example shown in FIG. 1B, the second insulating layer 130 and the gate electrode 160 have substantially the same thickness. In such an illustration, the thickness is shown in an emphasized manner in order to clearly show the structure of the semiconductor device 10. The second insulating layer 130 and the gate electrode 160 are not limited to having substantially the same thickness as is shown in FIG. 1B. More specifically, the second insulating layer 130 may be sufficiently thinner, or sufficiently thicker, than the gate electrode 160.

As described above, the oxide semiconductor layer 140 includes a portion (first portion) thereof connected with the lower electrode 120 in the first region 132 and another portion (second portion) thereof connected with the upper electrode 180b in the second region 182. In the case where a source voltage is applied to the upper electrode 180a and a drain voltage is applied to the upper electrode 180b, the first region 132 may be referred to as a "source region" and the second region 182 may be referred to as a "drain region". The source region and the drain region may be switched with each other by a voltage to be applied. For example, in the case where, oppositely to the above, a drain voltage is applied to the upper electrode 180a and a source voltage is applied to the upper electrode 180b, the first region 132 may be referred to as a "drain region" and the second region 182 may be referred to as a "source region".

In the example shown in FIG. 1B, the second insulating layer 130 is located between the lower electrode 120 and the gate electrode 160. In the case of, for example, a diode connection by which a gate electrode and a source electrode of a three-terminal transistor are connected with each other, the second insulating layer 130 does not need to be provided. More specifically, depending on the function required of the semiconductor device 10, the lower electrode 120 and the gate electrode 160 overlapping each other as seen in a plan view may be in contact with each other without the second insulating layer 130 being provided.

The substrate 100 may be formed of glass. Alternatively, the substrate 100 may be formed of a light-transmissive insulating material such as quartz, sapphire, a resin or the like. In the case where the semiconductor device 10 is used in an integrated circuit, not in a display device, the substrate 100 may be formed of a light-non-transmissive material, for example, a semiconductor such as silicon, silicon carbide, a compound semiconductor or the like, or a conductive material such as stainless steel or the like.

The underlying layer 110 may be formed of a material that suppresses diffusion of impurities from the substrate 100 into the oxide semiconductor layer 140. For example, the underlying layer 110 may be formed of silicon nitride ($SiN_x$), silicon nitride oxide ($SiN_xO_y$), silicon oxide ($SiO_x$), silicon oxide nitride ($SiO_xN_y$), aluminum nitride ($AlN_x$), aluminum nitride oxide ($AlN_xO_y$), aluminum oxide ($AlO_x$), aluminum oxide nitride ($AlO_xN_y$), or the like (x and y each represent an arbitrary value). Alternatively, the underlying layer 110 may have a structure including a stack of films of such materials.

$SiO_xN_y$ and $AlO_xN_y$ are respectively a silicon compound and an aluminum compound containing nitrogen (N) at a lower content than oxygen (O). $SiN_xO_y$ and $AlN_xO_y$ are respectively a silicon compound and an aluminum compound containing oxygen at a lower content than nitrogen.

The underlying layer 110 described above as an example is formed of a thin film, the thickness of which is controllable by a nanometer order (range less than 1 μm). As a method for controlling the thickness of a thin film by a nanometer order, a PVD (Physical Vapor Deposition) method or a CVD (Chemical Vapor Deposition) method is usable. Examples of the usable PVD method include sputtering, vacuum vapor deposition, electron beam vapor deposition, plating, molecular beam epitaxy, and the like. Examples of the usable CVD method include thermal CVD, plasma CVD, catalyst CVD (catalytic-CVD or hot-wire CVD), and the like. A method other than the above-listed vapor deposition methods may be used as long as the film thickness can be controlled by a nanometer order.

The lower electrode 120 may be formed of a common metal material or a common conductive semiconductor material. For example, the lower electrode 120 may be formed of aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like. Alternatively, the lower electrode 120 may be formed of an alloy of such materials or a nitride of such materials. Still alternatively, the lower electrode 120 may be formed of a conductive oxide semiconductor such as ITO (indium tin oxide), IGO (indium gallium oxide), IZO (indium zinc oxide), GZO (zinc oxide containing gallium as a dopant), or the like. The lower electrode 120 may have a structure including a stack of films of such materials. The lower electrode 120 may be formed of a thin film, the thickness of which is controllable by a nanometer order, like the underlying layer 110.

Preferably, the material used for the lower electrode 120 is resistant to a heat treatment in a manufacturing process of a semiconductor device including a channel formed of an oxide semiconductor, and has a low contact resistance with the oxide semiconductor layer 140. As a material having a good electric contact with the oxide semiconductor layer 140, a metal material having a work function smaller than that of the oxide semiconductor layer 140 is usable.

The second insulating layer 130 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110. Alternatively, the second insulating layer 130 may be formed of an organic insulating material such as a polyimide resin, an acrylic resin, an epoxy resin, a silicone resin, a fluorine resin, a siloxane resin, or the like. The second insulating layer 130 is formed of a thin film, the thickness of which is controllable by a nanometer order. The second insulating layer 130 may be formed by substantially the same method as that of the underlying layer 110. The second insulating layer 130 and the underlying layer 110 may be formed of the same material as, or different materials from, each other. The second insulating layer 130 may be formed of an inorganic insulating film of $SiN_x$ or the like containing hydrogen. In this case, hydrogen in $SiN_x$ reaches the oxide semiconductor layer 140 to generate carriers in a heat treatment or the like in a manufacturing process of the semiconductor device 10. This increases the electric conductivity of the oxide semiconductor layer 140.

In the example shown in FIG. 1A and FIG. 1B, the second insulating layer 130 has a cross-section with the forward tapered second side wall 131 being linear. The second insulating layer 130 is not limited to having this structure. The forward tapered second side wall 131 may be curved as protruding outward or curved as protruding inward. Instead of being forward tapered, the second side wall 131 may be vertical with respect to the surface of the substrate 100, or reverse tapered, namely, incline while tending to close downward.

In the example shown in FIG. 1A and FIG. 1B, the second insulating layer 130 is formed of a single layer. The second insulating layer 130 is not limited to having this structure, and may include a stack of a plurality of layers. In the case where the second insulating layer 130 includes a stack structure, the tapering angle and the shape of the second side wall 131 may be different layer by layer. Alternatively, the second insulating layer 130 may include a stack of layers of different properties (e.g., $SiN_x$ and $SiO_x$) such that different portions, along the second side wall 131, of the oxide semiconductor layer 140 have different properties. Namely, the semiconductor device 10 may have a channel formed of portions of the oxide semiconductor layer 140 that are of different characteristics and are connected to each other in series.

The oxide semiconductor layer 140 may be formed of a metal oxide material having the characteristics of a semiconductor. For example, the oxide semiconductor layer 140 may be formed of an oxide semiconductor containing indium (In), gallium (Ga), Zinc (Zn) and oxygen (O). Especially, the oxide semiconductor layer 140 may be formed of an oxide semiconductor having a composition ratio of In:Ga:Zn:O=1:1:1:4. It should be noted that the oxide semiconductor used in the present invention and containing In, Ga, Zn and O is not limited to having the above-described composition ratio. An oxide semiconductor having a different composition ratio is also usable. For example, in order to improve the mobility, the ratio of In may be increased. In order to increase the bandgap and thus decrease the influence of light, the ratio of Ga may be increased. The oxide semiconductor layer 140 may be formed of a thin film, the thickness of which is controllable by a nanometer order.

The oxide semiconductor containing In, Ga, Zn and O may contain another element added thereto. For example, a metal element such as Al, Sn or the like may be added. Instead of the above-described oxide semiconductor, zinc oxide (ZnO), nickel oxide (NiO), tin oxide ($SnO_2$), titanium oxide ($TiO_2$), vanadium oxide ($VO_2$), indium oxide ($In_2O_3$), strontium titanate ($SrTiO_3$), or the like may be used. The oxide semiconductor layer 140 may be amorphous or crystalline. Alternatively, the oxide semiconductor layer 140 may have a mixed phase of an amorphous phase and a crystalline phase.

The gate insulating layer 150 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110 and the second insulating layer 130. Alternatively, the gate insulating layer 150 may have a structure including a stack of insulating films of such materials. The gate insulating layer 150 may be formed of a thin film, the thickness of which is controllable by a nanometer order. The gate insulating layer 150 may be formed by substantially the same method as that of the underlying layer 110. The gate insulating layer 150, the underlying layer 110 and the second insulating layer 130 may be formed of the same material as, or different materials from, each other.

The gate electrode 160 may be formed of any of substantially the same materials as those described above regarding the lower electrode 120. The gate electrode 160 may be formed of the same material as, or a different material from, that of the lower electrode 120. Preferably, the material used for the gate electrode 160 is resistant to a heat treatment in a manufacturing process of a semiconductor device including a channel formed of an oxide semiconductor, and has a work function with which the transistor is of an enhancement type that is turned off when the gate electrode is of 0 V. The gate electrode 160 may be formed of a thin film, the thickness of which is controllable by a nanometer order.

In the example shown in FIG. 1A and FIG. 1B, the gate electrode 160 has a cross-section with the forward tapered first side wall 161 being linear. The gate electrode 160 is not limited to having this structure. The forward tapered first side wall 161 may be curved as protruding outward or curved as protruding inward. Instead of being forward tapered, the first side wall 161 may be vertical with respect to the surface of the substrate 100, or reverse tapered, namely, incline while tending to close downward.

In the example shown in FIG. 1A and FIG. 1B, the gate electrode 160 is formed of a single layer. The gate electrode 160 is not limited to having this structure, and may include a stack of a plurality of layers. In the case where the gate electrode 160 includes a stack structure, the tapering angle and the shape of the first side wall 161 may be different layer by layer.

The first insulating layer 170 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110, the second insulating layer 130 and the gate insulating layer 150. The first insulating layer 170 may be formed of a thin film, the thickness of which is controllable by a nanometer order. The first insulating layer 170 may be formed by substantially the same method as that of the underlying layer 110. Instead of the above-listed inorganic insulating materials, the first insulating layer 170 may be formed of a TEOS layer or an organic insulating material. The TEOS layer refers to a CVD layer formed of TEOS (Tetra Ethyl Ortho Silicate), and has an effect of alleviating the steps of, and thus flattening, a layer therebelow. Examples of the usable organic insulating material include a polyimide resin, an acrylic resin, an epoxy resin, a silicone resin, a fluorine resin, a siloxane resin, and the like. The first insulating layer 170 may be formed of a single layer or a stack of films of such materials. For example, the first insulating layer 170 may include a stack of an inorganic insulating material and an organic insulating material.

The upper electrodes 180 may be formed of any of substantially the same materials as those described above regarding of the lower electrode 120 and the gate electrode 160. The upper electrodes 180 may be formed of the same material as, or a different material from, that of the lower electrode 120 and the gate electrode 160. Alternatively, the upper electrodes 180 may be formed of copper (Cu), silver (Ag), gold (Au), or the like instead of the above-listed materials regarding the lower electrode 120 and the gate electrode 160. The upper electrodes 180 may be formed of a thin film, the thickness of which is controllable by a nanometer order.

Preferably, the material used for each of the upper electrodes 180 is resistant to a heat treatment in a manufacturing process of a semiconductor device including a channel formed of an oxide semiconductor, and has a low contact resistance with the oxide semiconductor layer 140. As a material having a good electric contact with the oxide semiconductor layer 140, a metal material having a work function smaller than that of the oxide semiconductor layer 140 is usable for the upper electrodes 180.

[Operation of the Semiconductor Device 10]

An operation of the semiconductor device 10 shown in FIG. 1A and FIG. 1B will be described. The semiconductor device 10 is a transistor including a channel formed of the oxide semiconductor layer 140. A gate voltage is applied to the upper electrode 180c connected with the gate electrode 160, a drain voltage is applied to the upper electrode 180a connected with the lower electrode 120, and a source voltage is applied to the upper electrode 180b connected with the oxide semiconductor layer 140. The source voltage and the drain voltage may be applied oppositely.

When the gate voltage is applied to the gate electrode 160, an electric field in accordance with the gate voltage is formed, via the gate insulating layer 150, in a portion of the oxide semiconductor layer 140 facing the gate electrode 160. The electric field generates carriers in the oxide semiconductor layer 140. When a potential difference is caused between the lower electrode 120 and the upper electrode 180b in the state where the carriers are generated in the oxide semiconductor layer 140, the carriers generated in the oxide semiconductor layer 140 are moved in accordance with the potential difference. Namely, electrons are moved from the upper electrode 180b to the lower electrode 120.

The electrons are supplied from the upper electrode 180b to the oxide semiconductor layer 140 in the source region 182 and are transferred from the oxide semiconductor layer 140 to the lower electrode 120 in the drain region 132. Namely, in the semiconductor device 10, the portion of the oxide semiconductor layer 140 that is located on the first side wall 161 and the second side wall 131 acts as a channel. Therefore, the channel length of the semiconductor device 10 is controlled by the thickness of the second insulating layer 130 and the gate electrode 160 and the tapering angle of the first side wall 161 and the second side wall 131.

A portion of the oxide semiconductor layer 140 located on a portion of the gate insulating layer 150 that is on the second side wall 131 is not influenced by the electric field even when a voltage is applied to the gate electrode 160. No carrier is generated by the electric field. In order to further improve the electric conductivity of the oxide semiconductor layer 140, the second insulating layer 130 may be formed of $SiN_x$, which generates carriers in the oxide semiconductor layer 140. In the case where the second insulating layer 130 is formed of $SiN_x$, the carriers are generated by a heat treatment or the like in the portion of the oxide semiconductor layer 140 located on the portion of the gate insulating layer 150 that is located on the second side wall 131. Alternatively, a high voltage at which carriers are generated in the oxide semiconductor layer 140 may be applied to the lower electrode 120 to drive the semiconductor device 10, so that the carriers are generated in the portion of the oxide semiconductor layer 140 located on the portion of the gate insulating layer 150 that is on the second side wall 131.

In the case where the electric conductivity of the portion of the oxide semiconductor layer 140 adjacent to the second side wall 131 is low, a transistor having a one-sided offset structure is provided, in which the portion of the oxide semiconductor layer 140 adjacent to the second side wall 131 is offset. In such a transistor having a one-sided offset structure, when a drain voltage is applied to the lower electrode 120, which is on the side where the offset is provided, the electrons in the oxide semiconductor layer 140 that are in the vicinity of the offset are influenced by the drain voltage applied to the lower electrode 120. Therefore, an electric current flows. By contrast, when a source voltage is applied to the lower electrode 120, the electrons in the oxide semiconductor layer 140 that are in the vicinity of the offset are not influenced almost at all by the drain voltage applied to the upper electrode 180b. Therefore, no electric current flows. Namely, the semiconductor device 10 having a one-sided offset structure has a rectification function and is usable as a diode element.

As described above, in the semiconductor device 10 in embodiment 1 according to the present invention, the portion of the oxide semiconductor layer 140 that is located on the first side wall 161 of the gate electrode 160 and the second side wall of the second insulating layer 130 acts as a channel. Therefore, the channel length of the semiconductor device 10 may be controlled by controlling the thickness of the second insulating layer 130 and the gate electrode 160 or the tapering angle of the first side wall 161 and the second side wall 131, or by controlling both of the thickness of the second insulating layer 130 and the gate electrode 160 and the tapering angle of the first side wall 161 and the second side wall 131. As described above, the second insulating layer 130 and the gate electrode 160 are formed of a thin film, the thickness of which is controllable by a nanometer order. Therefore, the semiconductor device 10 may have a channel length shorter than the limit of patterning by photolithography, by which variance is of a micrometer order. As a result, the semiconductor device 10 is capable of increasing the on-current.

The second insulating layer 130 and the gate electrode 160 are formed by a PVD method or a CVD method, and the thickness thereof may be controlled by a nanometer order, as described above. Therefore, the in-plane variance of the thickness may also be controlled by a nanometer order. The tapering angle of the first side wall 161 and the second side wall 131 may be controlled by the etching rate of the second insulating layer 130 and the gate electrode 160 and the retraction amount of a resist used to form the second insulating layer 130 and the gate electrode 160. The variance of the etching rate and the retraction amount of the resist may also be controlled by substantially the same order as the variance of the thickness of the second insulating layer 130 and the gate electrode 160. Therefore, the in-plane variance of the thickness of the second insulating layer 130 and the gate electrode 160 and the tapering angle of the first side wall 161 and the second side wall 131 is smaller than the in-plane variance of the patterning precision by photolithography, which is of a micrometer order. As a result, the semiconductor device 10 is capable of suppressing the in-plane variance of the channel length.

Since the inclining surface of the first side wall 161 and the second side wall 131 is tapered, the coverage of the gate insulating layer 150 and the oxide semiconductor layer 140 with respect to the first side wall 161 and the second side wall 131 is improved. This improves the controllability on the thickness of the gate insulating layer 150 and the oxide semiconductor layer 140 formed on the first side wall 161 and the second side wall 131. As a result, the semiconductor device 10 has little variance in the characteristics.

[Manufacturing Method of the Semiconductor Device 10]

With reference to plan views and cross-sectional views provided in FIG. 2A through FIG. 6B, a manufacturing method of the semiconductor device 10 in embodiment 1 according to the present invention will be described. FIG.

Figure 2A:
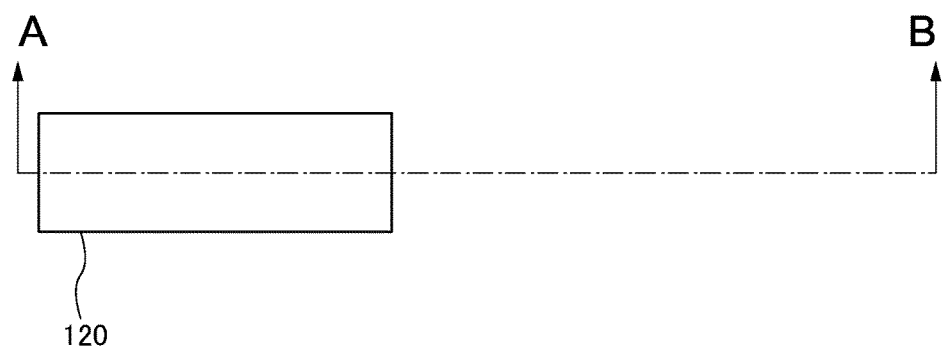
FIG. 2A is a plan view showing a step of forming a lower electrode in a manufacturing method of the semiconductor device in the embodiment according to the present invention.
Figure 2B:
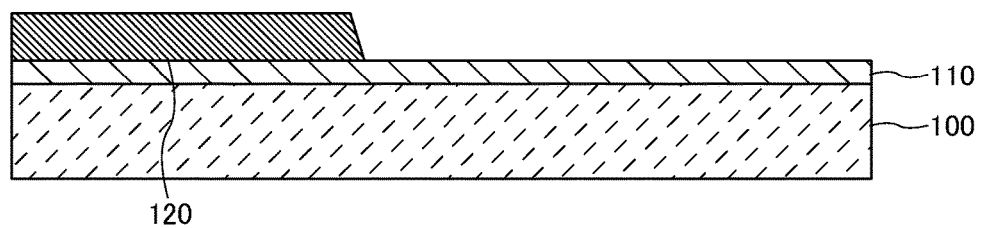
FIG. 2B is a cross-sectional view taken along line A-B in FIG. 2A.

2A and FIG. 2B are respectively a plan view and a cross-sectional view showing a step of forming the lower electrode 120 in the manufacturing method of the semiconductor device 10 in embodiment 1 according to the present invention. Referring to FIG. 2B, the underlying layer 110 and a film for the lower electrode 120 are formed on the substrate 100, and patterning is performed as shown in FIG. 2A by photolithography and etching to form the lower electrode 120. Preferably, the etching is performed to form the lower electrode 120 under the condition that the etching rate ratio of the lower electrode 120 with respect to the underlying layer 110 is high. In this and the following descriptions of manufacturing methods of semiconductor devices in embodiments according to the present invention, an assembly of the substrate 100 and the film(s) formed thereon at each step will be referred to as the "substrate" for the sake of convenience.

Figure 3A:
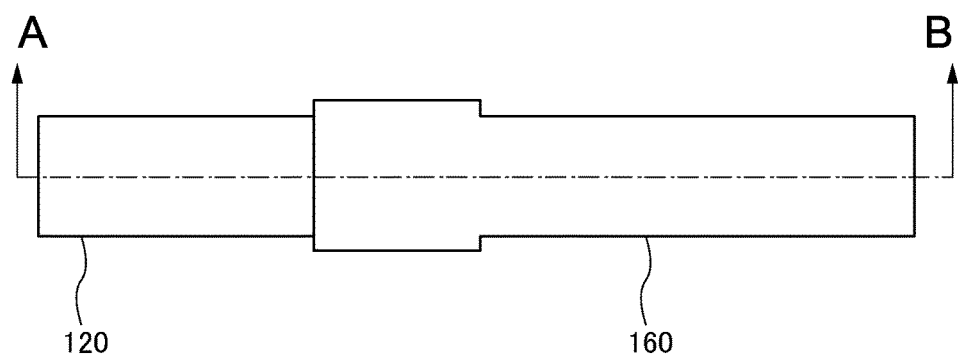
FIG. 3A is a plan view showing a step of forming a second insulating layer and a gate electrode in the manufacturing method of the semiconductor device in the embodiment according to the present invention.
Figure 3B:
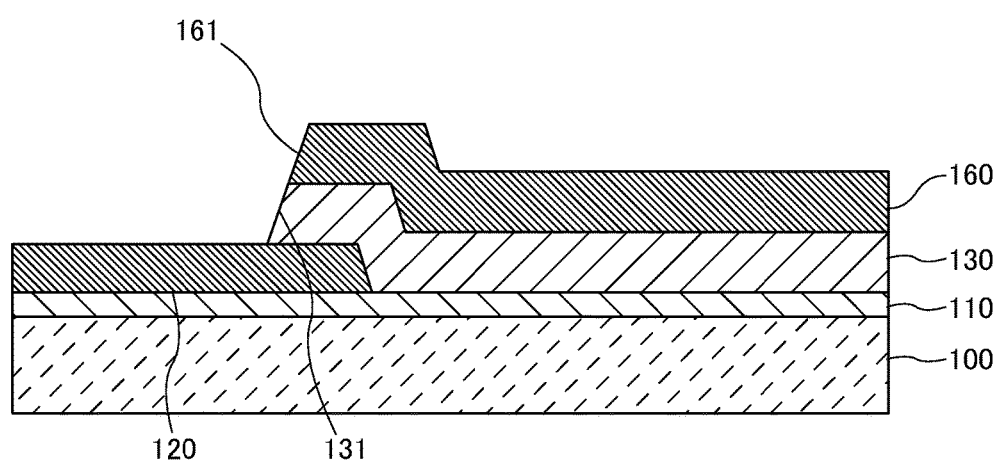
FIG. 3B is a cross-sectional view taken along line A-B in FIG. 3A.

FIG. 3A and FIG. 3B are respectively a plan view and a cross-sectional view showing a step of forming the second insulating layer 130 and the gate electrode 160 in the manufacturing method of the semiconductor device 10 in embodiment 1 according to the present invention. Referring to FIG. 3B, a film for the second insulating layer 130 and a film for the gate electrode 160 are formed on the entirety of the substrate shown in FIG. 2B, and patterning is performed as shown in FIG. 3A by photolithography and etching to form the second insulating layer 130 and the gate electrode 160. As shown in FIG. 3B, the gate electrode 160 has the first side wall 161, and the second insulating layer 130 has the second side wall 131. The second insulating layer 130 and the gate electrode 160 have substantially the same pattern, and thus FIG. 3A shows the pattern of the gate electrode 160. The second insulating layer 130 and the gate electrode 160 may be etched together or in separate steps. For example, after the second insulating layer 130 is formed by patterning, the film for the gate electrode 160 may be formed on a top surface and the second side wall 131 of the second insulating layer 130 and patterned to form the gate electrode 160 by photolithography and etching. In this case, the second insulating layer 130 and the gate electrode 160 may have different patterns from each other.

Preferably, the etching is performed to form the second insulating layer 130 under the condition that the etching rate ratio of the second insulating layer 130 with respect to at least the lower electrode 120 is high. More preferably, the etching is performed to form the second insulating layer 130 under the condition that the etching rate ratio of the second insulating layer 130 with respect to both of the lower electrode 120 and the underlying layer 110 is high. In the case where it is difficult to guarantee a high etching rate ratio of the second insulating layer 130 with respect to the underlying layer 110, for example, in the case where the second insulating layer 130 and the underlying layer 110 are formed of the same material, an etching stopper layer may be formed on the underlying layer 110.

Now, an etching method for forming the second side wall 131 of the second insulating layer 130 to be tapered will be described. The tapering angle of the second side wall 131 may be controlled by the etching rate of the second insulating layer 130 and the etching rate, in a horizontal direction, of a resist used as a mask for etching the second insulating layer 130 (hereinafter, referred to as the "retraction amount of the resist"). In the case where, for example, the retraction amount of the resist is smaller than the etching rate of the second insulating layer 130, the tapering angle of the second side wall 131 is large (close to vertical). In the case where the retraction amount of the resist is zero, the second side wall 131 is vertical. By contrast, in the case where the retraction amount of the resist is larger than the etching rate of the second insulating layer 130, the tapering angle of the second side wall 131 is small (close to horizontal). The retraction amount of the resist may be adjusted by the tapering angle of an end of the resist and the etching rate of the resist.

In the case where the second insulating layer 130 and the gate electrode 160 are etched together, the etching for forming the second insulating layer 130 and the gate electrode 160 may preferably be performed under the condition that the etching rate ratio of the second insulating layer 130 and the gate electrode 160 with respect to the lower electrode 120 is high. By contrast, in the case where the second insulating layer 130 and the gate electrode 160 are etched in separate steps, the etching for forming the gate electrode 160 may preferably be performed under the condition that the etching rate ratio of the gate electrode 160 with respect to the second insulating layer 130 is high. Like the tapering angle of the second side wall 131, the tapering angle of the first side wall 161 of the gate electrode 160 may be controlled by the etching rate of the gate electrode 160 and the retraction amount of a resist used as a mask for etching the gate electrode 160.

Figure 4A:
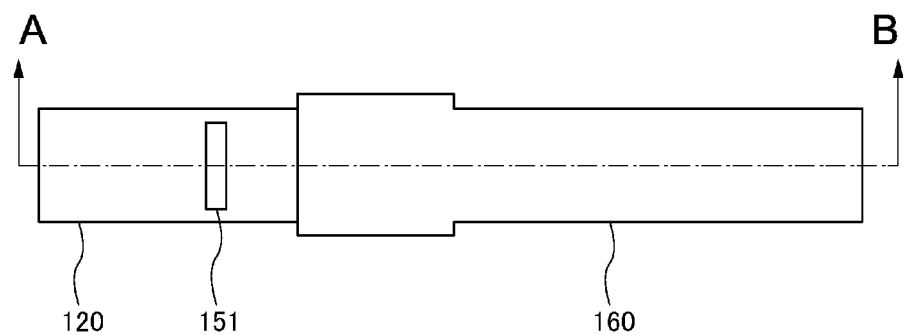
FIG. 4A is a plan view showing a step of forming a gate insulating layer and exposing a part of the lower electrode in the manufacturing method of the semiconductor device in the embodiment according to the present invention.
Figure 4B:
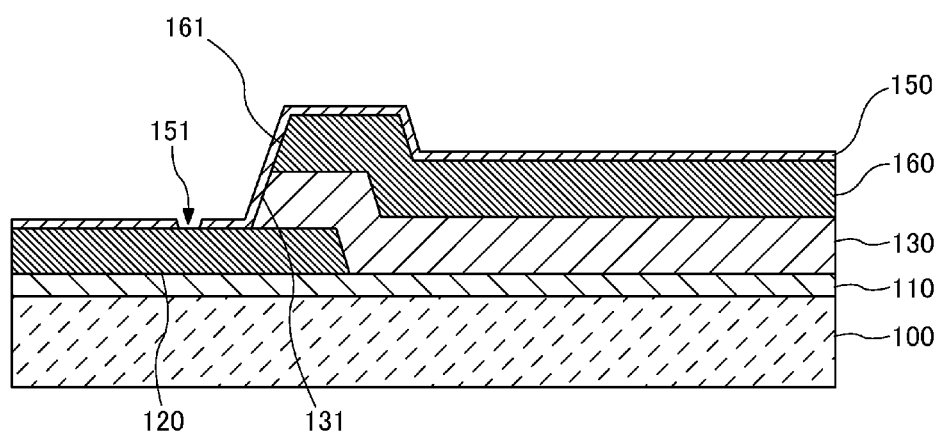
FIG. 4B is a cross-sectional view taken along line A-B in FIG. 4A.

FIG. 4A and FIG. 4B are respectively a plan view and a cross-sectional view showing a step of forming the gate insulating layer 150 and exposing a part of the lower electrode 120 in the manufacturing method of the semiconductor device 10 in embodiment 1 according to the present invention. Referring to FIG. 4B, the gate insulating layer 150 is formed on the entirety of the substrate shown in FIG. 3B, and patterning is performed as shown in FIG. 4A and FIG. 4B by photolithography and etching to form the first opening 151. The etching performed on the gate insulating layer 150 to form the first opening 151 may be dry etching or wet etching. In the example shown in FIG. 4A and FIG. 4B, the first opening 151 has a rectangular pattern. The first opening 151 is not limited to having such a pattern and may have any shape of pattern as long as exposing the lower electrode 120 at least in an area where the oxide semiconductor layer 140 formed on the gate insulating layer 150 is to be connected with the lower electrode 120. For example, the first opening 151 may be of any of various patterns, for example, circular, elliptical, polygonal, curved or the like.

Figure 5A:
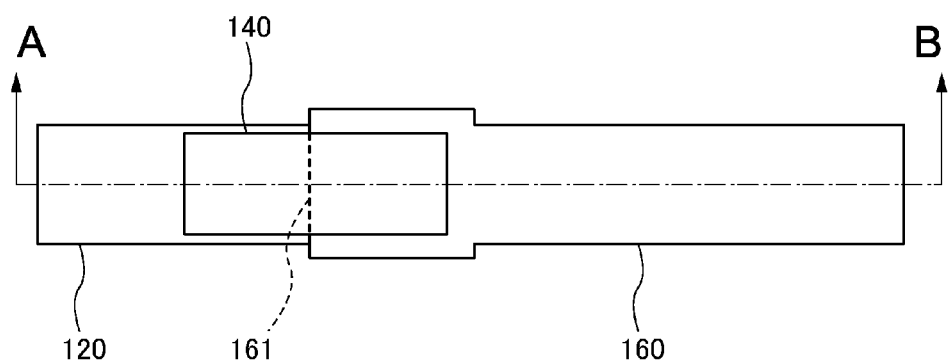
FIG. 5A is a plan view showing a step of forming an oxide semiconductor layer in the manufacturing method of the semiconductor device in the embodiment according to the present invention.
Figure 5B:
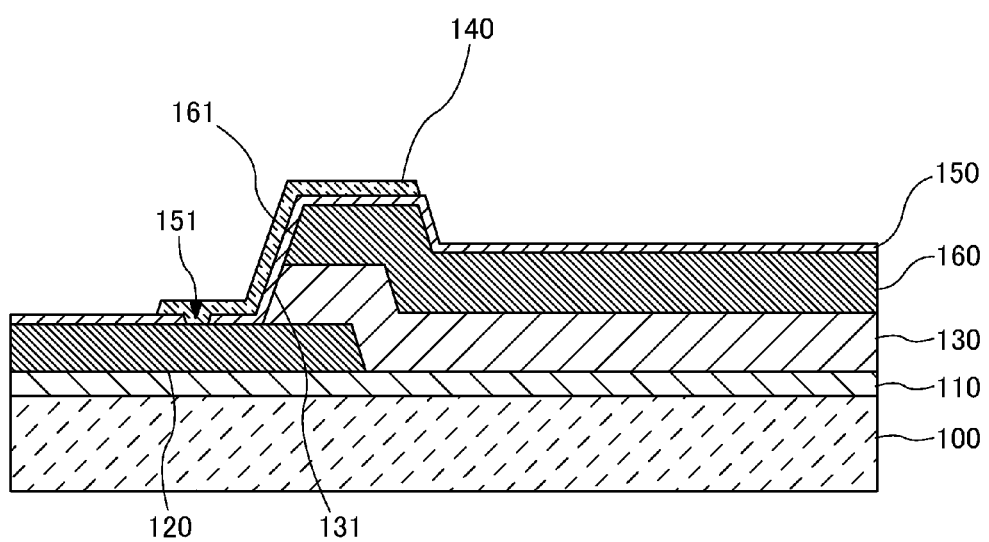
FIG. 5B is a cross-sectional view taken along line A-B in FIG. 5A.

FIG. 5A and FIG. 5B are respectively a plan view and a cross-sectional view showing a step of forming the oxide semiconductor layer 140 in the manufacturing method of the semiconductor device 10 in embodiment 1 according to the present invention. Referring to FIG. 5B, a film for the oxide semiconductor layer 140 is formed on the entirety of the substrate shown in FIG. 4B, and patterning is performed as shown in FIG. 5A by photolithography and etching to form the oxide semiconductor layer 140. The etching performed to form the oxide semiconductor layer 140 may be dry etching or wet etching. In the case where the oxide semiconductor layer 140 is formed by wet etching, an etchant containing oxalic acid may be used.

It is sufficient that the oxide semiconductor layer 140 is formed on at least in the first region 132 (see FIG. 1B) in which the oxide semiconductor layer 140 is connected with the lower electrode 120, in the second region 182 (see FIG. 1B) in which the oxide semiconductor layer 140 is connected with the upper electrode 182b formed in a later step, on the first side wall 161 and on the second side wall 131.

As shown in FIG. 5A, in an area where the oxide semiconductor layer 140 and the gate electrode 160 overlap each other as seen in a plan view, the gate electrode 160 extends beyond ends of the oxide semiconductor layer 140 in a channel width (W length) direction (perpendicular to a longitudinal direction of the gate electrode 160). In other words, in the semiconductor device 10, the gate electrode 160 is larger than the oxide semiconductor layer 140 in the W length direction. In still other words, the first side wall 161 of the gate electrode 160 is longer than the oxide semiconductor layer 140 in the W length direction. It should be noted that the gate electrode 160 and the oxide semiconductor layer 140 are not limited to having the structure shown in FIG. 5A. In the area where the oxide semiconductor layer 140 and the gate electrode 160 overlap each other as seen in a plan view, the gate electrode 160 may be substantially as long as, or may be shorter than, the oxide semiconductor layer 140, in the W length direction.

Figure 6A:
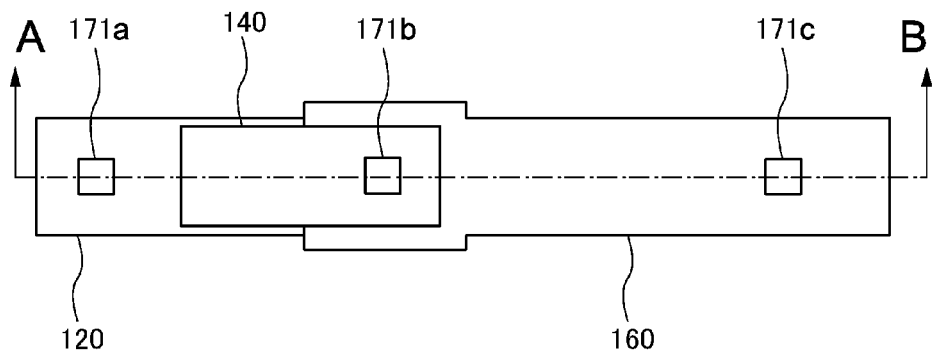
FIG. 6A is a plan view showing a step of forming a first insulating layer and also forming openings in the first insulating layer and the gate insulating layer in the manufacturing method of the semiconductor device in the embodiment according to the present invention.
Figure 6B:
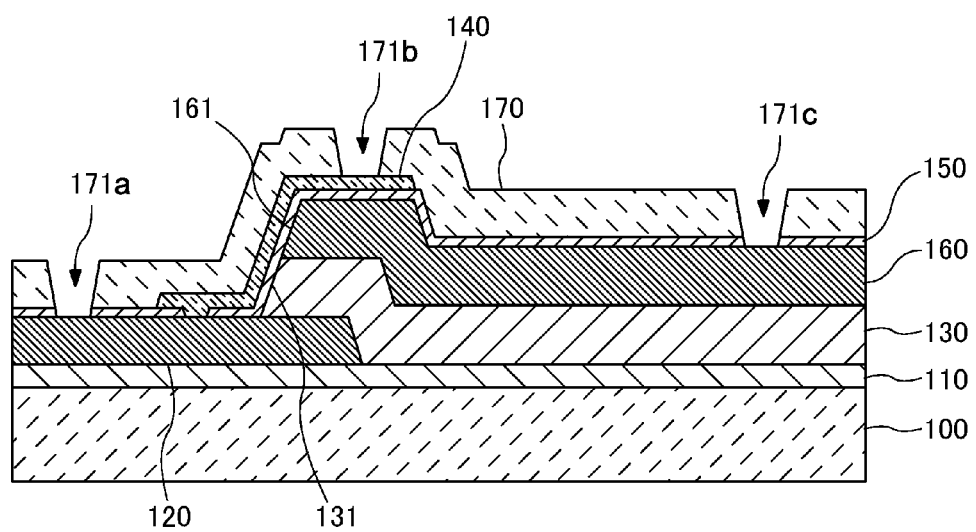
FIG. 6B is a cross-sectional view taken along line A-B in FIG. 6A.

FIG. 6A and FIG. 6B are respectively a plan view and a cross-sectional view showing a step of forming the first insulating layer 170 and also forming the second openings 171 in the first insulating layer 170 and the gate insulating layer 150 in the manufacturing method of the semiconductor device 10 in embodiment 1 according to the present invention. Referring to FIG. 6B, the first insulating layer 170 is formed on the entirety of the substrate shown in FIG. 5B, and patterning is performed as shown in FIG. 6A by photolithography and etching to form the second openings 171. As shown in FIG. 6B, the second opening 171a exposes the lower electrode 120, the second opening 171b exposes the oxide semiconductor layer 140 above the gate electrode 160, and the second opening 171c exposes the gate electrode 160. Preferably, the etching rate ratio of the gate insulating layer 150 and the first insulating layer 170 with respect to the lower electrode 120, the oxide semiconductor layer 140 and the gate electrode 160 is high.

Then, a film for the upper electrodes 180 is formed on the entirety of the substrate shown in FIG. 6B, and patterning is performed to form the upper electrodes 180 as shown in FIG. 1A and FIG. 1B. The semiconductor device 10 in embodiment 1 according to the present invention is manufactured by the manufacturing method described above. Referring to FIG. 1B, the portion of the oxide semiconductor layer 140 that is located on the first side wall 161 is a part of a channel region 141. More specifically, as shown in FIG. 1A, the channel region 141 is formed in an area of the oxide semiconductor layer 140 that overlaps the gate electrode 160. The ends of the oxide semiconductor layer 140 in the channel width direction are included in the channel region 141.

<Modification 1 of Embodiment 1>

With reference to FIG. 7A through FIG. 12B, modification 1 of embodiment 1 according to the present invention will be described. A semiconductor device 11 in modification 1 of embodiment 1 is similar to the semiconductor device 10 in embodiment 1. In the following description, the components having the identical structures or functions to those of the semiconductor device 10 will bear the identical reference signs thereto, and detailed descriptions thereof will be omitted.

[Structure of the Semiconductor Device 11]

Figure 7A:
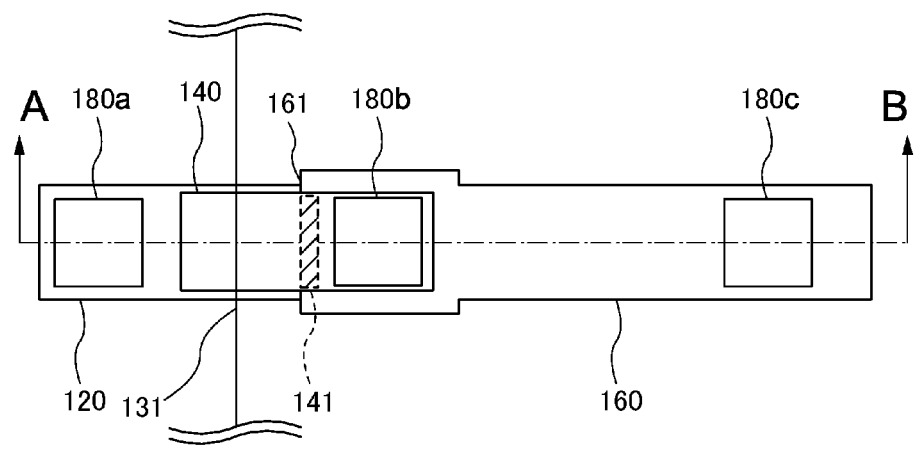
FIG. 7A is a plan view showing an overview of a semiconductor device in a modification of the embodiment according to the present invention.
Figure 7B:
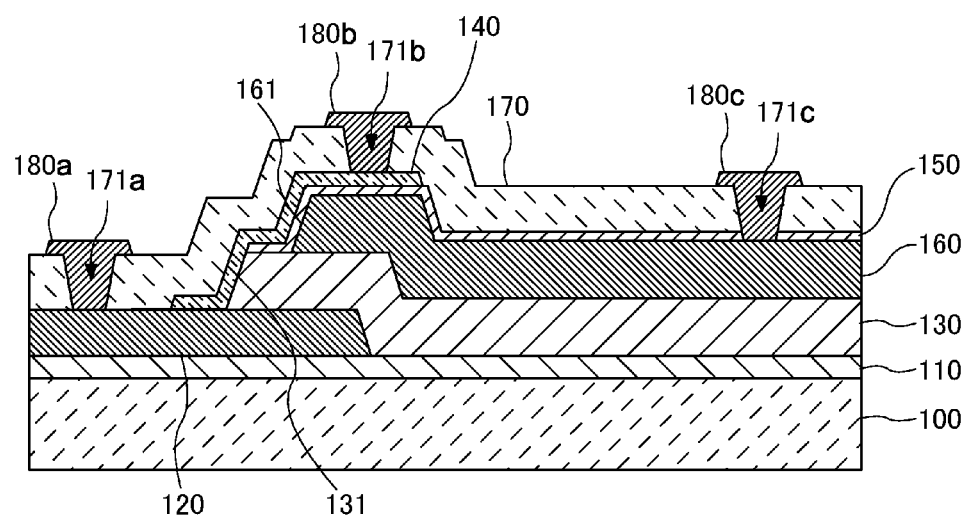
FIG. 7B is a cross-sectional view taken along line A-B in FIG. 7A.

FIG. 7A and FIG. 7B are respectively a plan view and a cross-sectional view showing an overview of the semiconductor device 11 in modification 1 of embodiment 1 according to the present invention. As shown in FIG. 7A and FIG. 7B, in the semiconductor device 11, the second insulating layer 130 and the gate electrode 160 have different patterns from each other, and the gate insulating layer 150 and the second insulating layer 130 have substantially the same pattern except that the second opening 171c is provided in the gate insulating layer 150. Specifically, the second insulating layer 130 and the gate insulating layer 150 have a wide opening in an area where the oxide semiconductor layer 140 and the upper electrode 180a are connected with the lower electrode 120. The first side wall 161 of the gate electrode 160 and the second side wall 131 of the second insulating layer 130 are located at different positions from each other as seen in a plan view.

As shown in FIG. 7B, the oxide semiconductor layer 140 is in contact with the second side wall 131 of the second insulating layer 130. In such a structure, the second insulating layer 130 may be formed of a material which easily generates carriers in the oxide semiconductor layer 140, so that a portion of the oxide semiconductor layer 140 that is located on the second side wall 131 has a small specific electrical resistance. In the case where the specific electrical resistance of the oxide semiconductor layer 140 is to be made small, the second insulating layer 130 may be formed of an inorganic insulating material such as hydrogen-containing $SiN_x$ or the like.

As described above, in the semiconductor device 11 in modification 1 of embodiment 1, the oxide semiconductor layer 140 is in contact with the lower electrode 120 in a larger area. Therefore, the contact resistance of the oxide semiconductor layer 140 and the lower electrode 120 is decreased. As a result, the semiconductor device 11 is capable of increasing the on-current.

[Manufacturing Method of the Semiconductor Device 11]

With reference to plan views and cross-sectional views provided in FIG. 8A through FIG. 12B, a manufacturing method of the semiconductor device 11 in modification 1 of embodiment 1 according to the present invention will be described. The manufacturing method of the semiconductor device 11 shown in FIG. 7A and FIG. 7B is similar to that of the semiconductor device 10 shown in FIG. 1, and thus will not be described much in detail.

Figure 8A:
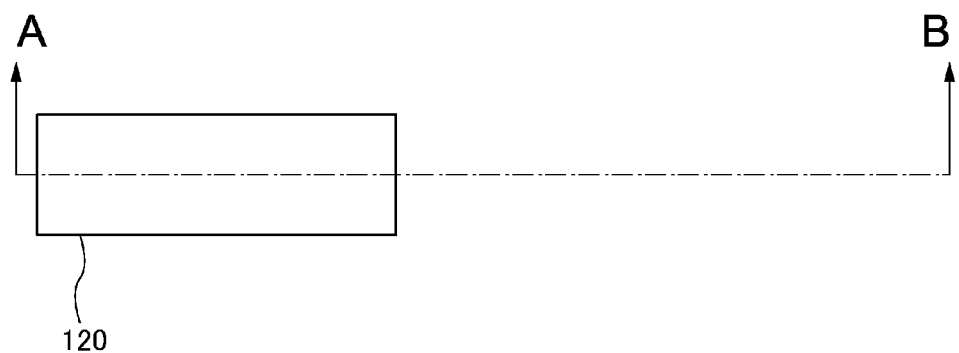
FIG. 8A is a plan view showing a step of forming a lower electrode and a second insulating layer in a manufacturing method of the semiconductor device in the modification of the embodiment according to the present invention.
Figure 8B:
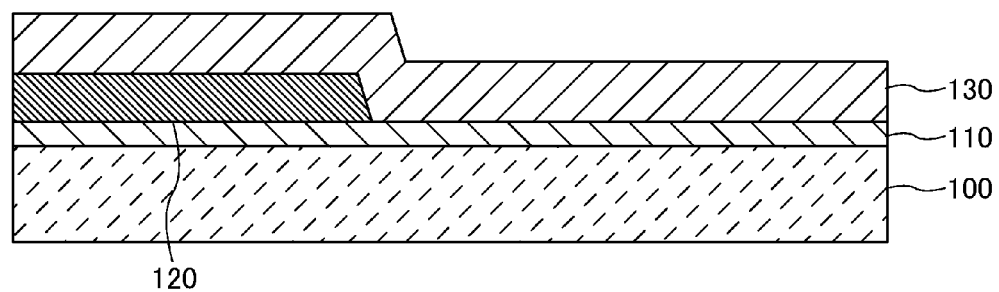
FIG. 8B is a cross-sectional view taken along line A-B in FIG. 8A.

FIG. 8A and FIG. 8B are respectively a plan view and a cross-sectional view showing a step of forming the lower electrode 120 and the second insulating layer 130 in the manufacturing method of the semiconductor device 11 in modification 1 of embodiment 1 according to the present invention. First, referring to FIG. 8B, the underlying layer 110 and a film for the lower electrode 120 are formed on the substrate 100, and patterning is performed as shown in FIG. 8A by photolithography and etching to form the lower electrode 120. Next, a film for the second insulating layer 130 is formed on the entirety of the resultant substrate. In the case where the specific electrical resistance of the portion of the oxide semiconductor layer 140 that is to be located on the second side wall 131 of the second insulating layer 130 in a later step is to be made small, the second insulating layer 130 may be formed of an inorganic insulating material such as hydrogen-containing $SiN_x$ or the like. Alternatively, an element that generates carries in the oxide semiconductor layer 140 may be incorporated into the second insulating layer 130. For example, an element that is desorbed from the second insulating layer 130 by a heat treatment performed at the time of, or after, the formation of the oxide semiconductor layer 140 to generate carriers in the oxide semiconductor layer 140 may be incorporated into the second insulating layer 130 at the time of the formation of the second insulating layer 130. Alternatively, such an element may be injected into the second insulating layer 130 after the formation thereof.

Figure 9A:
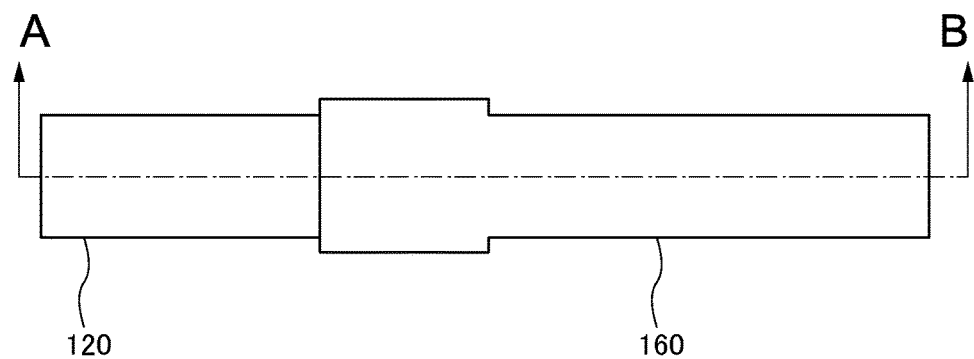
FIG. 9A is a plan view showing a step of forming a gate electrode in the manufacturing method of the semiconductor device in the modification of the embodiment according to the present invention.
Figure 9B:
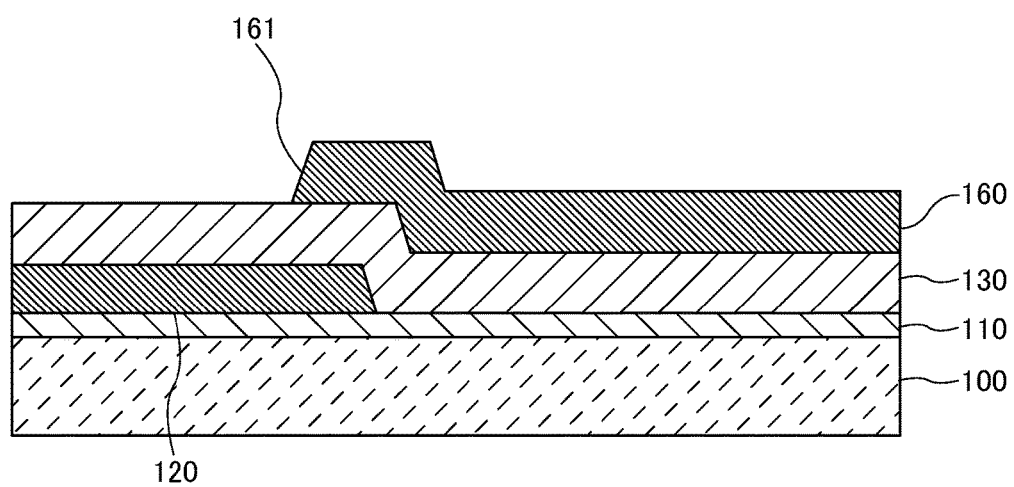
FIG. 9B is a cross-sectional view taken along line A-B in FIG. 9A.

FIG. 9A and FIG. 9B are respectively a plan view and a cross-sectional view showing a step of forming the gate electrode 160 in the manufacturing method of the semiconductor device 11 in modification 1 of embodiment 1 according to the present invention. Referring to FIG. 9B, a film for the gate electrode 160 is formed on the entirety of the substrate shown in FIG. 8B, and patterning is performed as shown in FIG. 9A by photolithography and etching to form the gate electrode 160. Preferably, the etching is performed to form the gate electrode 160 under the condition that the etching rate ratio of the gate electrode 160 with respect to at least the second insulating layer 130 is high. The tapering angle of the first side wall 161 of the gate electrode 160 may be controlled by the etching rate of the gate electrode 160 and the retraction amount of a resist used as a mask for etching the gate electrode 160.

Figure 10A:
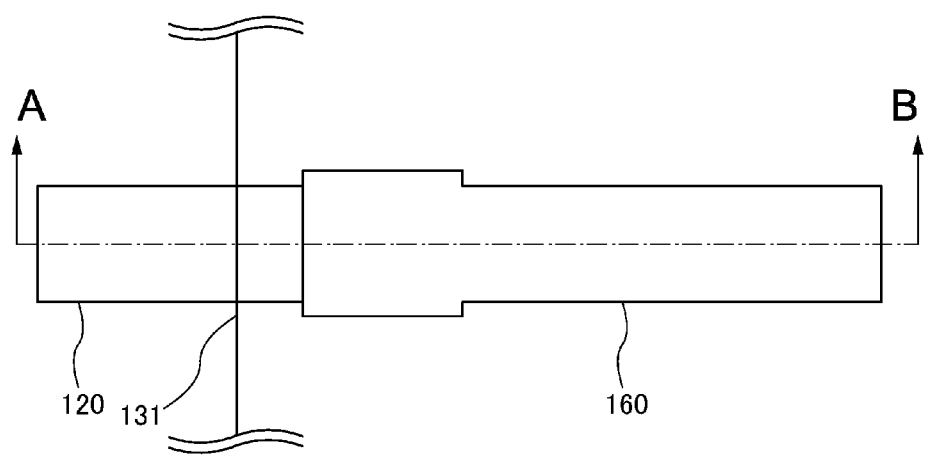
FIG. 10A is a plan view showing a step of forming a gate insulating layer and exposing a part of the lower electrode in the manufacturing method of the semiconductor device in the modification of the embodiment according to the present invention.
Figure 10B:
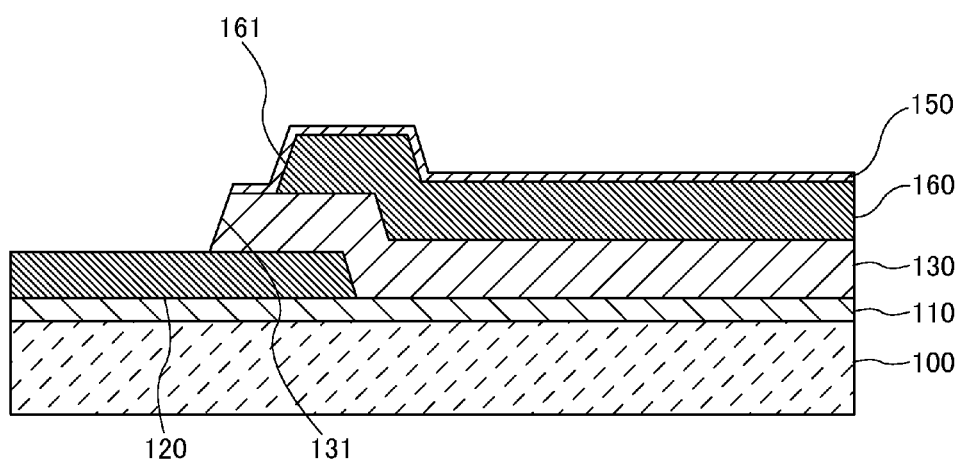
FIG. 10B is a cross-sectional view taken along line A-B in FIG. 10A.

FIG. 10A and FIG. 10B are respectively a plan view and a cross-sectional view showing a step of forming the gate insulating layer 150 and exposing a part of the lower electrode 120 in the manufacturing method of the semiconductor device 11 in modification 1 of embodiment 1 according to the present invention. Referring to FIG. 10B, a film for the gate insulating layer 150 is formed on the entirety of the substrate shown in FIG. 9B, and patterning is performed as shown in FIG. 10A by photolithography and etching to form the second insulating layer 130 and the gate insulating layer 150. As shown in FIG. 10A and FIG. 10B, the second insulating layer 130 and the gate insulating layer 150 have substantially the same pattern, and thus FIG. 10A shows the pattern of second insulating layer 130 (second side wall 131). There is no specific limitation on the position of the opening provided in the second insulating layer 130 and the gate insulating layer 150. It is sufficient that the opening exposes at least an area of the lower electrode 120 where the oxide semiconductor layer 140 is to be connected with the lower electrode 120 and the upper electrode 180a is to be connected with the lower electrode 120 in a later step.

Figure 11A:
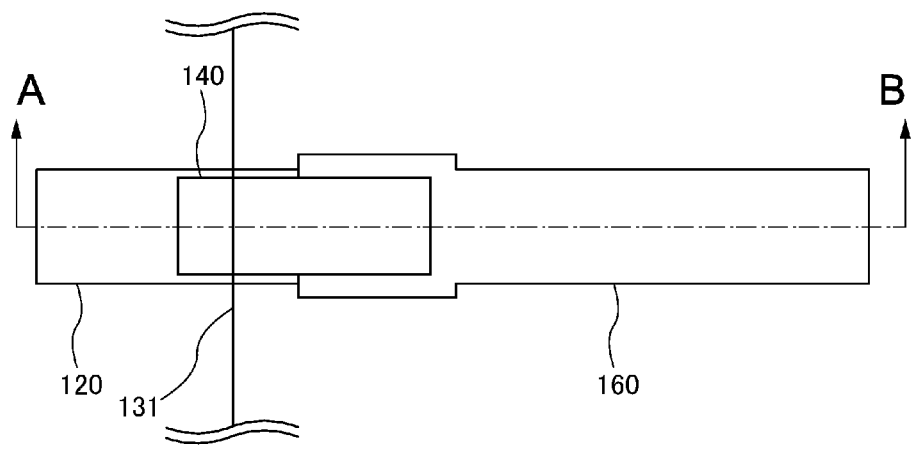
FIG. 11A is a plan view showing a step of forming an oxide semiconductor layer in the manufacturing method of the semiconductor device in the modification of the embodiment according to the present invention.
Figure 11B:
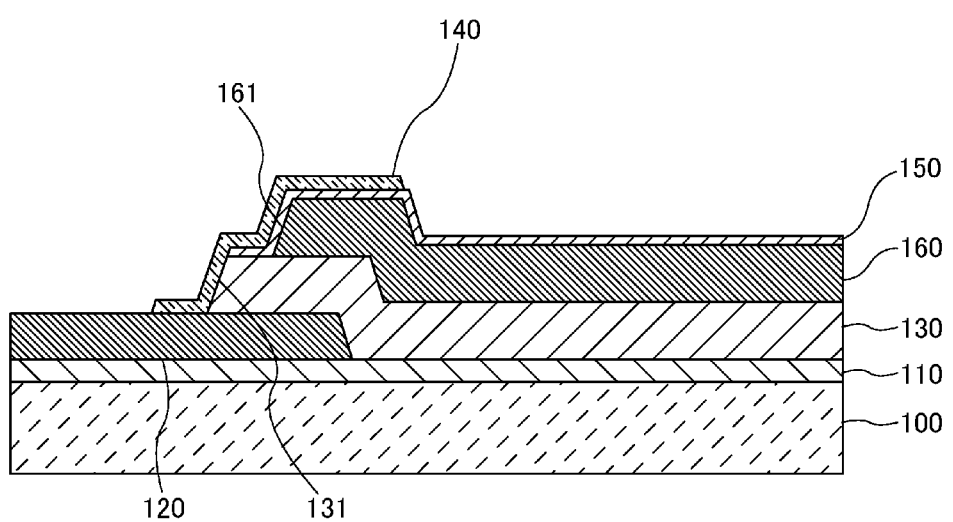
FIG. 11B is a cross-sectional view taken along line A-B in FIG. 11A.

FIG. 11A and FIG. 11B are respectively a plan view and a cross-sectional view showing a step of forming the oxide semiconductor layer 140 in the manufacturing method of the semiconductor device 11 in modification 1 of embodiment 1 according to the present invention. Referring to FIG. 11B, a film for the oxide semiconductor layer 140 is formed on the entirety of the substrate shown in FIG. 10B, and patterning is performed as shown in FIG. 11A by photolithography and etching to form the oxide semiconductor layer 140.

Figure 12A:
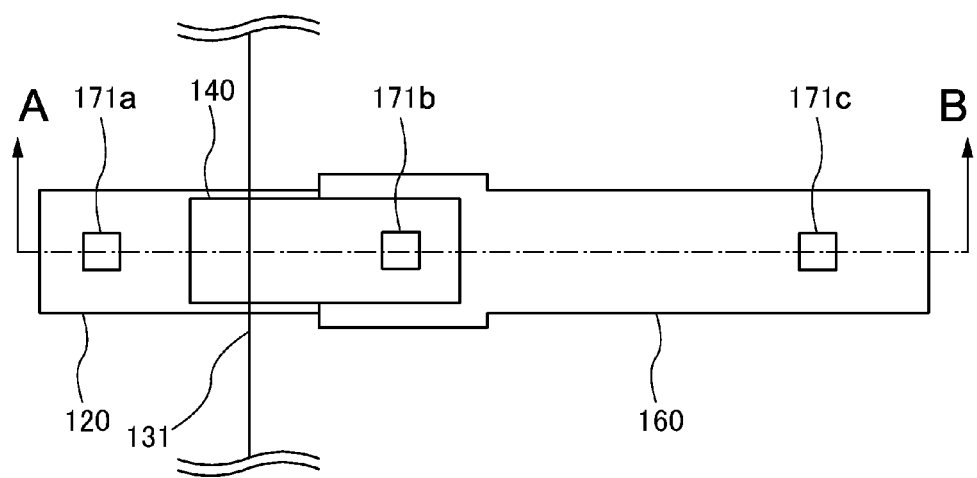
FIG. 12A is a plan view showing a step of forming a first insulating layer and also forming openings in the first insulating layer and the gate insulating layer in the manufacturing method of the semiconductor device in the modification of the embodiment according to the present invention.
Figure 12B:
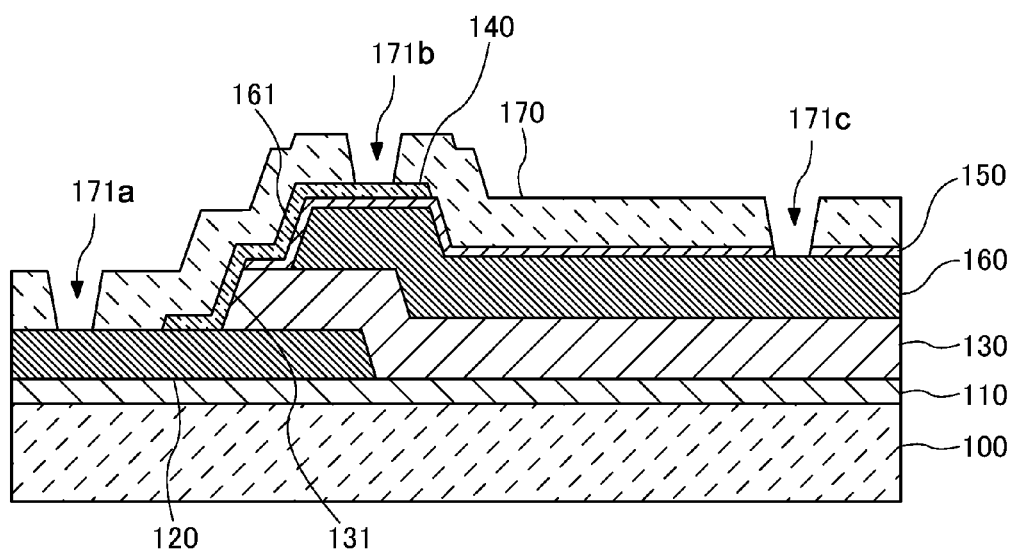
FIG. 12B is a cross-sectional view taken along line A-B in FIG. 12A.

FIG. 12A and FIG. 12B are respectively a plan view and a cross-sectional view showing a step of forming the first insulating layer 170 and also forming the second openings 171 in the first insulating layer 170 and the gate insulating layer 150 in the manufacturing method of the semiconductor device 11 in modification 1 of embodiment 1 according to the present invention. Referring to FIG. 12B, the first insulating layer 170 is formed on the entirety of the substrate shown in FIG. 11B, and patterning is performed as shown in FIG. 12A by photolithography and etching to form the second openings 171. As shown in FIG. 12B, the second opening 171a exposes the lower electrode 120, the second opening 171b exposes the oxide semiconductor layer 140, and the second opening 171c exposes the gate electrode 160.

Then, a film for the upper electrodes 180 is formed on the entirety of the substrate shown in FIG. 12B, and patterning is performed to form the upper electrodes 180 as shown in FIG. 7A and FIG. 7B. The semiconductor device 11 in modification 1 of embodiment 1 according to the present invention is manufactured by the manufacturing method described above. Referring to FIG. 7B, the portion of the oxide semiconductor layer 140 that is located on the first side wall 161 is a part of the channel region 141. More specifically, as shown in FIG. 7A, the channel region 141 is formed in an area of the oxide semiconductor layer 140 that overlaps the gate electrode 160.

<Modification 2 of Embodiment 1>

With reference to FIG. 13A through FIG. 18B, modification 2 of embodiment 1 according to the present invention will be described. A semiconductor device 12 in modification 2 of embodiment 1 is similar to the semiconductor device 10 in embodiment 1. In the following description, the components having the identical structures or functions to those of the semiconductor device 10 will bear the identical reference signs thereto, and detailed descriptions thereof will be omitted.

[Structure of the Semiconductor Device 12]

Figure 13A:
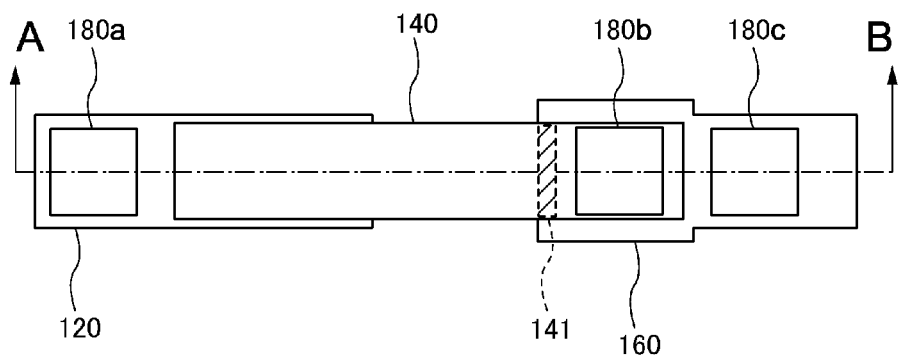
FIG. 13A is a plan view showing an overview of a semiconductor device in a modification of the embodiment according to the present invention.
Figure 13B:
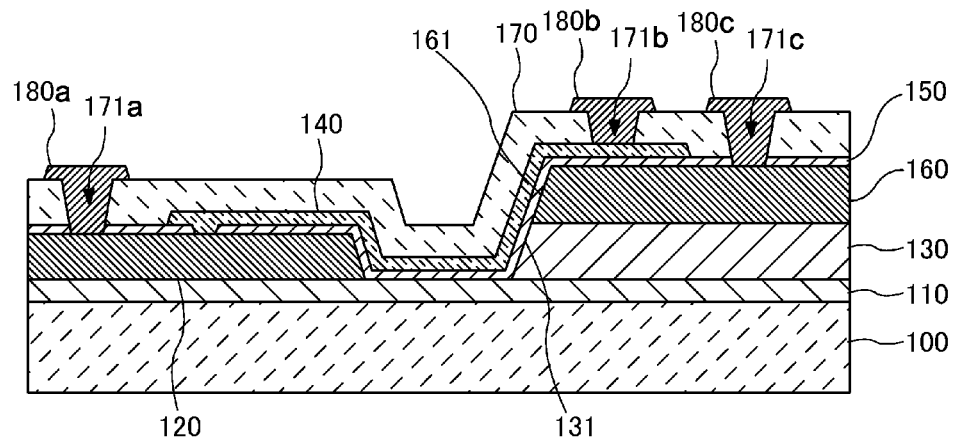
FIG. 13B is a cross-sectional view taken along line A-B in FIG. 13A.

FIG. 13A and FIG. 13B are respectively a plan view and a cross-sectional view showing an overview of the semiconductor device 12 in modification 2 of embodiment 1 according to the present invention. As shown in FIG. 13A, in the semiconductor device 12, the lower electrode 120 is independent from a stack of the second insulating layer 130 and the gate electrode 160 as seen in a plan view. More specifically, the stack of the second insulating layer 130 and the gate electrode 160 does not overlap the lower electrode 120 as seen in a plan view. In other words, a stack of the gate insulating layer 150 and the oxide semiconductor layer 140 is in contact with the underlying layer 110 at a position between the lower electrode 120 and the stack of the second insulating layer 130 and the gate electrode 160.

In the example shown in FIG. 13B, the second insulating layer 130 is located below the gate electrode 160. The semiconductor device 12 is not limited to having such a structure. The gate electrode 160 may be in contact with the underlying layer 110 without the second insulating layer 130 being provided. In the case where the second insulating layer 130 is not provided as described above, the lower electrode 120 and the gate electrode 160 may be formed of the same layer in the same step. In the structure shown in FIG. 13B, the underlying layer 110 and the second insulating layer 130 may be formed of a material which easily generates carriers in the oxide semiconductor layer 140, so that a portion of the oxide semiconductor layer 140 that is located on the underlying layer 110 and the second insulating layer 130 has a small specific electrical resistance. In the case where the specific electrical resistance of the oxide semiconductor layer 140 is to be made small, the underlying layer 110 and the second insulating layer 130 may be formed of an inorganic insulating material such as hydrogen-containing $SiN_x$ or the like.

As described above, in the semiconductor device 12 in modification 2 of embodiment 1, neither the semiconductor insulating layer 130 nor the gate electrode 160 needs to be stacked on the lower electrode 120. Thus, the semiconductor device 12 may have any of various layouts. Since neither the semiconductor insulating layer 130 nor the gate electrode 160 is stacked on the lower electrode 120, the number of steps caused in the semiconductor device 12 is decreased.

[Manufacturing Method of the Semiconductor Device 12]

With reference to plan views and cross-sectional views provided in FIG. 14A through FIG. 18B, a manufacturing method of the semiconductor device 12 in modification 2 of embodiment 1 according to the present invention will be described. The manufacturing method of the semiconductor device 12 shown in FIG. 13A and FIG. 13B is similar to that of the semiconductor device 10 shown in FIG. 1A and FIG. 1B, and thus will not be described much in detail.

Figure 14A:
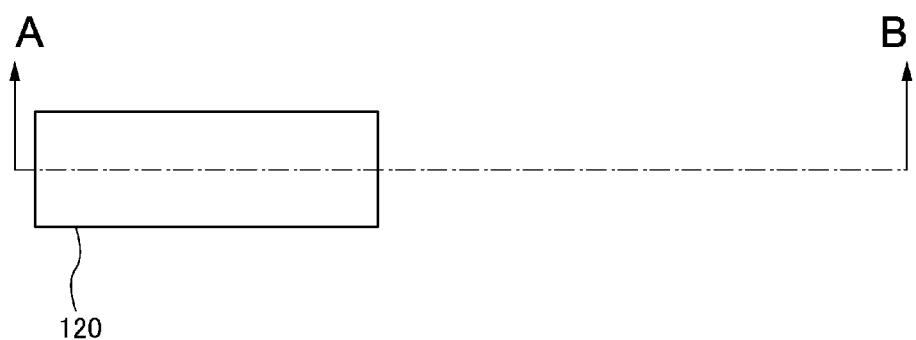
FIG. 14A is a plan view showing a step of forming a lower electrode in a manufacturing method of the semiconductor device in the modification of the embodiment according to the present invention.
Figure 14B:
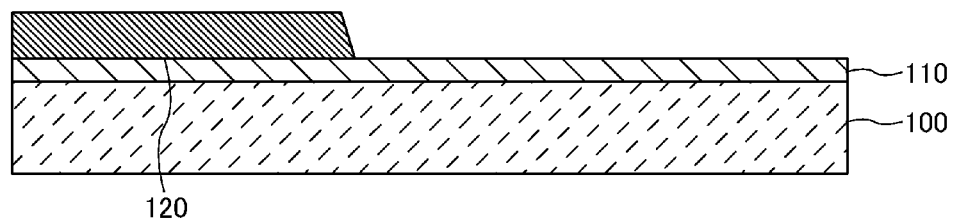
FIG. 14B is a cross-sectional view taken along line A-B in FIG. 14A.

FIG. 14A and FIG. 14B are respectively a plan view and a cross-sectional view showing a step of forming the lower electrode 120 in the manufacturing method of the semiconductor device 12 in modification 2 of embodiment 1 according to the present invention. First, referring to FIG. 14B, the underlying layer 110 and a film for the lower electrode 120 are formed on the substrate 100, and patterning is performed as shown in FIG. 14A by photolithography and etching to form the lower electrode 120. In the case where the specific electrical resistance of the oxide semiconductor layer 140 that is to be located on the underlying layer 110 with the gate insulating layer 150 being provided therebetween in a later step is to be made small, the underlying layer 110 may be formed of an inorganic insulating material such as hydrogen-containing $SiN_x$ or the like. Alternatively, an element that generates carries in the oxide semiconductor layer 140 may be incorporated into the underlying layer 110. For example, an element that is desorbed from the underlying layer 110 by a heat treatment performed at the time of, or after, the formation of the oxide semiconductor layer 140 to generate carriers in the oxide semiconductor layer 140 may be incorporated into the underlying layer 110 at the time of the formation of the underlying layer 110. Alternatively, such an element may be injected into the underlying layer 110 after the formation thereof.

Figure 15A:
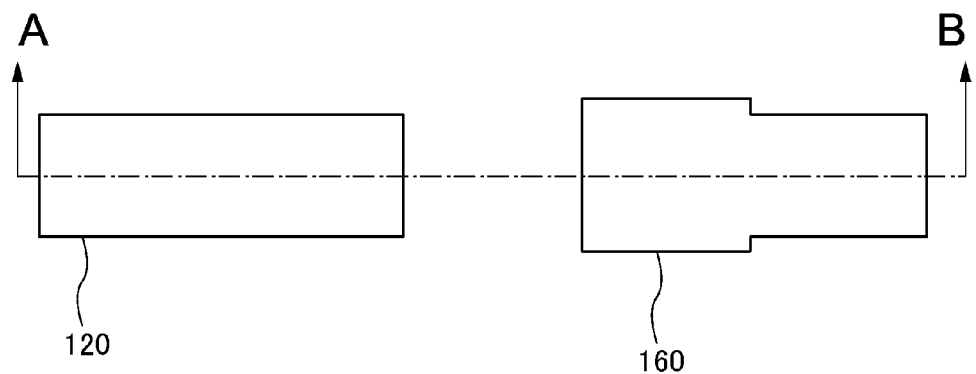
FIG. 15A is a plan view showing a step of forming a second insulating layer and a gate electrode in the manufacturing method of the semiconductor device in the modification of the embodiment according to the present invention.
Figure 15B:
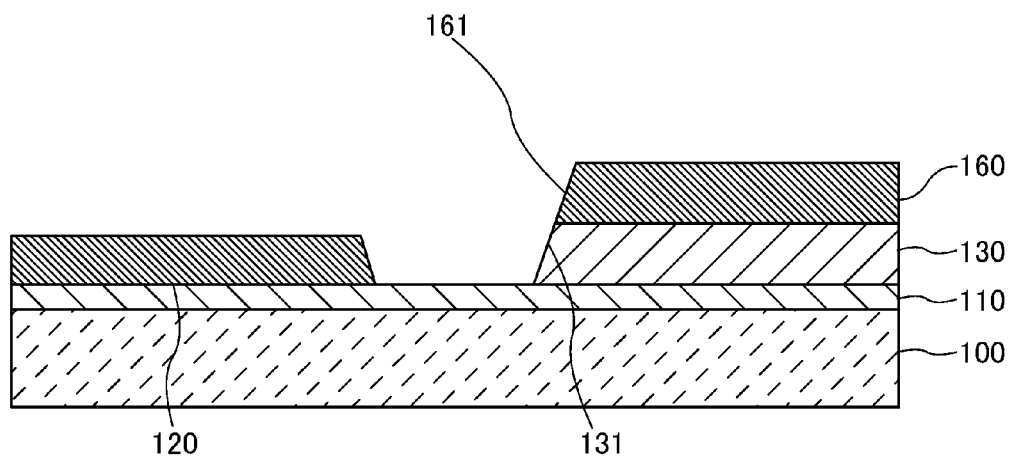
FIG. 15B is a cross-sectional view taken along line A-B in FIG. 15A.

FIG. 15A and FIG. 15B are respectively a plan view and a cross-sectional view showing a step of forming the second insulating layer 130 and the gate electrode 160 in the manufacturing method of the semiconductor device 12 in modification 2 of embodiment 1 according to the present invention. Referring to FIG. 15B, a film for the second insulating layer 130 and a film for the gate electrode 160 are formed on the entirety of the substrate shown in FIG. 14B, and patterning is performed as shown in FIG. 15A by photolithography and etching to form the second insulating layer 130 and the gate electrode 160. The second insulating layer 130 and the gate electrode 160 have substantially the same pattern, and thus FIG. 15A shows the pattern of the gate electrode 160.

In the example shown in FIG. 15A and FIG. 15B, the second insulating layer 130 and the gate electrode 160 are stacked on each other. The semiconductor device 12 is not limited to being manufactured by such a method. The gate electrode 160 may be formed on the underlying layer 110 without the semiconductor insulating layer 130 being formed. Preferably, the etching is performed to form the gate electrode 160 under the condition that the etching rate ratio of the gate electrode 160 with respect to at least the underlying layer 110 and the lower electrode 120 is high. In the case where it is difficult to guarantee a high etching rate ratio of the gate electrode 160 with respect to the lower electrode 120, the gate electrode 160 and the second insulating layer 130 may be etched in separate steps. Specifically, the etching may be performed to form the gate electrode 160 using the second insulating layer 130 as an etching stopper, and the etching may be performed to form the second insulating layer 130 using the gate electrode 160 as a mask under a different condition from the etching for forming the gate electrode 160. In the case where the second insulating layer 130 is not formed, the lower electrode 120 and the gate electrode 160 may be formed of the same layer in the same step.

As seen in a cross-sectional view of FIG. 15B, the gate electrode 160 has the first side wall 161, and the second insulating layer 130 has the second side wall 131. The tapering angle of the first side wall 161 of the gate electrode 160 may be controlled by the etching rate of the gate electrode 160 and the retraction amount of a resist used as a mask for etching the gate electrode 160. The tapering angle of the second side wall 131 of the second insulating layer 130 may be controlled by the etching rate of the second insulating layer 130 and the retraction amount of a resist used as a mask for etching the second insulating layer 130.

Figure 16A:
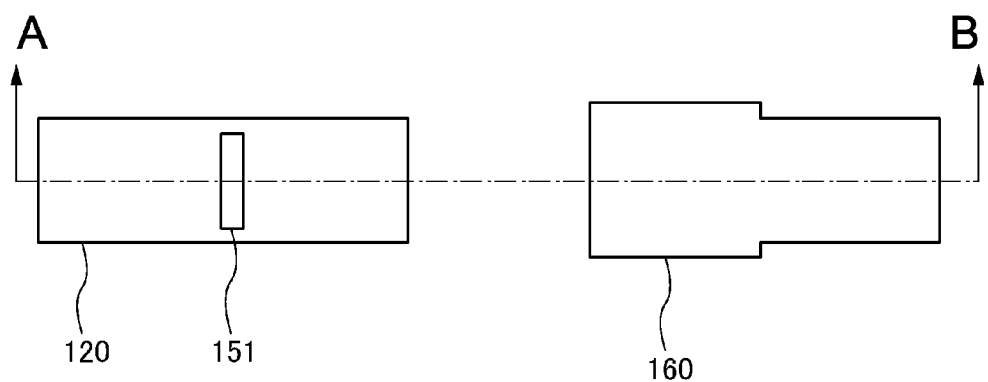
FIG. 16A is a plan view showing a step of forming a gate insulating layer and exposing a part of the lower electrode in the manufacturing method of the semiconductor device in the modification of the embodiment according to the present invention.
Figure 16B:
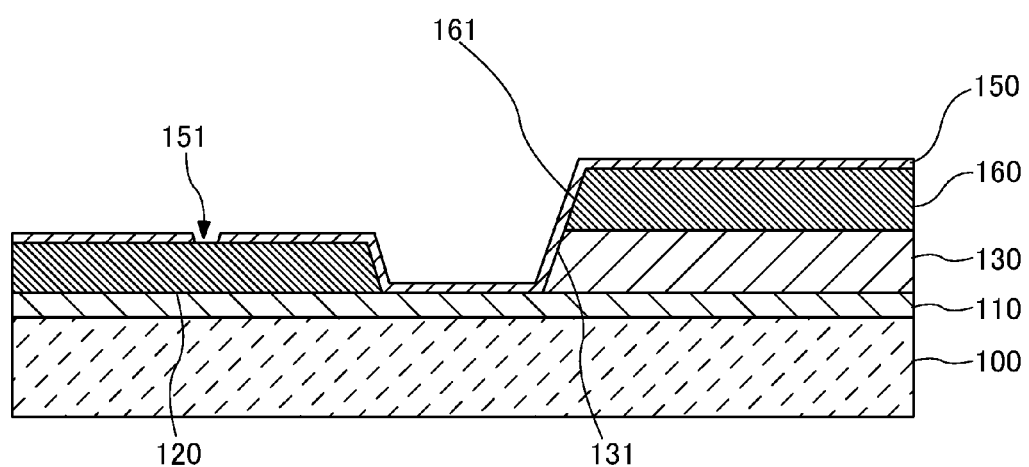
FIG. 16B is a cross-sectional view taken along line A-B in FIG. 16A.

FIG. 16A and FIG. 16B are respectively a plan view and a cross-sectional view showing a step of forming the gate insulating layer 150 and exposing a part of the lower electrode 120 in the manufacturing method of the semiconductor device 12 in modification 2 of embodiment 1 according to the present invention. Referring to FIG. 16B, the gate insulating layer 150 is formed on the entirety of the substrate shown in FIG. 15B, and patterning is performed as shown in FIG. 16A and FIG. 16B by photolithography and etching to form the first opening 151. In the example shown in FIG. 16A, the first opening 151 has a rectangular pattern. The first opening 151 is not limited to having such a pattern and may have any shape of pattern as long as exposing the lower electrode 120 at least in an area where the oxide semiconductor layer 140 that is to be formed on the gate insulating layer 150 is to be connected with the lower electrode 120. For example, the first opening 151 may be of any of various patterns, for example, circular, elliptical, polygonal, curved or the like. In this step, the underlying layer 110 or the second side wall 131 may be exposed in addition to the lower electrode 120.

Figure 17A:
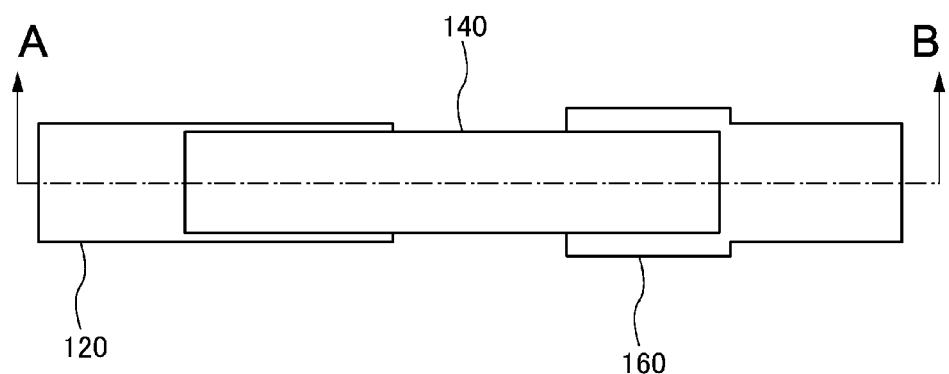
FIG. 17A is a plan view showing a step of forming an oxide semiconductor layer in the manufacturing method of the semiconductor device in the modification of the embodiment according to the present invention.
Figure 17B:
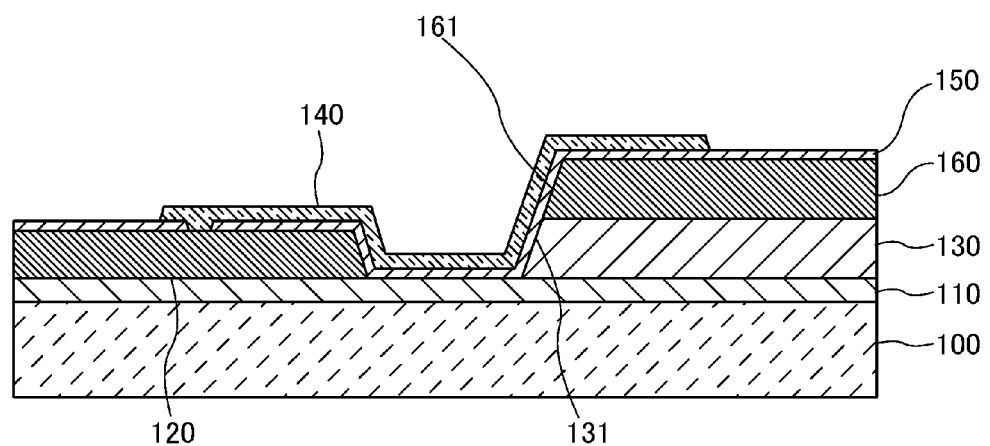
FIG. 17B is a cross-sectional view taken along line A-B in FIG. 17A.

FIG. 17A and FIG. 17B are respectively a plan view and a cross-sectional view showing a step of forming the oxide semiconductor layer 140 in the manufacturing method of the semiconductor device 12 in modification 2 of embodiment 1 according to the present invention. Referring to FIG. 17B, a film for the oxide semiconductor layer 140 is formed on the entirety of the substrate shown in FIG. 16B, and patterning is performed as shown in FIG. 17A by photolithography and etching to form the oxide semiconductor layer 140.

Figure 18A:
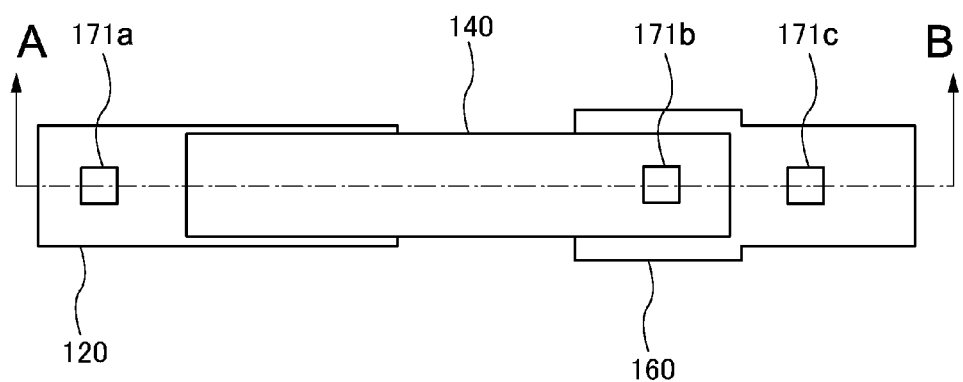
FIG. 18A is a plan view showing a step of forming a first insulating layer and also forming openings in the first insulating layer and the gate insulating layer in the manufacturing method of the semiconductor device in the modification of the embodiment according to the present invention.
Figure 18B:
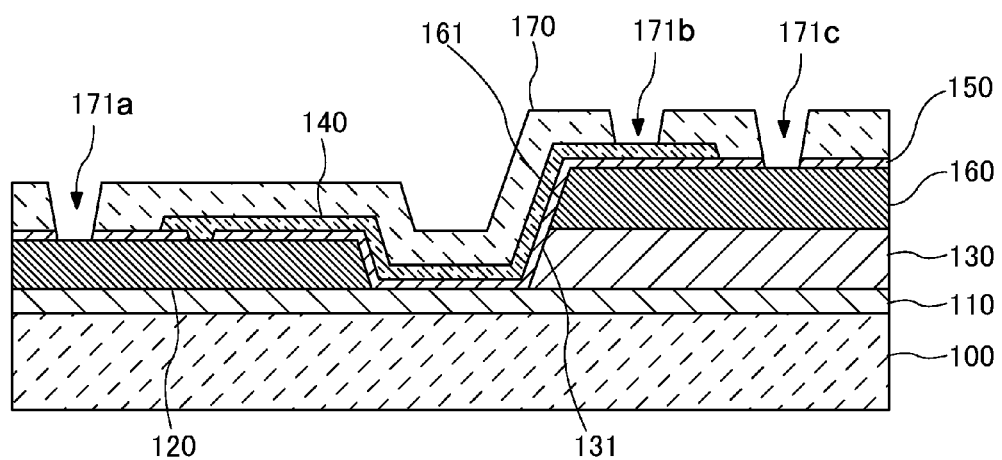
FIG. 18B is a cross-sectional view taken along line A-B in FIG. 18A.

FIG. 18A and FIG. 18B are respectively a plan view and a cross-sectional view showing a step of forming the first insulating layer 170 and also forming the second openings 171 in the first insulating layer 170 and the gate insulating layer 150 in the manufacturing method of the semiconductor device 12 in modification 2 of embodiment 1 according to the present invention. Referring to FIG. 18B, the first insulating layer 170 is formed on the entirety of the substrate shown in FIG. 17B, and patterning is performed as shown in FIG. 18A by photolithography and etching to form the second openings 171. As shown in FIG. 18B, the second opening 171a exposes the lower electrode 120, the second opening 171b exposes the oxide semiconductor layer 140, and the second opening 171c exposes the gate electrode 160.

Then, a film for the upper electrodes 180 is formed on the entirety of the substrate shown in FIG. 18B, and patterning is performed to form the upper electrodes 180 as shown in FIG. 13A and FIG. 13B. The semiconductor device 12 in modification 2 of embodiment 1 according to the present invention is manufactured by the manufacturing method described above. Referring to FIG. 13B, a portion of the oxide semiconductor layer 140 that is located on the first side wall 161 is a part of the channel region 141. More specifically, as shown in FIG. 13A, the channel region 141 is formed in an area of the oxide semiconductor layer 140 that overlaps the gate electrode 160.

Embodiment 2

Figure 19A:
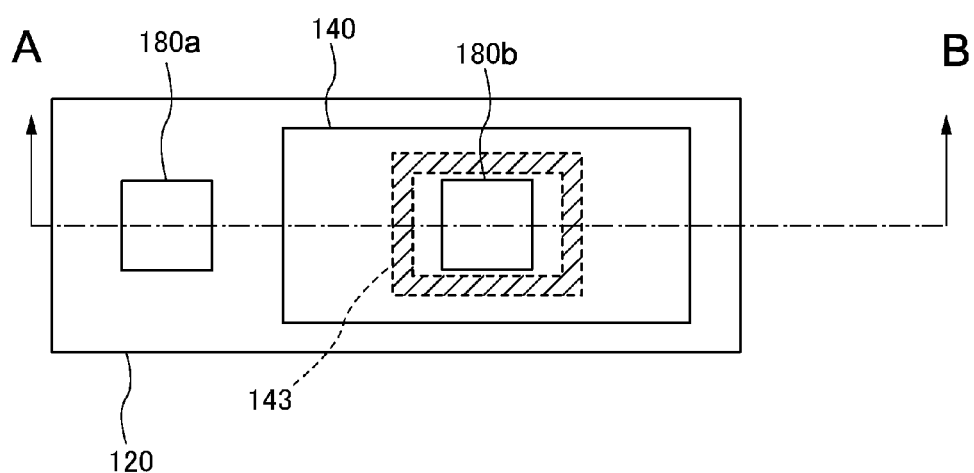
FIG. 19A is a plan view showing an overview of a semiconductor device in an embodiment according to the present invention.
Figure 19B:
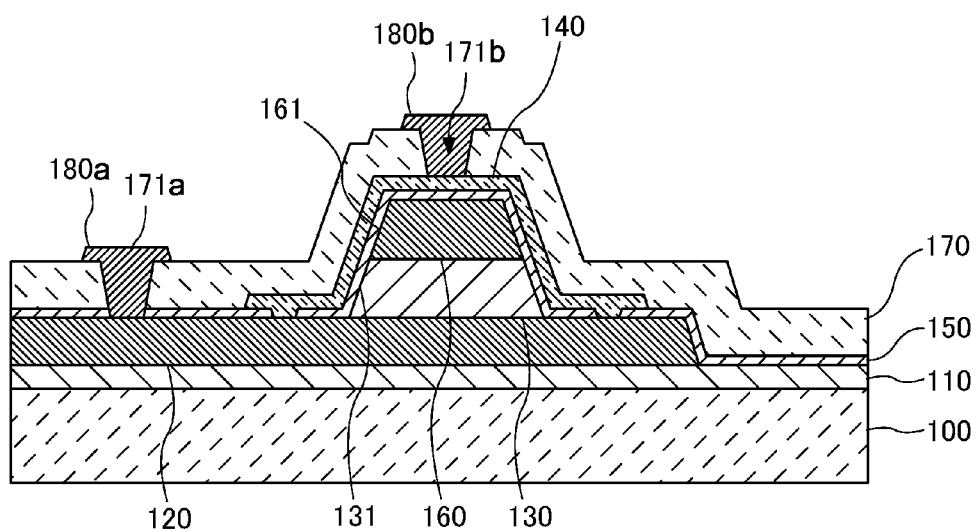
FIG. 19B is a cross-sectional view taken along line A-B in FIG. 19A.

With reference to FIG. 19A and FIG. 19B, an overview of a semiconductor device 20 in embodiment 2 according to the present invention will be described. The semiconductor device 20 in embodiment 2 is usable in a display device or a driving circuit like in embodiment 1. The semiconductor device 20 in embodiment 2 is described as having a structure including a channel formed of an oxide semiconductor. The semiconductor device 20 in embodiment 2 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 2, the semiconductor device 20 is a transistor. This does not limit the semiconductor device according to the present invention to a transistor.

[Structure of the Semiconductor Device 20]

FIG. 19A and FIG. 19B are respectively a plan view and a cross-sectional view showing an overview of the semiconductor device 20 in embodiment 2 according to the present invention. The semiconductor device 20 shown in FIG. 19A and FIG. 19B has the same layer structure as, but has a different layout from, that of the semiconductor device 10 shown in FIG. 1A and FIG. 1B. Specifically, in the semiconductor device 20 shown in FIG. 19A and FIG. 19B, unlike in the semiconductor device 10 shown in FIG. 1A and FIG. 1B, as seen in a plan view, the gate electrode 160 is located inner to an outer perimeter of the lower electrode 120 (see FIG. 21A), and the oxide semiconductor layer 140 is located along the first side wall 161, which is ring-shaped, of the gate electrode 160 (see FIG. 23A and FIG. 23B). More specifically, as shown in FIG. 19A, the semiconductor 20 includes a ring-shaped channel region 143, and an end of the oxide semiconductor layer 140 is not included in the channel region 143. Since the channel region 143 has a ring shape, this structure is called the "surround type".

In the example shown in FIG. 19A and FIG. 19B, the surround-type semiconductor device 20 uses the structure of embodiment 1 shown in FIG. 1A and FIG. 1B. Alternatively, the structure of modification 1 or 2 of embodiment 1 shown in FIG. 7A or FIG. 13B may be used to provide a surround-type semiconductor.

As described above, in the semiconductor device 20 in embodiment 2 according to the present invention, the oxide semiconductor layer 140 is located along the ring-shaped first side wall 161, and the channel region 143 is formed to be ring-shaped. Therefore, the end of the oxide semiconductor layer 140 is not included in the channel region 143. During the etching performed to form the oxide semiconductor layer 140, the end of the oxide semiconductor layer 140 may possibly have properties thereof changed. In the semiconductor device 20, the end of the oxide semiconductor layer 140 is not included in the channel region 143, and therefore, no leak path is formed, which would otherwise be formed by the end of the oxide semiconductor layer 140. Namely, the semiconductor device 20 has a low off-current in addition to the effect provided by embodiment 1.

[Manufacturing Method of the Semiconductor Device 20]

With reference to plan views and cross-sectional views provided in FIG. 20A through FIG. 24B, a manufacturing method of the semiconductor device 20 in embodiment 2 according to the present invention will be described. The manufacturing method of the semiconductor device 20 shown in FIG. 19A and FIG. 19B is similar to that of the semiconductor device 10 shown in FIG. 1A and FIG. 1B, and thus will not be described much in detail.

Figure 20A:
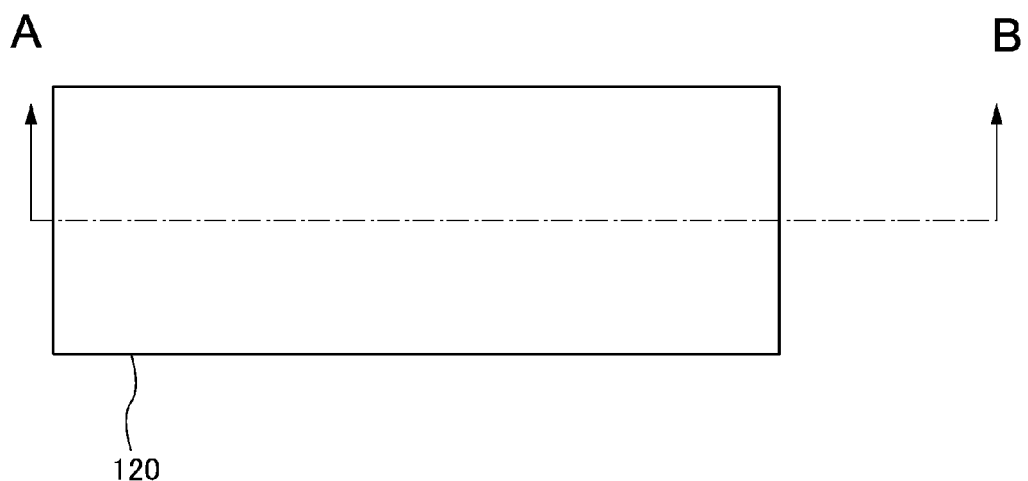
FIG. 20A is a plan view showing a step of forming a lower electrode in a manufacturing method of the semiconductor device in the embodiment according to the present invention.
Figure 20B:
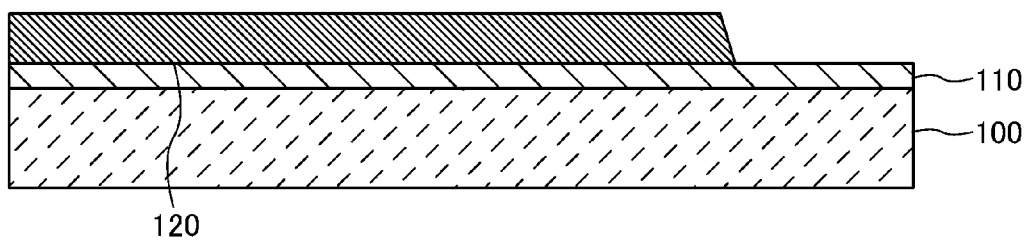
FIG. 20B is a cross-sectional view taken along line A-B in FIG. 20A.

FIG. 20A and FIG. 20B are respectively a plan view and a cross-sectional view showing a step of forming the lower electrode 120 in the manufacturing method of the semiconductor device 20 in embodiment 2 according to the present invention. First, referring to FIG. 20B, the underlying layer 110 and a film for the lower electrode 120 are formed on the substrate 100, and patterning is performed as shown in FIG. 20A by photolithography and etching to form the lower electrode 120.

Figure 21A:
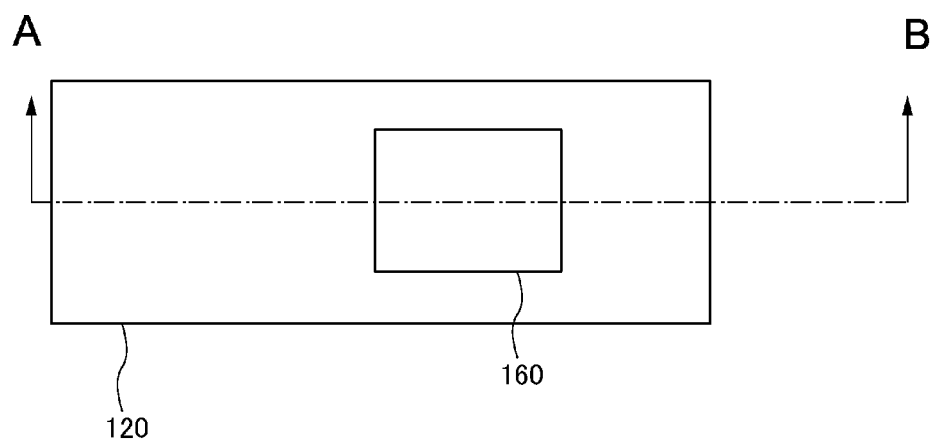
FIG. 21A is a plan view showing a step of forming a second insulating layer and a gate electrode in the manufacturing method of the semiconductor device in the embodiment according to the present invention.
Figure 21B:
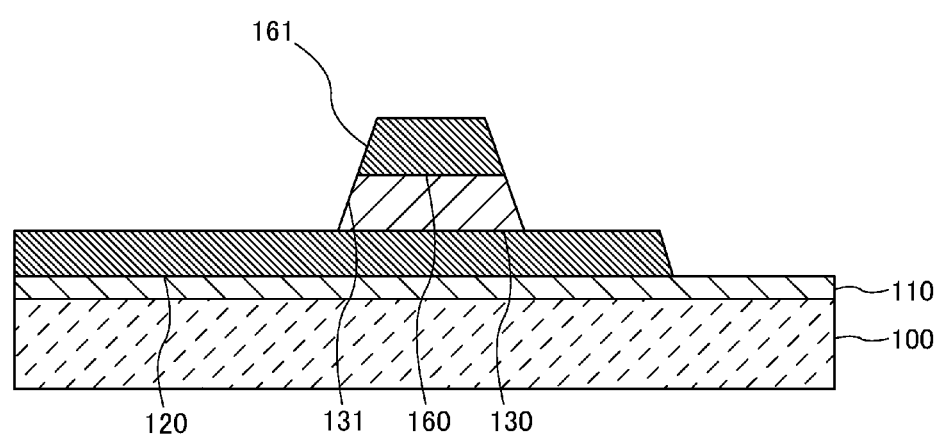
FIG. 21B is a cross-sectional view taken along line A-B in FIG. 21A.

FIG. 21A and FIG. 21B are respectively a plan view and a cross-sectional view showing a step of forming the second insulating layer 130 and the gate electrode 160 in the manufacturing method of the semiconductor device 20 in embodiment 2 according to the present invention. Referring to FIG. 21B, a film for the second insulating layer 130 and a film for the gate electrode 160 are formed on the entirety of the substrate shown in FIG. 20B, and patterning is performed as shown in FIG. 21A by photolithography and etching to form the insulating layer 130 and the gate electrode 160. The second insulating layer 130 and the gate electrode 160 have substantially the same pattern, and thus FIG. 21A shows the pattern of the gate electrode 160.

As shown in FIG. 21A, as seen in a plan view, the gate electrode 160 is located inner to the outer perimeter of the lower electrode 120. The semiconductor device 20 is not limited to having such a structure. For example, the gate electrode 160 may be entirely or partially located outer to the lower electrode 120 as seen in a plan view, so that a part of the second insulating layer 130 is in contact with the underlying layer 110 as seen in a cross-sectional view. In the case where the entirety of the gate electrode 160 is located outer to the lower electrode 120 as seen in a plan view, namely, in the case where the gate electrode 160 and the lower electrode 120 do not overlap each other as seen in a plan view, the gate electrode 160 may be in direct contact with the underlying layer 110 without the second insulating layer 130 being provided.

As seen in the cross-sectional view of FIG. 21B, the gate electrode 160 has the first side wall 161, and the second insulating layer 130 has the second side wall 131. The tapering angle of the first side wall 161 of the gate electrode 160 may be controlled by the etching rate of the gate electrode 160 and the retraction amount of a resist used as a mask for etching the gate electrode 160. The tapering angle of the second side wall 131 of the second insulating layer 130 may be controlled by the etching rate of the second insulating layer 130 and the retraction amount of a resist used as a mask for etching the second insulating layer 130.

Figure 22A:
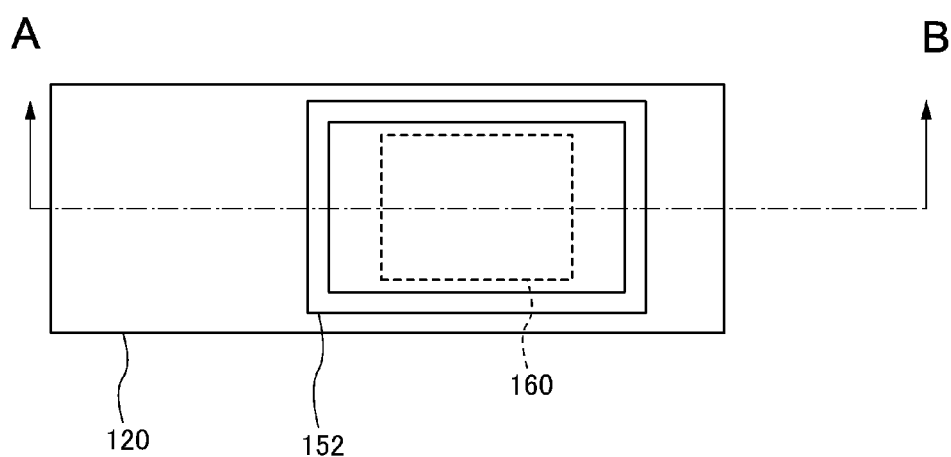
FIG. 22A is a plan view showing a step of forming a gate insulating layer and exposing a part of the lower electrode in the manufacturing method of the semiconductor device in the embodiment according to the present invention.
Figure 22B:
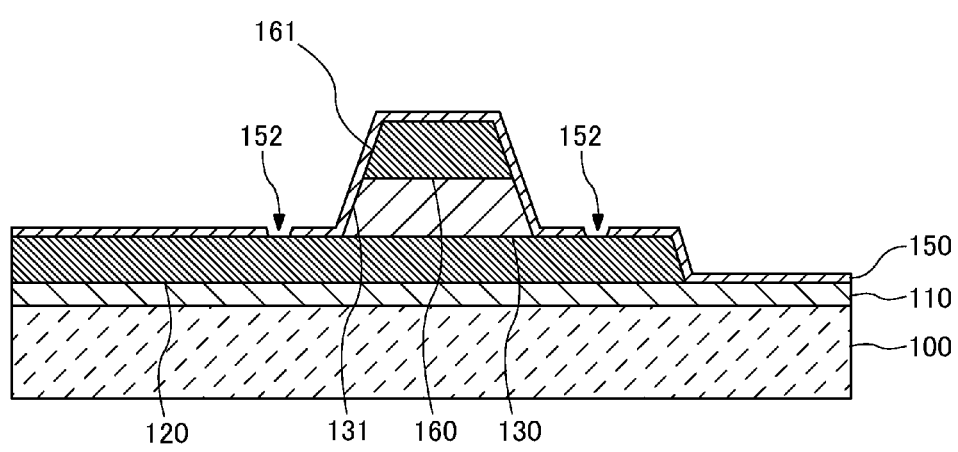
FIG. 22B is a cross-sectional view taken along line A-B in FIG. 22A.

FIG. 22A and FIG. 22B are respectively a plan view and a cross-sectional view showing a step of forming the gate insulating layer 150 and exposing a part of the lower electrode 120 in the manufacturing method of the semiconductor device 20 in embodiment 2 according to the present invention. Referring to FIG. 22B, the gate insulating layer 150 is formed on the entirety of the substrate shown in FIG. 21B, and patterning is performed as shown in FIG. 22A by photolithography and etching to form a first opening 152. As shown in FIG. 22A, the first opening 152 is provided in a ring shape to surround the gate electrode 160. It should be noted that the first opening 152 is not limited to having the planar shape shown in FIG. 22A. It is sufficient that the first opening 152 exposes at least the lower electrode 120. It is sufficient that the gate insulating layer 150 covers a top surface and the first side wall 161 of the gate electrode 160. The gate insulating layer 150 may expose the second side wall 131, the lower electrode 120 and the underlying layer 110. In other words, as seen in a plan view, it is sufficient that the gate insulating layer 150 covers the gate electrode 160.

Figure 23A:
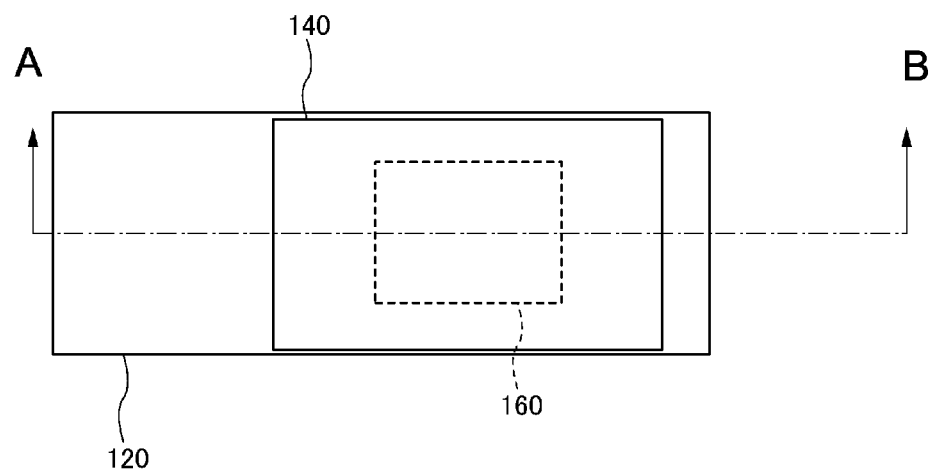
FIG. 23A is a plan view showing a step of forming an oxide semiconductor layer in the manufacturing method of the semiconductor device in the embodiment according to the present invention.
Figure 23B:
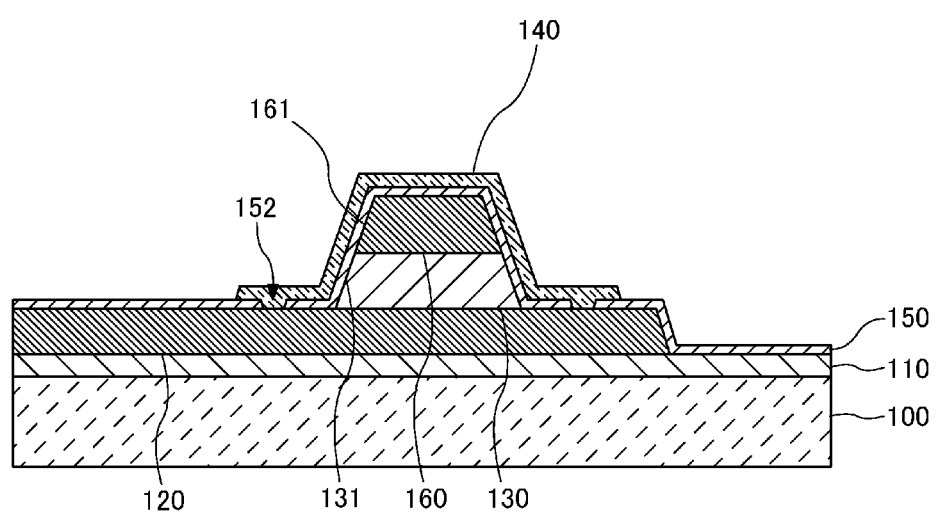
FIG. 23B is a cross-sectional view taken along line A-B in FIG. 23A.

FIG. 23A and FIG. 23B are respectively a plan view and a cross-sectional view showing a step of forming the oxide semiconductor layer 140 in the manufacturing method of the semiconductor device 20 in embodiment 2 according to the present invention. Referring to FIG. 23B, a film for the oxide semiconductor layer 140 is formed on the entirety of the substrate shown in FIG. 22B, and patterning is performed as shown in FIG. 23A by photolithography and etching to form the oxide semiconductor layer 140. As shown in FIG. 23A, the oxide semiconductor layer 140 covers the gate electrode 160 as seen in a plan view. Also as seen in a plan view, the oxide semiconductor layer 140 at least partially overlaps the first opening 152.

Figure 24A:
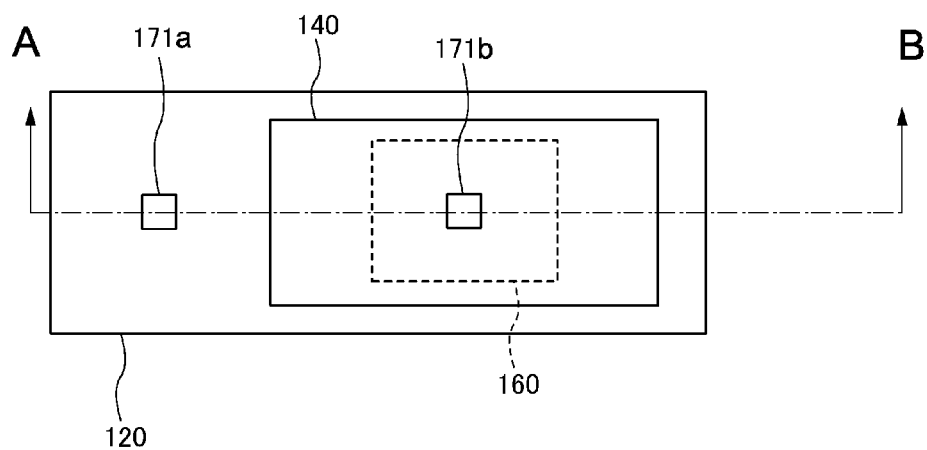
FIG. 24A is a plan view showing a step of forming a first insulating layer and also forming openings in the first insulating layer and the gate insulating layer in the manufacturing method of the semiconductor device in the embodiment according to the present invention.
Figure 24B:
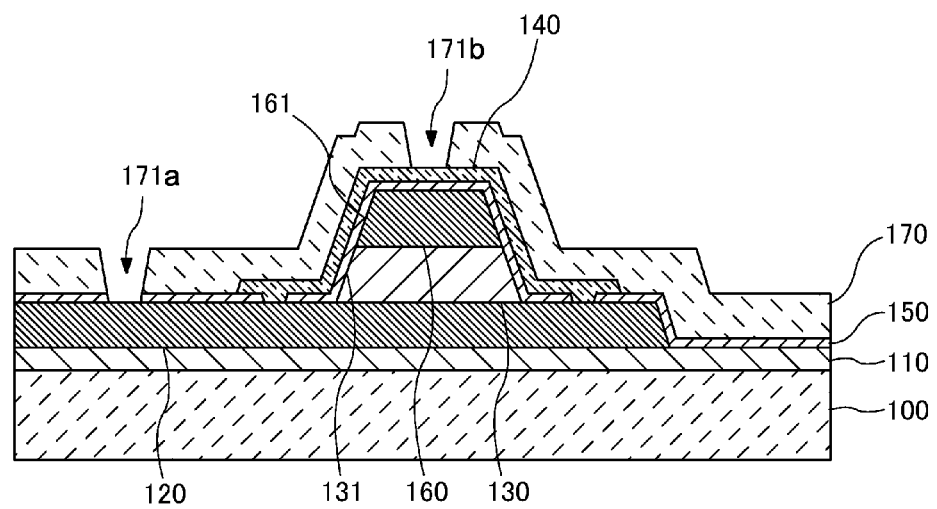
FIG. 24B is a cross-sectional view taken along line A-B in FIG. 24A.

FIG. 24A and FIG. 24B are respectively a plan view and a cross-sectional view showing a step of forming the first insulating layer 170 and also forming the second openings 171 in the first insulating layer 170 and the gate insulating layer 150 in the manufacturing method of the semiconductor device 20 in embodiment 2 according to the present invention. Referring to FIG. 24B, the first insulating layer 170 is formed on the entirety of the substrate shown in FIG. 23B, and patterning is performed as shown in FIG. 24A by photolithography and etching to form the second openings 171. As shown in FIG. 24B, the second opening 171a exposes the lower electrode 120, and the second opening 171b exposes the oxide semiconductor layer 140. Although not shown in FIG. 24A and FIG. 24B, the second opening 171c exposes the gate electrode 160 in an area not shown in FIG. 24A and FIG. 24B.

Then, a film for the upper electrodes 180 is formed on the entirety of the substrate shown in FIG. 24B, and patterning is performed to form the upper electrodes 180 as shown in FIG. 19A and FIG. 19B. The semiconductor device 20 in embodiment 2 according to the present invention is manufactured by the manufacturing method described above. Referring to FIG. 19B, a portion of the oxide semiconductor layer 140 that is located on the ring-shaped first side wall 161 along the end of the gate electrode 160 is a part of the channel region 143. More specifically, as shown in FIG. 19A, the channel region 143 is formed in a ring shape along the end of the gate electrode 160. The surround-type semiconductor device 20 in which the end of the oxide semiconductor layer 140 is not included in the channel region 143 is manufactured by the above-described method.

<Modification 1 of Embodiment 2>

Figure 25:
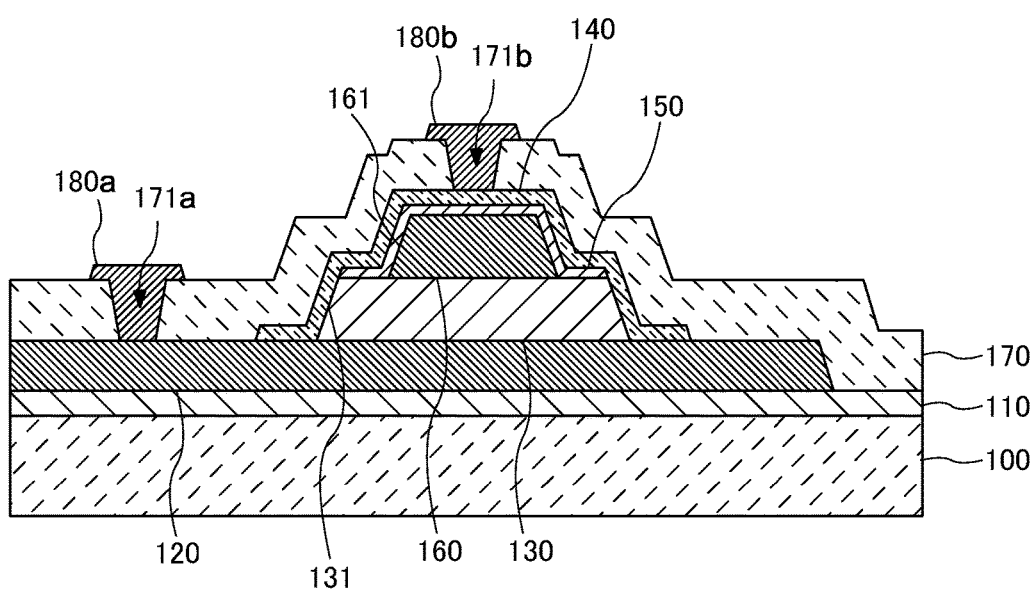
FIG. 25 is a cross-sectional view showing an overview of a semiconductor device in a modification of the embodiment according to the present invention.

With reference to FIG. 25, modification 1 of embodiment 2 according to the present invention will be described. A semiconductor device 21 in modification 1 of embodiment 2 is similar to the surround-type semiconductor device 20 in embodiment 2. In the following description, the components having the identical structures or functions to those of the semiconductor device 20 will bear the identical reference signs thereto, and detailed descriptions thereof will be omitted.

FIG. 25 is a cross-sectional view showing an overview of the semiconductor device 21 in modification 1 of embodiment 2 according to the present invention. As shown in FIG. 25, in the semiconductor device 21, the second insulating layer 130 and the gate electrode 160 have different planar patterns from each other, and the gate insulating layer 150 and the second insulating layer 130 have substantially the same planar pattern. Specifically, the second insulating layer 130 and the gate electrode 160 have a wide opening in an area where the oxide semiconductor layer 140 and the upper electrode 180a are connected with the lower electrode 120. The first side wall 161 of the gate electrode 160 and the second side wall 131 of the second insulating layer 130 are located at different positions from each other as seen in a plan view.

As shown in FIG. 25, the oxide semiconductor layer 140 is in contact with the second side wall 131 of the second insulating layer 130. In such a structure, the second insulating layer 130 may be formed of a material which easily generates carriers in the oxide semiconductor layer 140, so that a portion of the oxide semiconductor layer 140 that is located on the second side wall 131 has a small specific electrical resistance. In the case where the specific electrical resistance of the oxide semiconductor layer 140 is to be made small, the second insulating layer 130 may be formed of an inorganic insulating material such as hydrogen-containing $SiN_x$ or the like.

As described above, in the semiconductor device 21 in modification 1 of embodiment 2, the oxide semiconductor layer 140 is in contact with the lower electrode 120 in a larger area. Therefore, the contact resistance of the oxide semiconductor layer 140 and the lower electrode 120 is decreased. As a result, the semiconductor device 21 is capable of increasing the on-current.

Embodiment 3

Figure 26A:
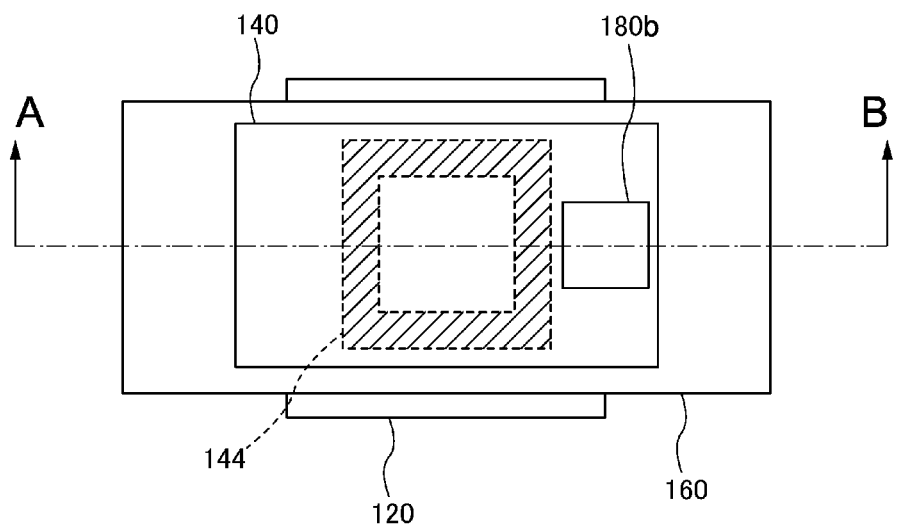
FIG. 26A is a plan view showing an overview of a semiconductor device in an embodiment according to the present invention.
Figure 26B:
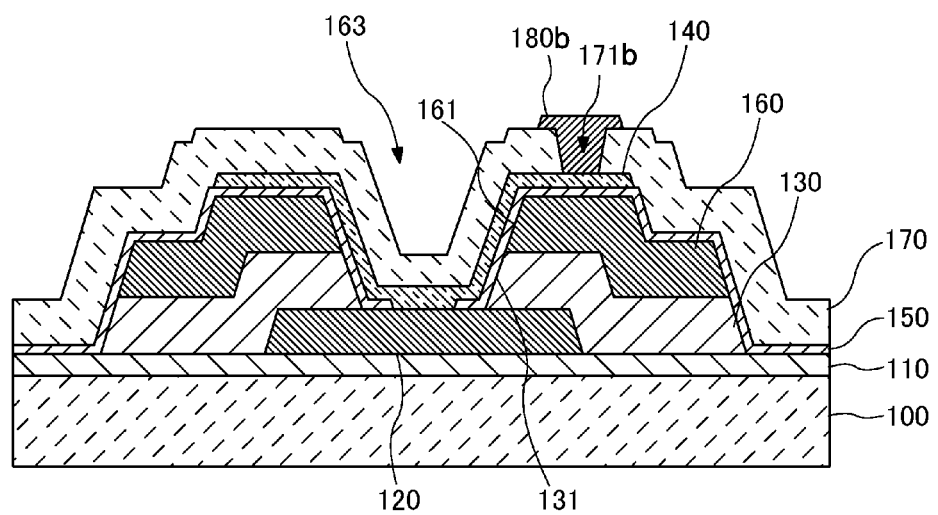
FIG. 26B is a cross-sectional view taken along line A-B in FIG. 26A.

With reference to FIG. 26A and FIG. 26B, an overview of a semiconductor device 30 in embodiment 3 according to the present invention will be described. The semiconductor device 30 in embodiment 3 is usable in a display device or a driving circuit like in embodiments 1 and 2. The semiconductor device 30 in embodiment 3 is described as having a structure including a channel formed of an oxide semiconductor. The semiconductor device 30 in embodiment 3 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 3, the semiconductor device 30 is a transistor. This does not limit the semiconductor device according to the present invention to a transistor.

[Structure of the Semiconductor Device 30]

FIG. 26A and FIG. 26B are respectively a plan view and a cross-sectional view showing an overview of the semiconductor device 30 in embodiment 3 according to the present invention. The semiconductor device 30 shown in FIG. 26A and FIG. 26B has the same layer structure as, but has a different layout from, that of the semiconductor device 10 shown in FIG. 1A and FIG. 1B. Specifically, in the semiconductor device 30, unlike in the semiconductor device 10, as seen in a plan view, the first side wall 161, which is ring-shaped, is exposed to an opening 163 provided inner to the gate electrode 160 and reaching the lower electrode 120 (see FIG. 28A). More specifically, as shown in FIG. 26A, the semiconductor 30 includes a ring-shaped channel region 144, and is of a surround type in which an end of the oxide semiconductor layer 140 is not included in the channel region 144.

In the example shown in FIG. 26A and FIG. 26B, the surround-type semiconductor device 30 uses the structure of embodiment 1 shown in FIG. 1A and FIG. 1B. Alternatively, the structure of modification 1 or 2 of embodiment 1 shown in FIG. 7A and FIG. 7B or FIG. 13A and FIG. 13B may be used to provide a surround-type semiconductor.

As described above, in the semiconductor device 30 in embodiment 3 according to the present invention, the oxide semiconductor layer 140 is located along the ring-shaped first side wall 161, and the channel region 144 is formed to be ring-shaped. Therefore, the end of the oxide semiconductor layer 140 is not included in the channel region 144. During the etching performed to form the oxide semiconductor layer 140, the end of the oxide semiconductor layer 140 may possibly have properties thereof changed. In the semiconductor device 30, the end of the oxide semiconductor layer 140 is not included in the channel region 144, and therefore, no leak path is formed, which would otherwise be formed by the end of the oxide semiconductor layer 140. Namely, the semiconductor device 30 has a low off-current in addition to the effect provided by embodiment 1.

[Manufacturing Method of the Semiconductor Device 30]

With reference to plan views and cross-sectional views provided in FIG. 27A through FIG. 31B, a manufacturing method of the semiconductor device 30 in embodiment 3 according to the present invention will be described. The manufacturing method of the semiconductor device 30 shown in FIG. 26A and FIG. 26B is similar to that of the semiconductor device 10 shown in FIG. 1A and FIG. 1B, and thus will not be described much in detail.

Figure 27A:
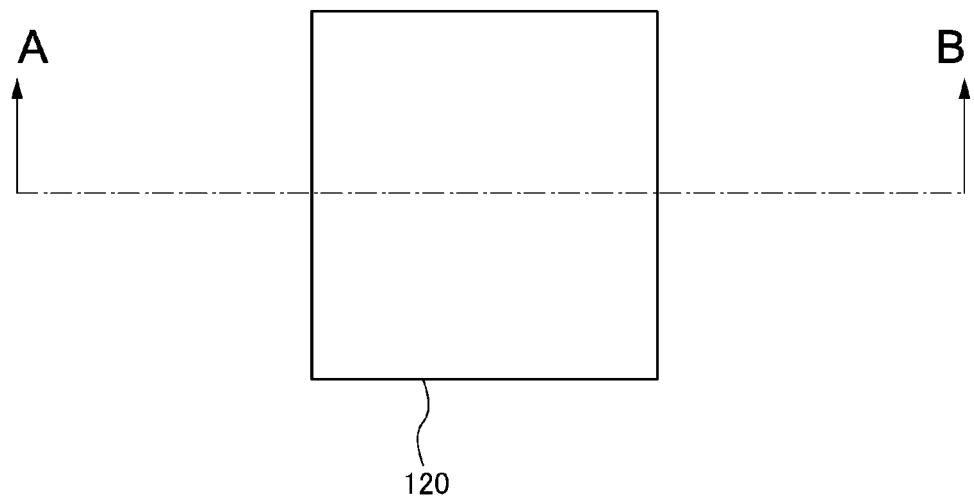
FIG. 27A is a plan view showing a step of forming a lower electrode in a manufacturing method of the semiconductor device in the embodiment according to the present invention.
Figure 27B:
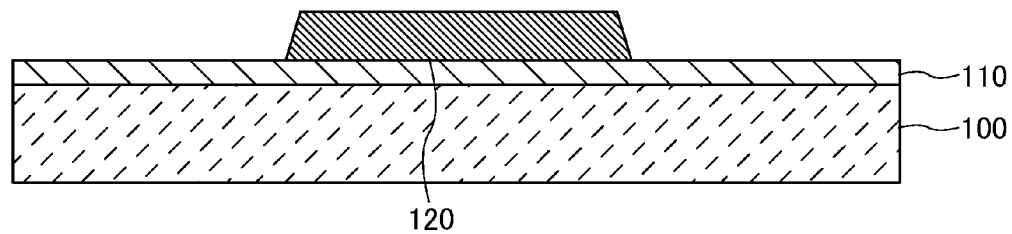
FIG. 27B is a cross-sectional view taken along line A-B in FIG. 27A.

FIG. 27A and FIG. 27B are respectively a plan view and a cross-sectional view showing a step of forming the lower electrode 120 in the manufacturing method of the semiconductor device 30 in embodiment 3 according to the present invention. First, referring to FIG. 27B, the underlying layer 110 and a film for the lower electrode 120 are formed on the substrate 100, and patterning is performed as shown in FIG. 27A by photolithography and etching to form the lower electrode 120.

Figure 28A:
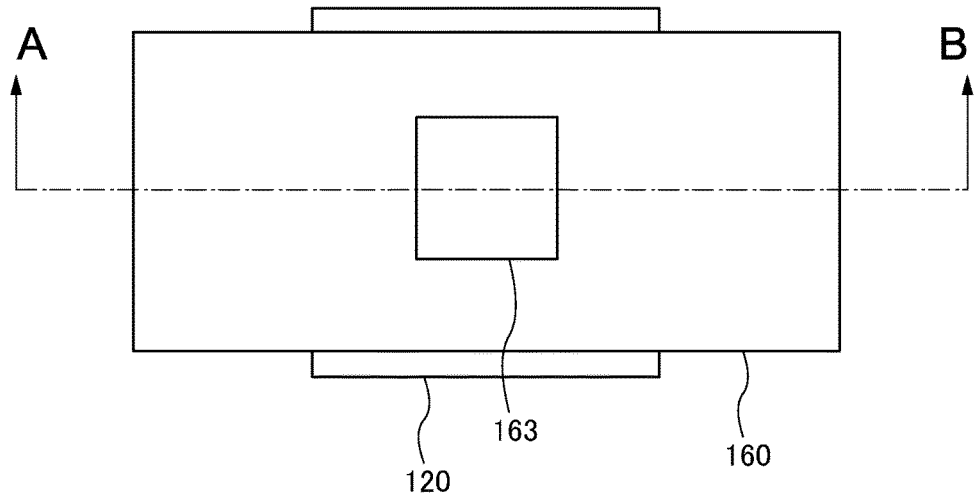
FIG. 28A is a plan view showing a step of forming a second insulating layer and a gate electrode in the manufacturing method of the semiconductor device in the embodiment according to the present invention.
Figure 28B:
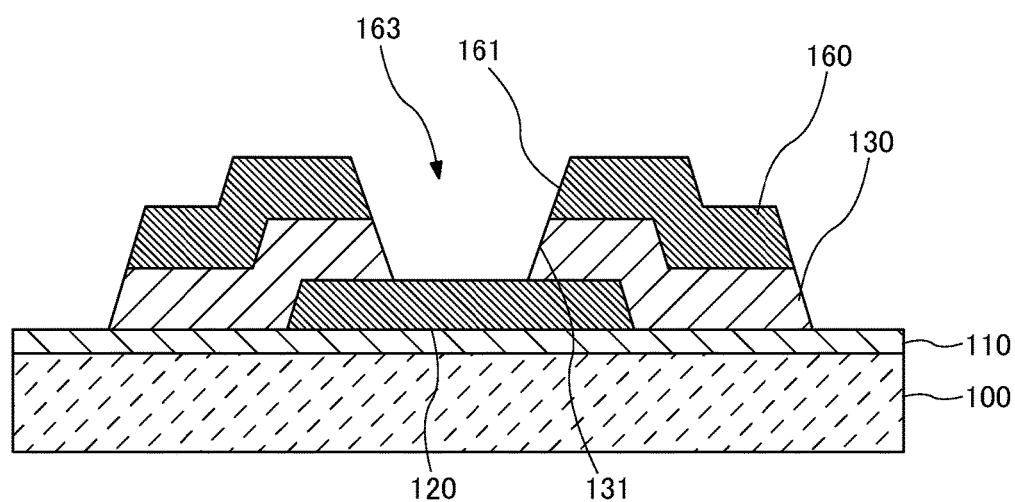
FIG. 28B is a cross-sectional view taken along line A-B in FIG. 28A.

FIG. 28A and FIG. 28B are respectively a plan view and a cross-sectional view showing a step of forming the second insulating layer 130 and the gate electrode 160 in the manufacturing method of the semiconductor device 30 in embodiment 3 according to the present invention. Referring to FIG. 28B, a film for the second insulating layer 130 and a film for the gate electrode 160 are formed on the entirety of the substrate shown in FIG. 27B, and patterning is performed as shown in FIG. 28A by photolithography and etching to form the insulating layer 130 and the gate electrode 160 having the opening 163 reaching the lower electrode 120. As seen in a plan view, the opening 163 is located inner to an outer perimeter of the lower electrode 120. The second insulating layer 130 and the gate electrode 160 have substantially the same pattern, and thus FIG. 28A shows the pattern of the gate electrode 160.

In the example shown in FIG. 28A, the opening 163 has a square pattern. The opening 163 is not limited to having such a pattern and may have any shape of pattern as long as exposing at least a part of the lower electrode 120. For example, the opening 163 may be of any of various patterns, for example, circular, elliptical, polygonal, curved or the like. In the example shown in FIG. 28A, the opening 163 is located inner to the outer perimeter of the lower electrode 120 as seen in a plan view, but is not limited to having such a structure. It is sufficient that at least a part of the opening 163 exposes the lower electrode 120. For example, the opening 163 may be located to expose both of the lower electrode 120 and the underlying layer 110.

Figure 29A:
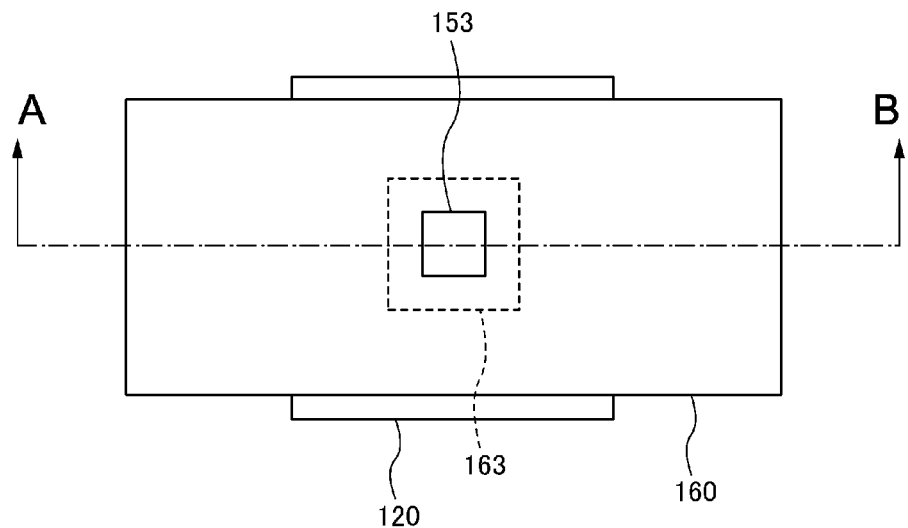
FIG. 29A is a plan view showing a step of forming a gate insulating layer and exposing a part of the lower electrode in the manufacturing method of the semiconductor device in the embodiment according to the present invention.
Figure 29B:
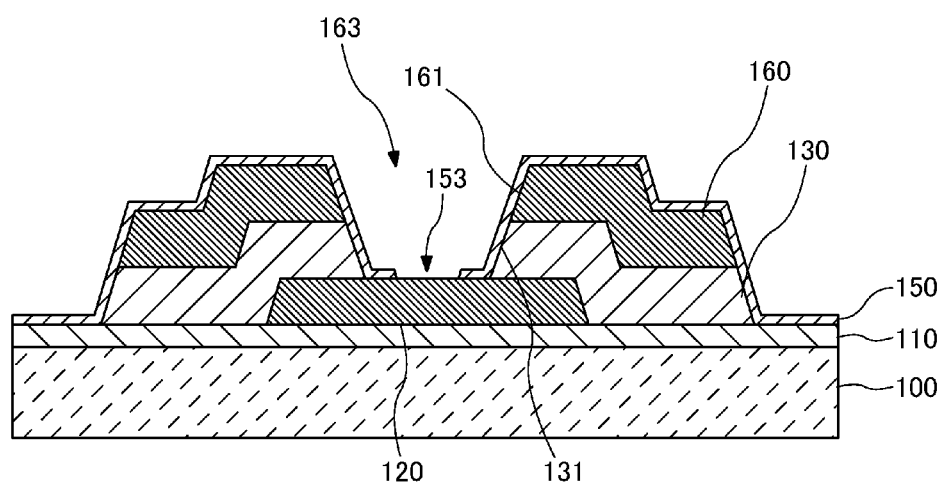
FIG. 29B is a cross-sectional view taken along line A-B in FIG. 29A.

FIG. 29A and FIG. 29B are respectively a plan view and a cross-sectional view showing a step of forming the gate insulating layer 150 and exposing a part of the lower electrode 120 in the manufacturing method of the semiconductor device 30 in embodiment 3 according to the present invention. Referring to FIG. 29B, the gate insulating layer 150 is formed on the entirety of the substrate shown in FIG. 28B, and patterning is performed as shown in FIG. 29A by photolithography and etching to form a first opening 153. As shown in FIG. 29A, the first opening 153 is provided inner to the ring-shaped first side wall 161 of the gate electrode 160 as seen in a plan view. In the example shown in FIG. 29A and FIG. 29B, the gate insulating layer 150 is formed on the entirety of the substrate except for the first opening 153. It is sufficient that the gate insulating layer 150 covers at least a top surface and the first side wall 161 of the gate electrode 160. The gate insulating layer 150 may expose the second side wall 131 and the underlying layer 110. In other words, it is sufficient that the gate insulating layer 150 covers the gate electrode 160 as seen in a plan view.

Figure 30A:
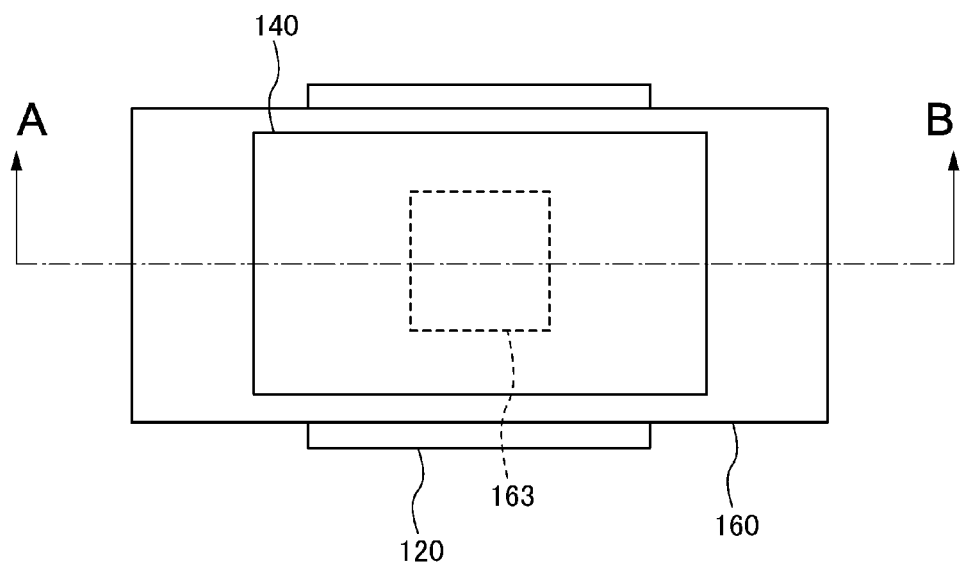
FIG. 30A is a plan view showing a step of forming an oxide semiconductor layer in the manufacturing method of the semiconductor device in the embodiment according to the present invention.
Figure 30B:
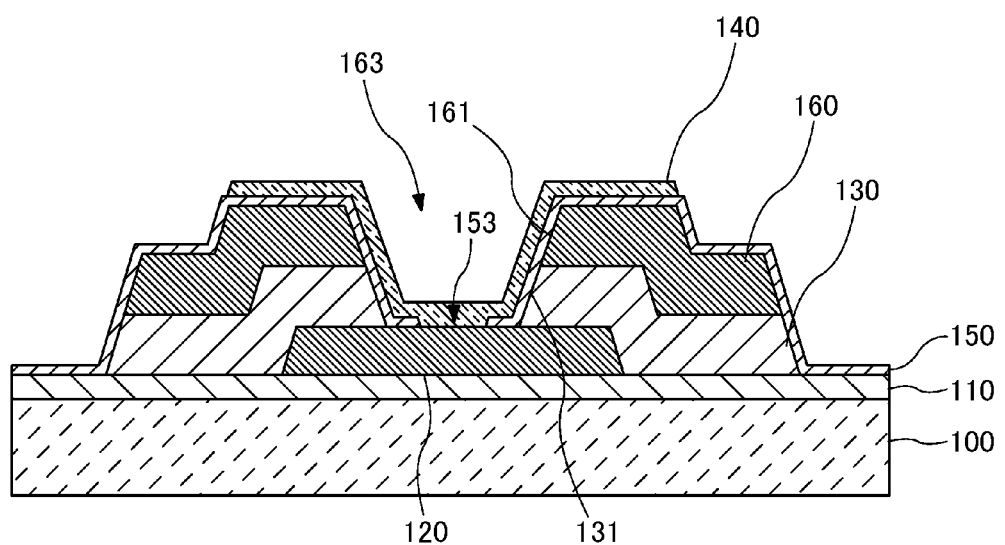
FIG. 30B is a cross-sectional view taken along line A-B in FIG. 30A.

FIG. 30A and FIG. 30B are respectively a plan view and a cross-sectional view showing a step of forming the oxide semiconductor layer 140 in the manufacturing method of the semiconductor device 30 in embodiment 3 according to the present invention. Referring to FIG. 30B, a film for the oxide semiconductor layer 140 is formed on the entirety of the substrate shown in FIG. 29B, and patterning is performed as shown in FIG. 30A by photolithography and etching to form the oxide semiconductor layer 140. As shown in FIG. 30A, the oxide semiconductor layer 140 covers the first side wall 161 exposed to the opening 163 provided in the gate electrode 160 and the first opening 153 as seen in a plan view.

Figure 31A:
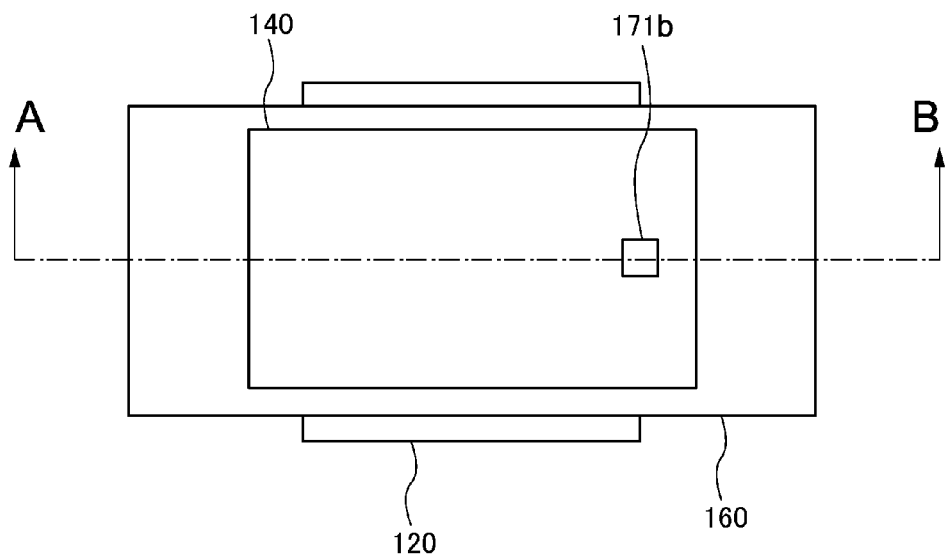
FIG. 31A is a plan view showing a step of forming a first insulating layer and also forming openings in the first insulating layer in the manufacturing method of the semiconductor device in the embodiment according to the present invention.
Figure 31B:
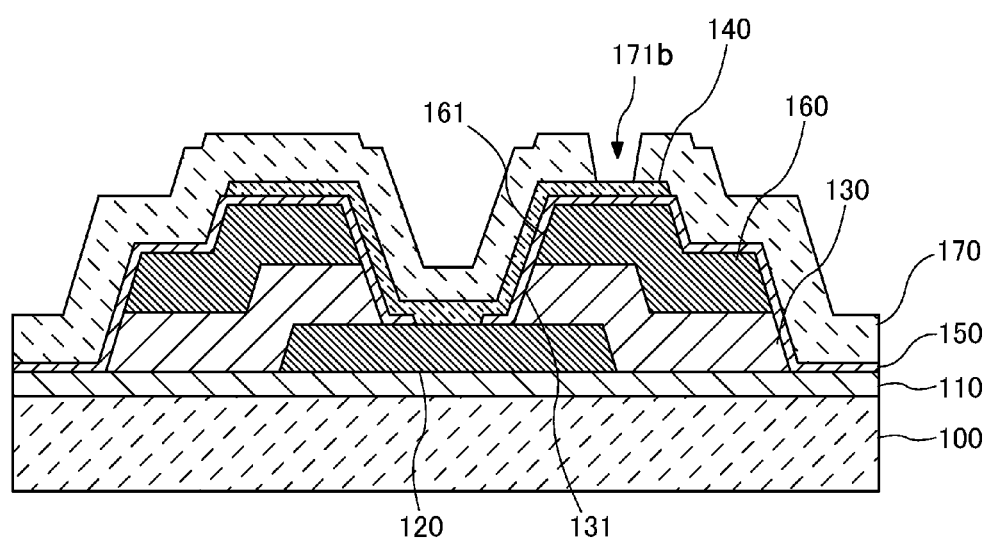
FIG. 31B is a cross-sectional view taken along line A-B in FIG. 31A.

FIG. 31A and FIG. 31B are respectively a plan view and a cross-sectional view showing a step of forming the first insulating layer 170 and also forming the second openings 171 in the first insulating layer 170 in the manufacturing method of the semiconductor device 30 in embodiment 3 according to the present invention. Referring to FIG. 31B, the first insulating layer 170 is formed on the entirety of the substrate shown in FIG. 30B, and patterning is performed as shown in FIG. 31A by photolithography and etching to form the second openings 171 (FIG. 31A and FIG. 31B show only one second opening 171). As shown in FIG. 31B, the second opening 171b exposes the oxide semiconductor layer 140. Although not shown in FIG. 31A and FIG. 31B, the second opening 171a exposes the lower electrode 120, and the second opening 171c exposes the gate electrode 160, in areas not shown in FIG. 31A and FIG. 31B.

Then, a film for the upper electrodes 180 is formed on the entirety of the substrate shown in FIG. 31B, and patterning is performed to form the upper electrodes 180 as shown in FIG. 26A and FIG. 26B (FIG. 26A and FIG. 26B show only one upper electrode 180). The semiconductor device 30 in embodiment 3 according to the present invention is manufactured by the manufacturing method described above. Referring to FIG. 26B, a portion of the oxide semiconductor layer 140 that is located on the ring-shaped first side wall 161 exposed to the opening 163 provided in the gate electrode 160 is a part of the channel region 144. More specifically, as shown in FIG. 26A, the channel region 144 is formed in a ring shape along the first side wall 161 exposed to the opening 163 provided in the gate electrode 160. The surround-type semiconductor device 30 in which the end of the oxide semiconductor layer 140 is not included in the channel region 144 is manufactured by the above-described method.

<Modification 1 of Embodiment 3>

Figure 32:
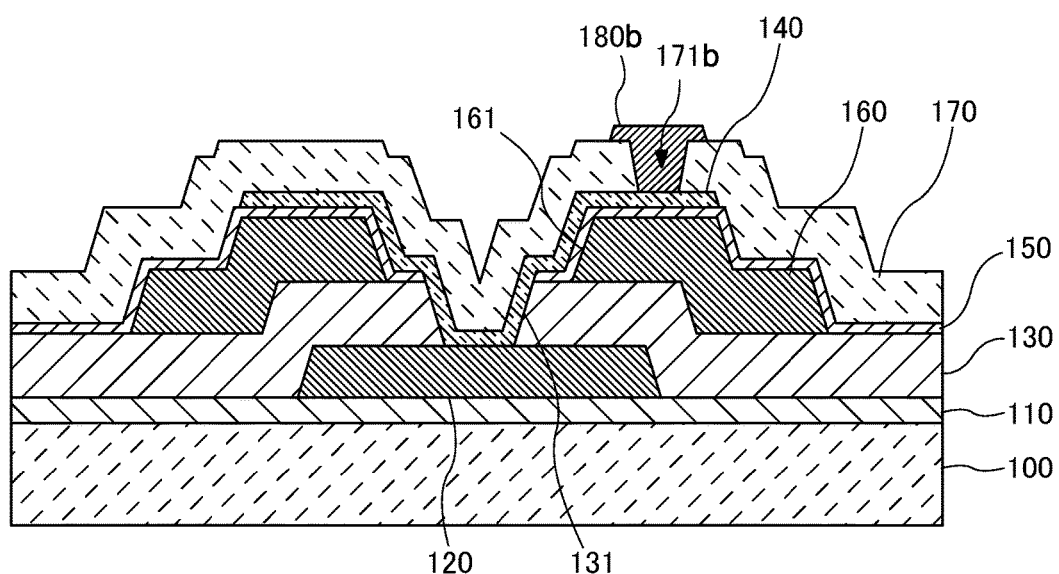
FIG. 32 is a cross-sectional view showing an overview of a semiconductor device in a modification of the embodiment according to the present invention.

With reference to FIG. 32, modification 1 of embodiment 3 according to the present invention will be described. A semiconductor device 31 in modification 1 of embodiment 3 is similar to the surround-type semiconductor device 30 in embodiment 3. In the following description, the components having the identical structures or functions to those of the semiconductor device 30 will bear the identical reference signs thereto, and detailed descriptions thereof will be omitted.

FIG. 32 is a cross-sectional view showing an overview of the semiconductor device 31 in modification 1 of embodiment 3 according to the present invention. As shown in FIG. 32, in the semiconductor device 31, the second insulating layer 130 and the gate electrode 160 have different patterns from each other, and the gate insulating layer 150 and the second insulating layer 130 have substantially the same pattern. The first side wall 161 of the gate electrode 160 and the second side wall 131 of the second insulating layer 130 are located at different positions from each other as seen in a plan view.

As shown in FIG. 32, the oxide semiconductor layer 140 is in contact with the second side wall 131 of the second insulating layer 130. In such a structure, the second insulating layer 130 may be formed of a material which easily generates carriers in the oxide semiconductor layer 140, so that a portion of the oxide semiconductor layer 140 that is located on the second side wall 131 has a small specific electrical resistance. In the case where the specific electrical resistance of the oxide semiconductor layer 140 is to be made small, the second insulating layer 130 may be formed of an inorganic insulating material such as hydrogen-containing $SiN_x$ or the like.

Embodiment 4

With reference to FIG. 33A through FIG. 37B, an overview of a semiconductor device 40 in embodiment 4 according to the present invention will be described. The semiconductor device 40 in embodiment 4 has the same cross-sectional structure as, but has a different layout from, that of the semiconductor device 20 shown in FIG. 19A and FIG. 19B.

[Structure of the Semiconductor Device 40]

Figure 33A:
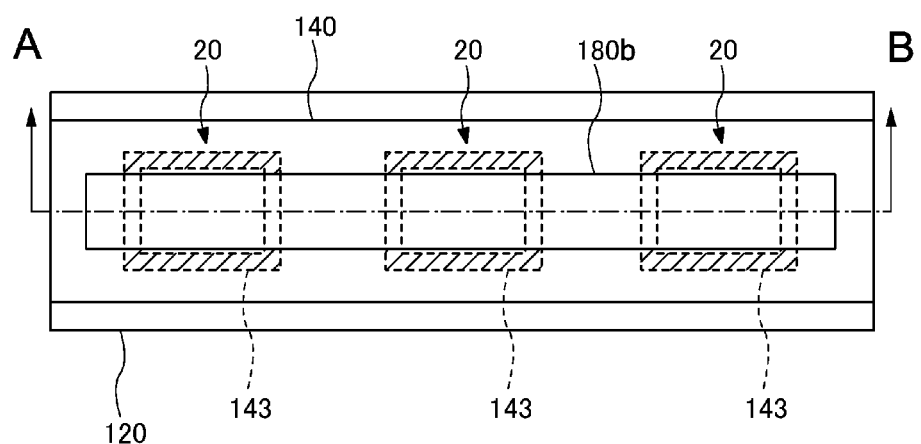
FIG. 33A is a plan view showing an overview of a semiconductor device in an embodiment according to the present invention.
Figure 33B:
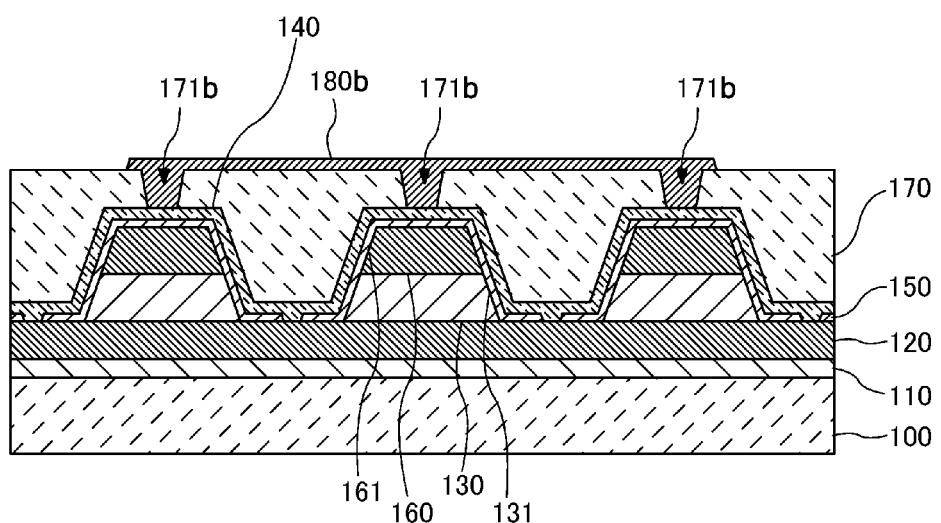
FIG. 33B is a cross-sectional view taken along line A-B in FIG. 33A.

FIG. 33A and FIG. 33B are respectively a plan view and a cross-sectional view showing an overview of the semiconductor device 40 in embodiment 4 according to the present invention. As shown in FIG. 33A and FIG. 33B, the semiconductor device 40 in embodiment 4 includes a plurality of the surround-type semiconductor devices 20 shown in FIG. 19A and FIG. 19B that are coupled parallel to each other. More specifically, the semiconductor device 40 includes a plurality of the first side walls 161, which are ring-shaped, that are located adjacent to each other (see FIG. 34A). The lower electrodes 120 of the plurality of semiconductor devices 20 are provided as one lower electrode 120 common to the plurality of ring-shaped first side walls 161. The gate electrodes 160 of the plurality of semiconductor devices 20 are provided as one gate electrode 160 common to the plurality of ring-shaped first side walls 161. The upper electrodes 180b of the plurality of semiconductor devices 20 are provided as one upper electrode 180b common to the plurality of ring-shaped first side walls 161. In other words, in the semiconductor device 40, the plurality of semiconductor devices 20 each including the ring-shaped channel region 143 are located adjacent to each other. Therefore, the plurality of semiconductor devices 20 are supplied with the same source-drain voltage at the same time and with the same gate voltage at the same time.

In FIG. 33A and FIG. 33B, the surround-type semiconductor devices 20 shown in FIG. 19A and FIG. 19B in embodiment 2 are located adjacent to each other. The semiconductor device 40 is not limited to having such a structure. For example, a plurality of the surround-type semiconductor devices 30 shown in FIG. 26A and FIG. 26B in embodiment 3 may be located adjacent to each other. In the example shown in FIG. 33A and FIG. 33B, the plurality of surround-type semiconductor devices 20 each have the structure of embodiment 2 shown in FIG. 19A and FIG. 19B. Alternatively, the semiconductor devices in modification 1 or 2 of embodiment 1 shown in FIG. 7A and FIG. 7B or FIG. 13A and FIG. 13B may be used to realize a semiconductor device.

As described above, in the semiconductor device 40, the ring-shaped channel regions 143 of the plurality of semiconductor devices 20 are turned on/off at the same time. Therefore, the W length of the semiconductor device 40 is substantially increased. As a result, the semiconductor device 40 is capable of increasing the on-current.

[Manufacturing Method of the Semiconductor Device 40]

In order to more clarify the structure of the semiconductor device 40 shown in FIG. 33A and FIG. 33B, a manufacturing method of the semiconductor device 40 will be described with reference to plan views and cross-sectional views provided in FIG. 34A through FIG. 37B. Each of the semiconductor devices 20 included in the semiconductor device 40 shown in FIG. 33A and FIG. 33B is the same as the semiconductor device 20 shown in FIG. 19A and FIG. 19B, and thus will not be described in detail.

Figure 34A:
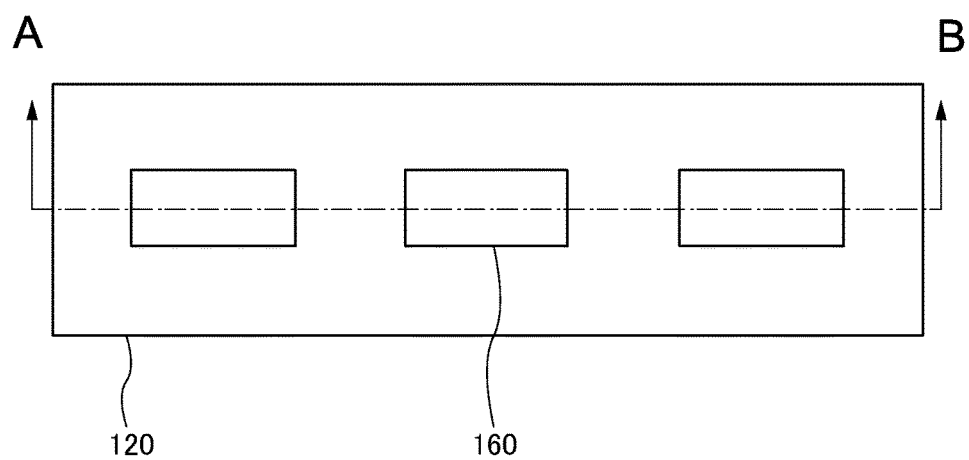
FIG. 34A is a plan view showing a step of forming a second insulating layer and a gate electrode on a lower electrode in a manufacturing method of the semiconductor device in the embodiment according to the present invention.
Figure 34B:
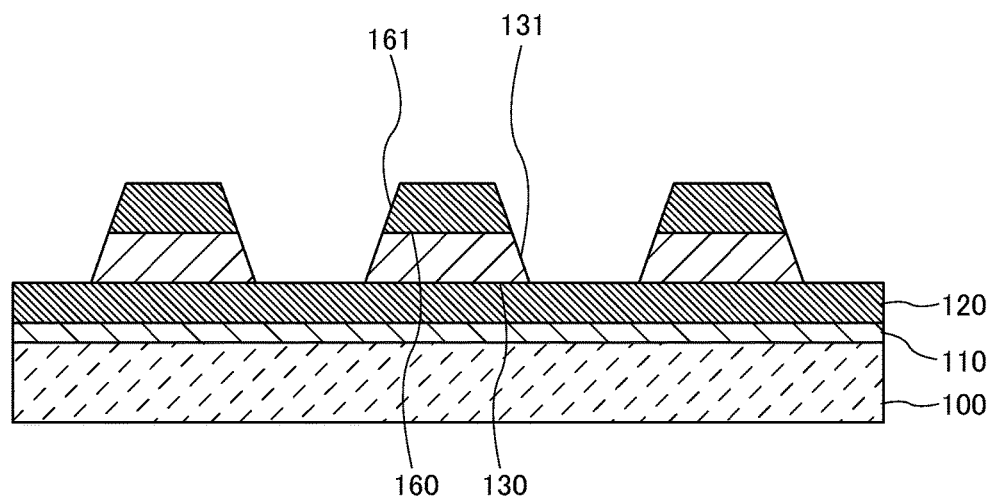
FIG. 34B is a cross-sectional view taken along line A-B in FIG. 34A.

FIG. 34A and FIG. 34B are respectively a plan view and a cross-sectional view showing a step of forming the second insulating layer 130 and the gate electrode 160 on the lower electrode 120 in the manufacturing method of the semiconductor device 40 in embodiment 4 according to the present invention. As shown in FIG. 34B, a plurality of second insulating layers 130 adjacent to each other, and a plurality of gate electrodes 160 adjacent to each other, are formed on one lower electrode 120. In the example shown in FIG. 34A and FIG. 34B, three second insulating layers 130 and three gate electrodes 160 are formed on one lower electrode 120. The semiconductor device 40 is not limited to having such a structure, and the number of the second insulating layers 130 and the gate electrodes 160 formed on one lower electrode 120 may be smaller or larger than three. The second insulating layers 130 and the gate electrodes 160 have substantially the same pattern, and thus FIG. 34A shows the pattern of the gate electrodes 160.

As shown in FIG. 34A, as seen in a plan view, the plurality of gate electrodes 160 are located inner to an outer perimeter of the lower electrode 120. The semiconductor device 40 is not limited to having such a structure. For example, the gate electrodes 160 may be entirely or partially located outer to the lower electrode 120 as seen in a plan view, such that a part of the second insulating layers 130 may be in contact with the underlying layer 110 as seen in a cross-sectional view. In the case where the entirety of the gate electrodes 160 is located outer to the lower electrode 120 as seen in a plan view, namely, in the case where the gate electrodes 160 and the lower electrode 120 do not overlap each other as seen in a plan view, the gate electrodes 160 may be in direct contact with the underlying layer 110 without the second insulating layers 130 being provided.

As seen in the cross-sectional view of FIG. 34B, the gate electrodes 160 each have the first side wall 161, and the insulating layers 130 each have the second side wall 131. The tapering angle of the first side walls 161 of the gate electrodes 160 may be controlled by the etching rate of the gate electrodes 160 and the retraction amount of a resist used as a mask for etching the gate electrodes 160. The tapering angle of the second side walls 131 of the second insulating layers 130 may be controlled by the etching rate of the second insulating layers 130 and the retraction amount of a resist used as a mask for etching the second insulating layers 130.

Figure 35A:
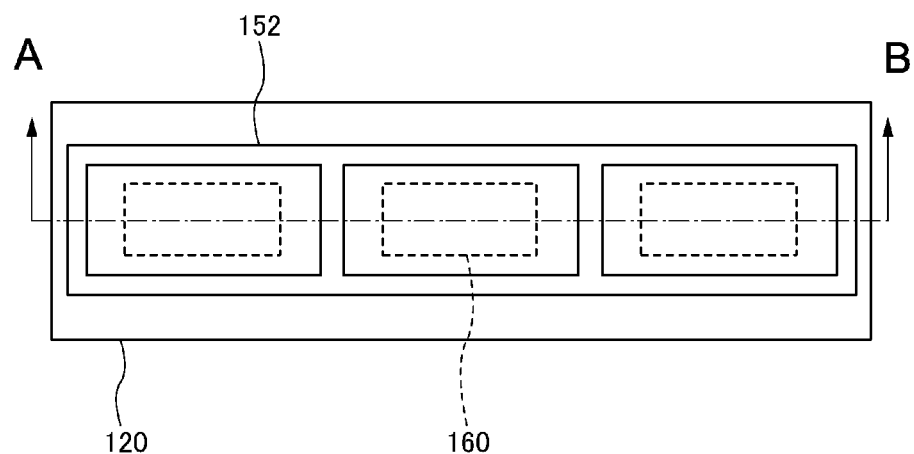
FIG. 35A is a plan view showing a step of forming a gate insulating layer and exposing a part of the lower electrode in the manufacturing method of the semiconductor device in the embodiment according to the present invention.
Figure 35B:
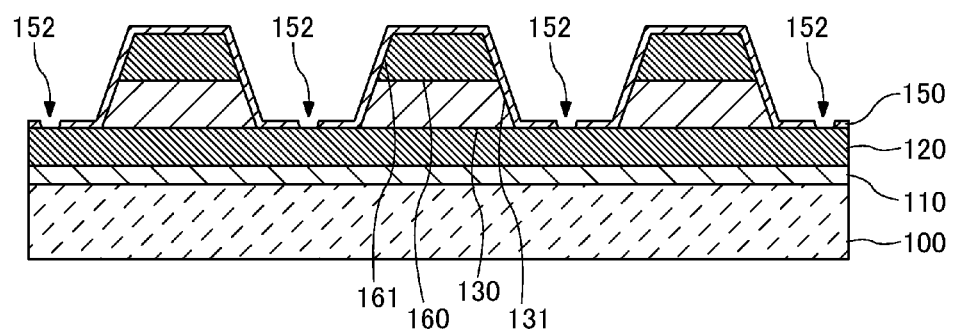
FIG. 35B is a cross-sectional view taken along line A-B in FIG. 35A.

FIG. 35A and FIG. 35B are respectively a plan view and a cross-sectional view showing a step of forming the gate insulating layer 150 and exposing a part of the lower electrode 120 in the manufacturing method of the semiconductor device 40 in embodiment 4 according to the present invention. Referring to FIG. 35B, the gate insulating layer 150 is formed on the entirety of the substrate shown in FIG. 34B, and patterning is performed as shown in FIG. 35A by photolithography and etching to form first openings 152. As shown in FIG. 35A, the first openings 152 are each provided in a ring shape to surround the gate electrodes 160. It should be noted that the first openings 152 are not limited to having the planar shape shown in FIG. 35A. It is sufficient that the first openings 152 each expose at least the lower electrode 120. It is sufficient that the gate insulating layer 150 covers top surfaces and the first side walls 161 of the gate electrodes 160. The gate insulating layer 150 may expose the second side walls 131, the lower electrode 120 and the underlying layer 110. In other words, it is sufficient that the gate insulating layer 150 covers the gate electrodes 160 as seen in a plan view.

Figure 36A:
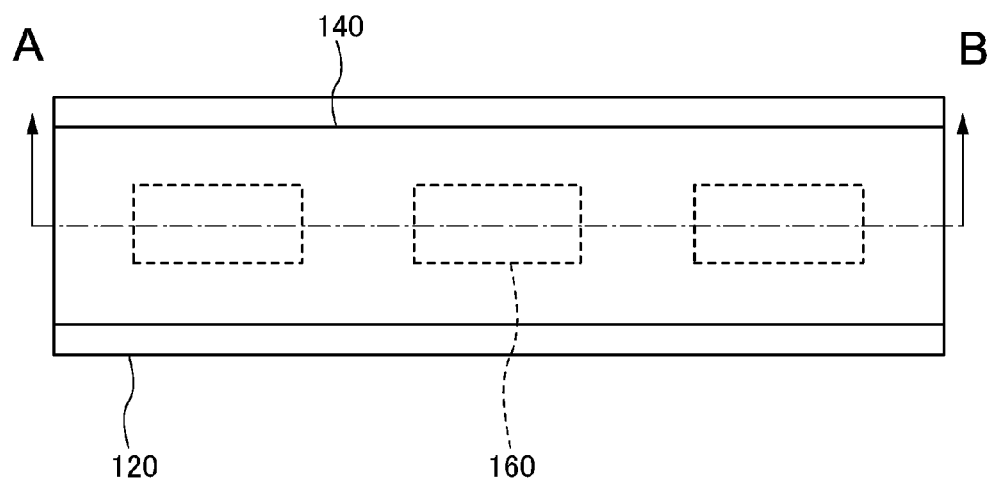
FIG. 36A is a plan view showing a step of forming an oxide semiconductor layer in the manufacturing method of the semiconductor device in the embodiment according to the present invention.
Figure 36B:
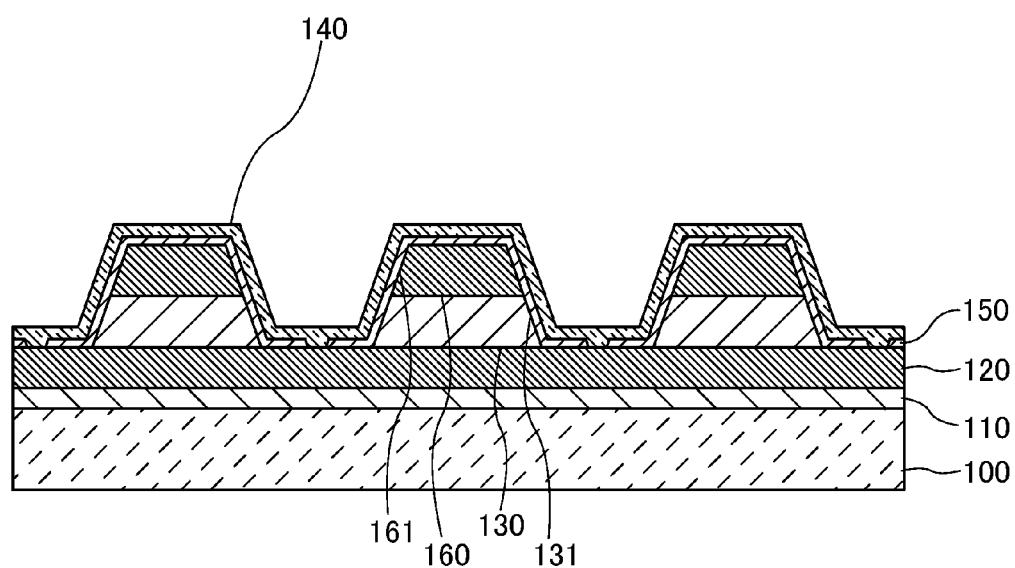
FIG. 36B is a cross-sectional view taken along line A-B in FIG. 36A.

FIG. 36A and FIG. 36B are respectively a plan view and a cross-sectional view showing a step of forming the oxide semiconductor layer 140 in the manufacturing method of the semiconductor device 40 in embodiment 4 according to the present invention. Referring to FIG. 36B, a film for the oxide semiconductor layer 140 is formed on the entirety of the substrate shown in FIG. 35B, and patterning is performed as shown in FIG. 36A by photolithography and etching to form the oxide semiconductor layer 140. As shown in FIG. 36A, the oxide semiconductor layer 140 covers the gate electrodes 160 as seen in a plan view. Also as seen in a plan view, the oxide semiconductor layer 140 at least partially overlaps the first openings 152.

Figure 37A:
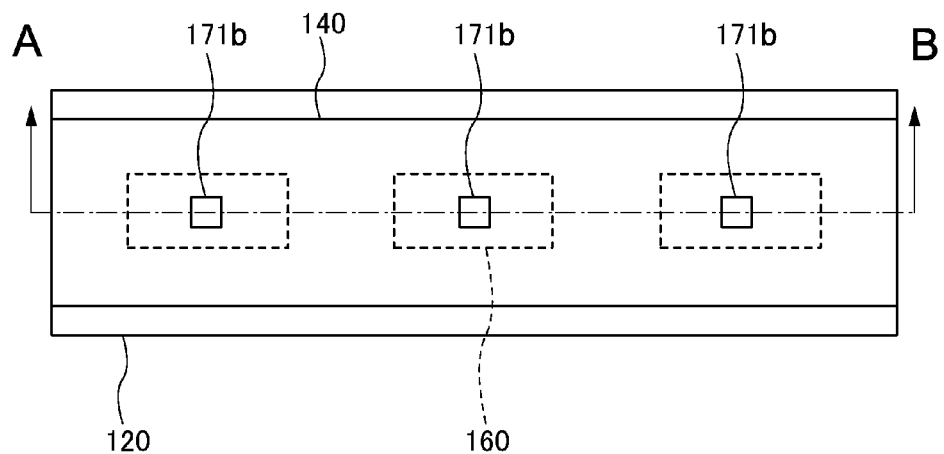
FIG. 37A is a plan view showing a step of forming a first insulating layer and also forming openings in the first insulating layer in the manufacturing method of the semiconductor device in the embodiment according to the present invention.
Figure 37B:
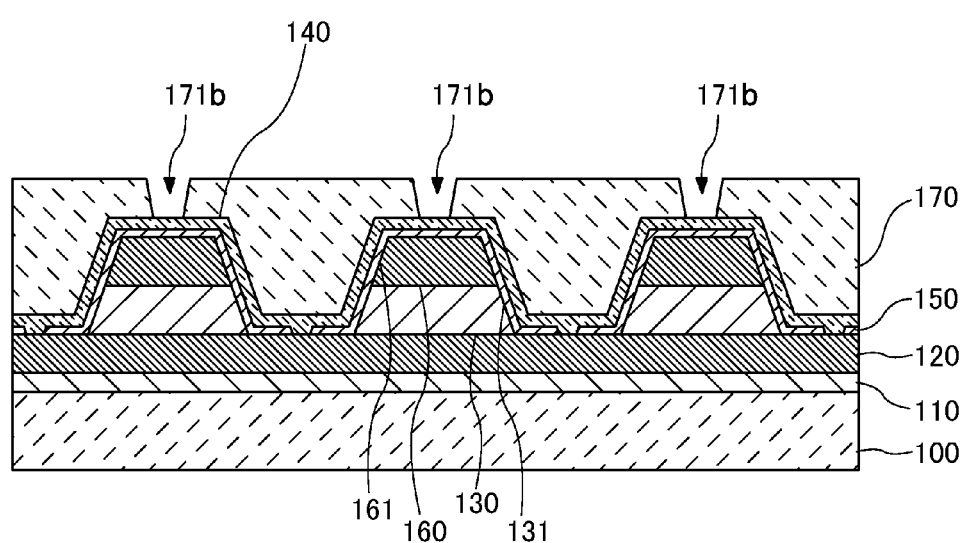
FIG. 37B is a cross-sectional view taken along line A-B in FIG. 37A.

FIG. 37A and FIG. 37B are respectively a plan view and a cross-sectional view showing a step of forming the first insulating layer 170 and also forming the plurality of the second openings 171b in the first insulating layer 170 in the manufacturing method of the semiconductor device 40 in embodiment 4 according to the present invention. Referring to FIG. 37B, the first insulating layer 170 is formed on the entirety of the substrate shown in FIG. 36B, and patterning is performed as shown in FIG. 37A to form the plurality of second openings 171b. The second openings 171b expose the oxide semiconductor layer 140. Although not shown in FIG. 37A and FIG. 37B, a second opening 171a exposes the lower electrode 120, and the second opening 171c exposes the gate electrode 160, in areas not shown in FIG. 37A and FIG. 37B.

Then, a film for the upper electrode 180b is formed on the entirety of the substrate shown in FIG. 37B, and patterning is performed to form the upper electrode 180b as shown in FIG. 33A and FIG. 33B. The semiconductor device 40 in embodiment 4 according to the present invention is manufactured by the manufacturing method described above. Referring to FIG. 33B, portions of the oxide semiconductor layer 140 that are located on the ring-shaped first side walls 161 along ends of the gate electrodes 160 are each a part of the corresponding channel region 143. More specifically, as shown in FIG. 33A, the plurality of channel regions 143 are each formed in a ring shape along the end of each of the plurality of gate electrodes 160. The surround-type semiconductor device 40 in which an end of the oxide semiconductor layer 140 is not included in any of the channel regions 143 is manufactured by the above-described method.

Embodiment 5

With reference to FIG. 38A through FIG. 42B, an overview of a semiconductor device 50 in embodiment 5 according to the present invention will be described. The semiconductor device 50 in embodiment 5 has the same cross-sectional structure as, but has a different layout from, that of the semiconductor device 20 shown in FIG. 19A and FIG. 19B.

[Structure of the Semiconductor Device 50]

Figure 38A:
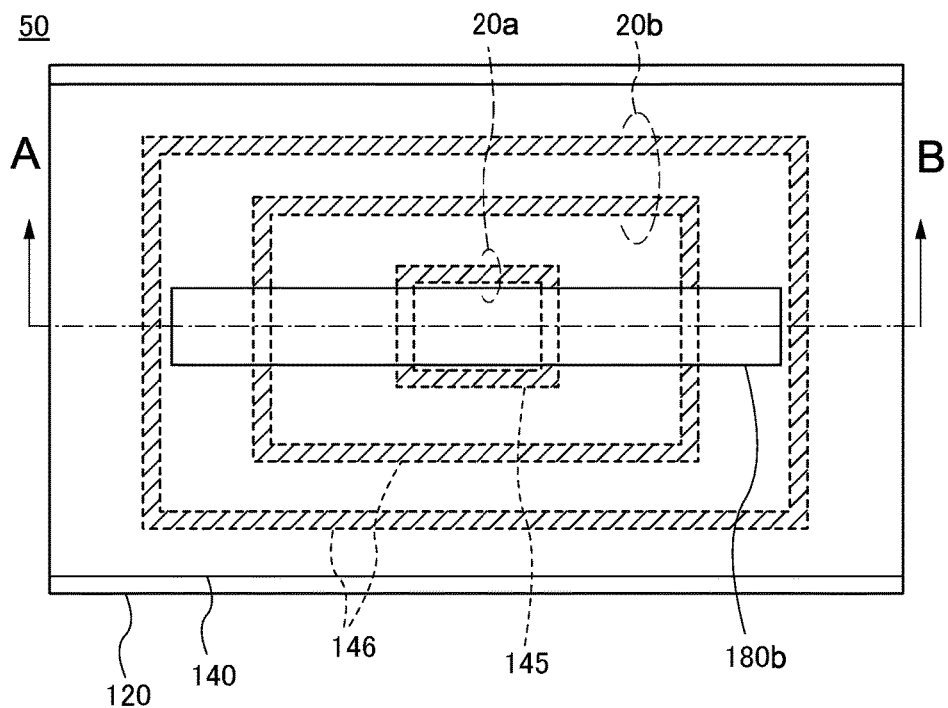
FIG. 38A is a plan view showing an overview of a semiconductor device in an embodiment according to the present invention.
Figure 38B:
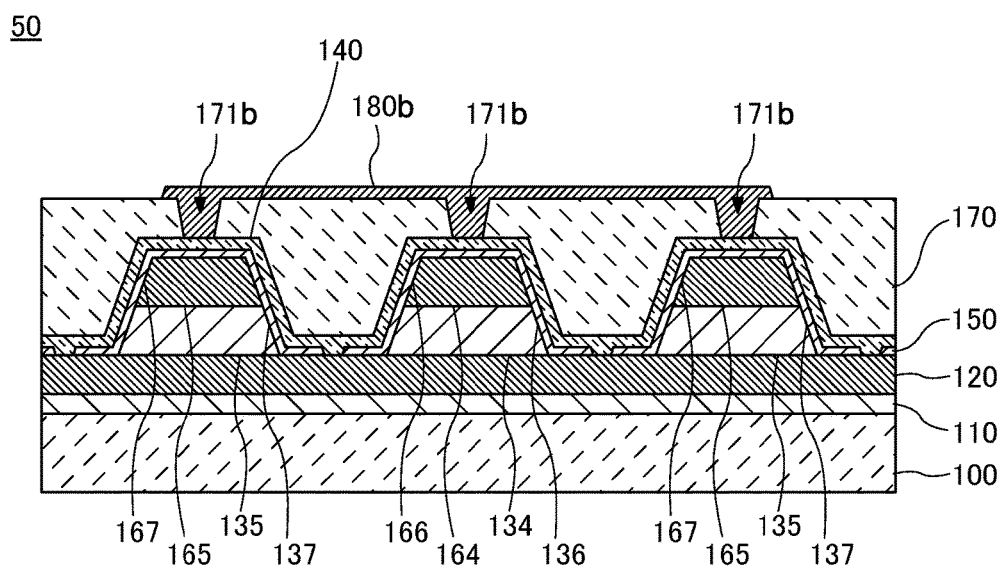
FIG. 38B is a cross-sectional view taken along line A-B in FIG. 38A.

FIG. 38A and FIG. 38B are respectively a plan view and a cross-sectional view showing an overview of the semiconductor device 50 in embodiment 5 according to the present invention. As shown in FIG. 38A and FIG. 38B, the semiconductor device 50 in embodiment 5 includes a plurality of the surround-type semiconductor devices 20 shown in FIG. 19A and FIG. 19B that are coupled parallel to each other, such that the ring-shaped channel regions are multiplexed. More specifically, a semiconductor device 20b including second ring-shaped channel regions 146, which are outer channel regions, is located to surround a semiconductor device 20a including a first ring-shaped channel region 145, which is an inner channel region.

Figure 39A:
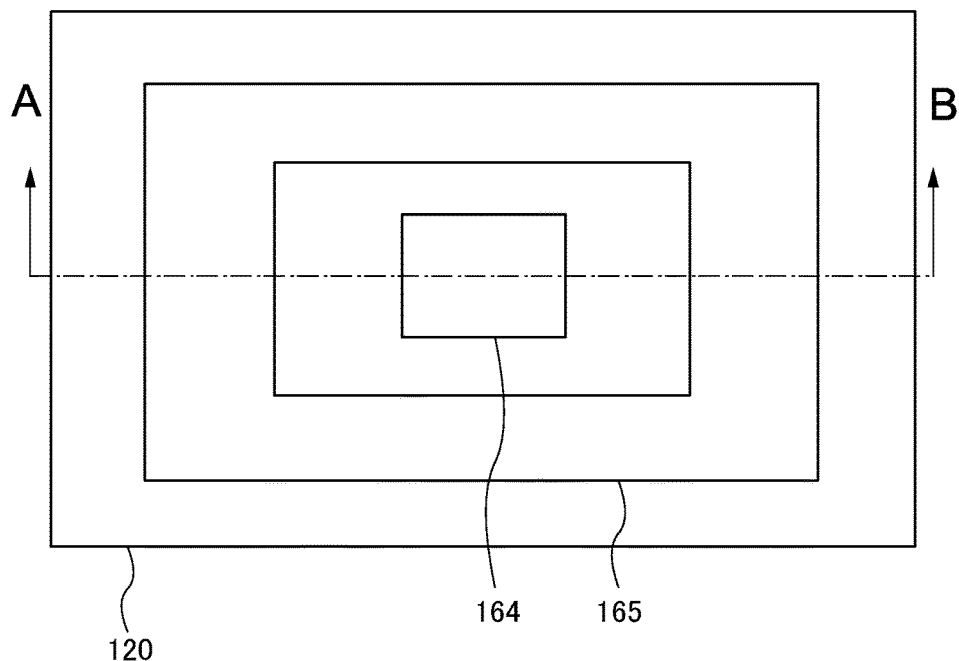
FIG. 39A is a plan view showing a step of forming a second insulating layer and a gate electrode on a lower electrode in a manufacturing method of the semiconductor device in the embodiment according to the present invention.
Figure 39B:
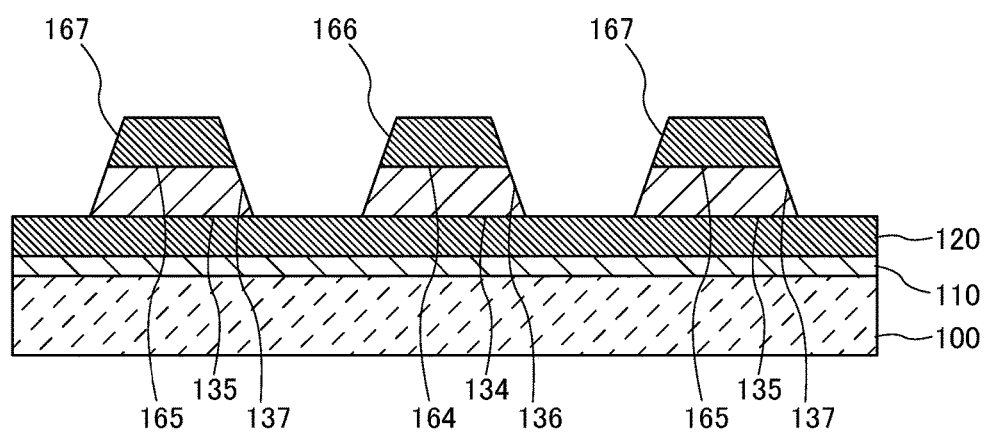
FIG. 39B is a cross-sectional view taken along line A-B in FIG. 39A.

As shown also in FIG. 39A and FIG. 39B, the semiconductor device 50 includes a second insulating layer 134 having a second side wall 136, a first gate electrode 164 having a first side wall 166, a third insulating layer 135 having a fourth side wall 137, and a second gate electrode 165 having a third side wall 167. The third insulating layer 135 and the second gate electrode 165 are located around the second insulating layer 134 and the first gate electrode 164. The first side wall 166 and the third side wall 167 face each other as seen in a plan view. The second side wall 136 and the fourth side wall 137 face each other as seen in a plan view. More specifically, the first side wall 166 and the second side wall 136 are provided at ends (outer circumferential surfaces) of the first gate electrode 164 and the second insulating layer 134. The third side wall 167 and the fourth side wall 137 are provided both at outer circumferential surfaces and inner circumferential surfaces of the second gate electrode 165 and the third insulating layer 135. The first electrodes 120 of the semiconductor devices 20a and 20b are provided as one integral first electrode 120, and the upper electrodes 180b of the semiconductor devices 20a and 20b are provided as one integral upper electrode 180b. Therefore, the semiconductor devices 20a and 20b in the semiconductor devices 50 are supplied with the same source-drain voltage at the same time and with the same gate voltage at the same time.

In the example shown in FIG. 38A and FIG. 38B, the semiconductor device 50 has a structure in which the ring-shaped channel regions of the surround-type semiconductor devices 20 shown in FIG. 19A and FIG. 19B in embodiment 2 are multiplexed. The semiconductor device 50 is not limited to having such a structure, and may have a structure in which the ring-shaped channel regions 144 of the surround-type semiconductor devices 30 shown in FIG. 26A and FIG. 26B in embodiment 3 are multiplexed. In the example shown in FIG. 38A and FIG. 38B, the surround-type semiconductor devices 20a and 20b each have the structure of embodiment 2 shown in FIG. 19A and FIG. 19B. Alternatively, a plurality of the surround-type semiconductor devices in modification 1 or 2 of embodiment 1 shown in FIG. 7A and FIG. 7B or FIG. 13A and FIG. 13B may be used to realize a semiconductor device.

As described above, in the semiconductor device 50, the ring-shaped channel region 145 of the semiconductor device 20a and the ring-shaped channel regions 146 of the semiconductor device 20b are turned on/off at the same time. Therefore, the W length of the semiconductor device 50 is substantially increased. As a result, the semiconductor device 50 is capable of increasing the on-current.

[Manufacturing Method of the Semiconductor Device 50]

In order to more clarify the structure of the semiconductor device 50 shown in FIG. 38A and FIG. 38B, a manufacturing method of the semiconductor device 50 will be described with reference to plan views and cross-sectional views provided in FIG. 39A through FIG. 42B. The cross-sectional structure of each of the semiconductor devices 20a and 20b included in the semiconductor device 50 shown in FIG. 38A and FIG. 38B is the same as that of the semiconductor device 20 shown in FIG. 19A and FIG. 19B, and thus will not be described in detail.

FIG. 39A and FIG. 39B are respectively a plan view and a cross-sectional view showing a step of forming the second insulating layer 134, the first gate electrode 164, the third insulating layer 135 and the second gate electrode 165 in the manufacturing method of the semiconductor device 50 in embodiment 5 according to the present invention. As shown in FIG. 39A and FIG. 39B, the second insulating layer 134 and the first gate electrode 164, and also the third insulating layer 135 and the second gate electrode 165, are formed on one lower electrode 120. The third insulating layer 135 and the second gate electrode 165 are located around the second insulating layer 134 and the first gate electrode 164. In the example shown in FIG. 39A and FIG. 39B, the first gate electrode 164 and one second gate electrode 165 surrounding the first gate electrode 164 are formed on one lower electrode 120. The semiconductor device 50 is not limited to having such a structure, and another gate electrode surrounding the second gate electrode 165 may be formed on the same lower electrode 120. The second insulating layer 134 and the first gate electrode 164 have substantially the same pattern, and thus FIG. 39A shows the pattern of the first gate electrode 164. The third insulating layer 135 and the second gate electrode 165 have substantially the same pattern, and thus FIG. 39A shows the pattern of the second gate electrode 165.

As shown in FIG. 39A, as seen in a plan view, the first gate electrode 164 and the second gate electrode 165 are located inner to an outer perimeter of the one lower electrode 120. The semiconductor device 50 is not limited to having such a structure. For example, the first gate electrode 164 and the second gate electrode 165 may be entirely or partially located outer to the lower electrode 120 as seen in a plan view, so that a part of the second insulating layer 134 or the third insulating layer 135 may be in contact with the underlying layer 110 as seen in a cross-sectional view. In the case where the entirety of the first gate electrode 164 and the second gate electrode 165 is located outer to the lower electrode 120 as seen in a plan view, namely, in the case where neither the first gate electrode 164 nor the second gate electrode 165 overlaps the lower electrode 120 as seen in a plan view, the first gate electrode 164 and the second gate electrode 165 may be in direct contact with the underlying layer 110 with neither the second insulating layer 134 nor the third insulating layer 135 being provided.

As seen in the cross-sectional view of FIG. 39B, the first gate electrode 164 has the first side wall 166, and the second insulating layer 134 has the second side wall 136. The second gate electrode 165 has the third side wall 167, and the third insulating layer 135 has the fourth side wall 137. The tapering angle of the first side wall 166 and the third side wall 167 may be controlled by the etching rate of the first gate electrode 164 and the second gate electrode 165 and the retraction amount of a resist used as a mask for etching the first gate electrode 164 and the second gate electrode 165. The tapering angle of the second side wall 136 and the fourth side wall 137 may be controlled by the etching rate of the second insulating layer 134 and the third insulating layer 135 and the retraction amount of a resist used as a mask for etching the second insulating layer 134 and the third insulating layer 135.

Figure 40A:
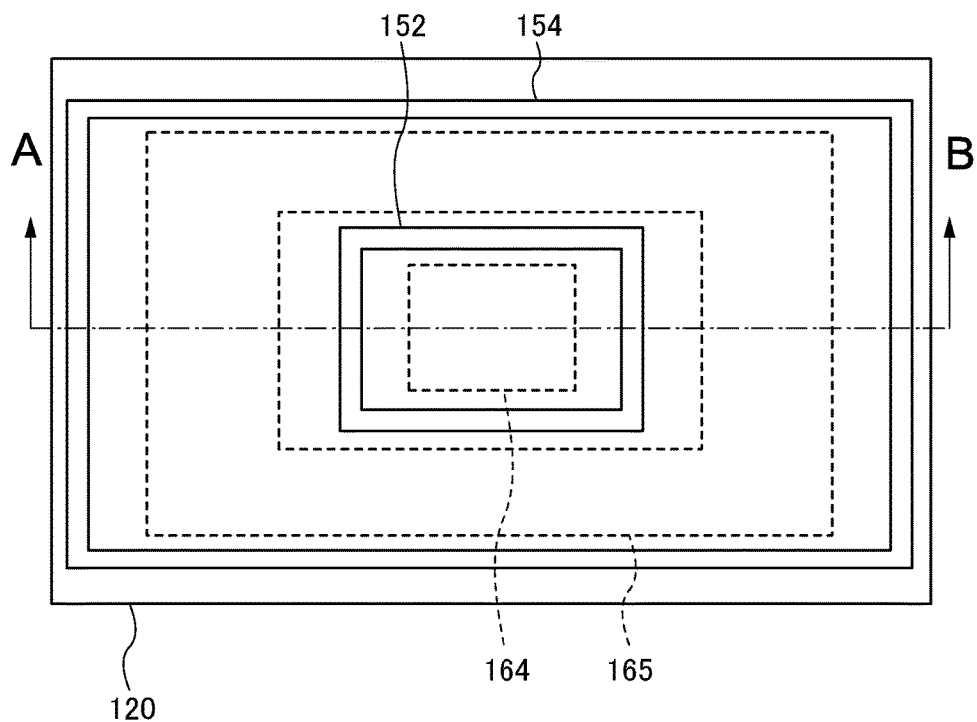
FIG. 40A is a plan view showing a step of forming a gate insulating layer and exposing a part of the lower electrode in the manufacturing method of the semiconductor device in the embodiment according to the present invention.
Figure 40B:
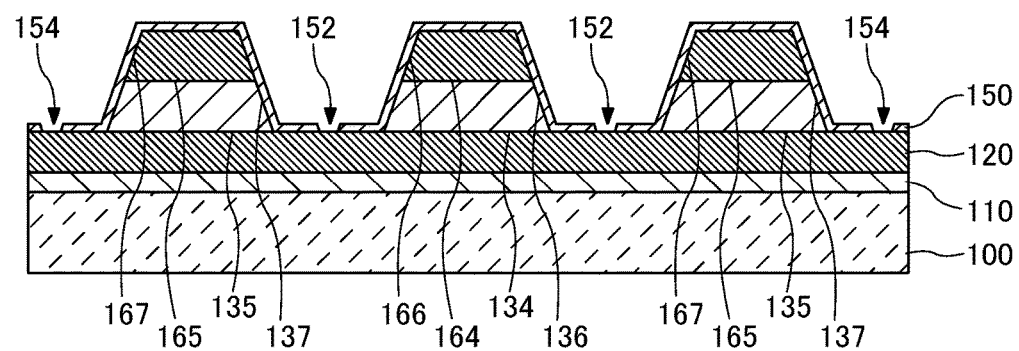
FIG. 40B is a cross-sectional view taken along line A-B in FIG. 40A.

FIG. 40A and FIG. 40B are respectively a plan view and a cross-sectional view showing a step of forming the gate insulating layer 150 and exposing a part of the lower electrode 120 in the manufacturing method of the semiconductor device 50 in embodiment 5 according to the present invention. Referring to FIG. 40B, the gate insulating layer 150 is formed on the entirety of the substrate shown in FIG. 39B, and patterning is performed as shown in FIG. 40A by photolithography and etching to form the first opening 152 and a third opening 154. As shown in FIG. 40A, the first opening 152 is provided in a ring shape to surround the first gate electrode 164. The first opening 152 is provided inner to the second gate electrode 165. Namely, the first opening 152 is provided between the first gate electrode 164 and the second gate electrode 165. The third opening 154 is provided in a ring shape to surround the second gate electrode 165.

The first opening 152 and the third opening 154 are not limited to having the planar shape shown in FIG. 40A. It is sufficient that the first opening 152 and the third opening 153 each expose at least the lower electrode 120. It is sufficient that the gate insulating layer 150 covers a top surface and the first side wall 166 of the first gate electrode 164 and a top surface and the second side wall 167 of the second gate electrode 165. The gate insulating layer 150 may expose the second side wall 136, the fourth side wall 137, the lower electrode 120 and the underlying layer 110. In other words, it is sufficient that the gate insulating layer 150 covers the first gate electrode 164 and the second gate electrode 165 as seen in a plan view.

Figure 41A:
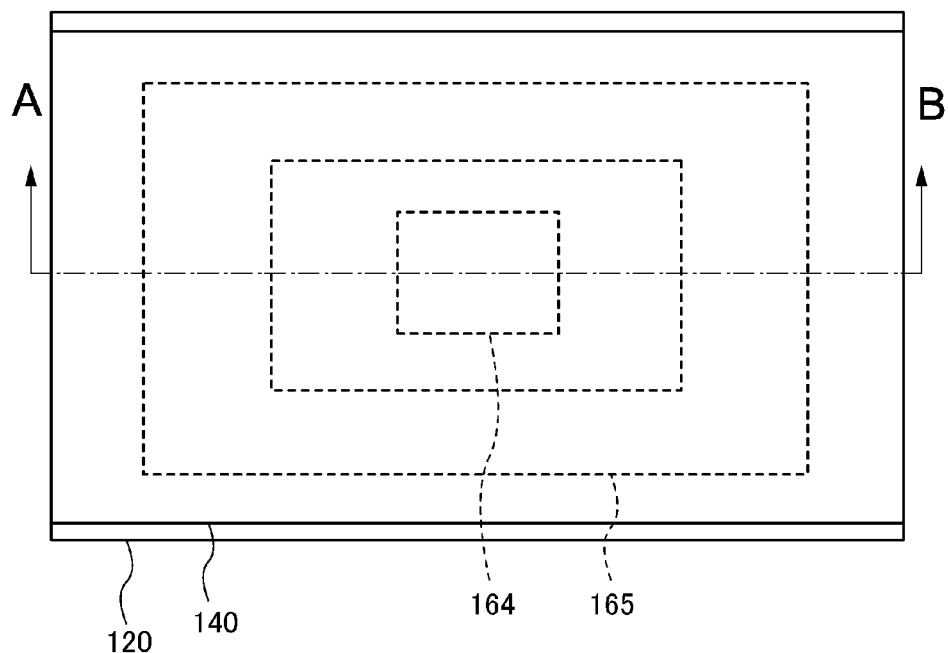
FIG. 41A is a plan view showing a step of forming an oxide semiconductor layer in the manufacturing method of the semiconductor device in the embodiment according to the present invention.
Figure 41B:
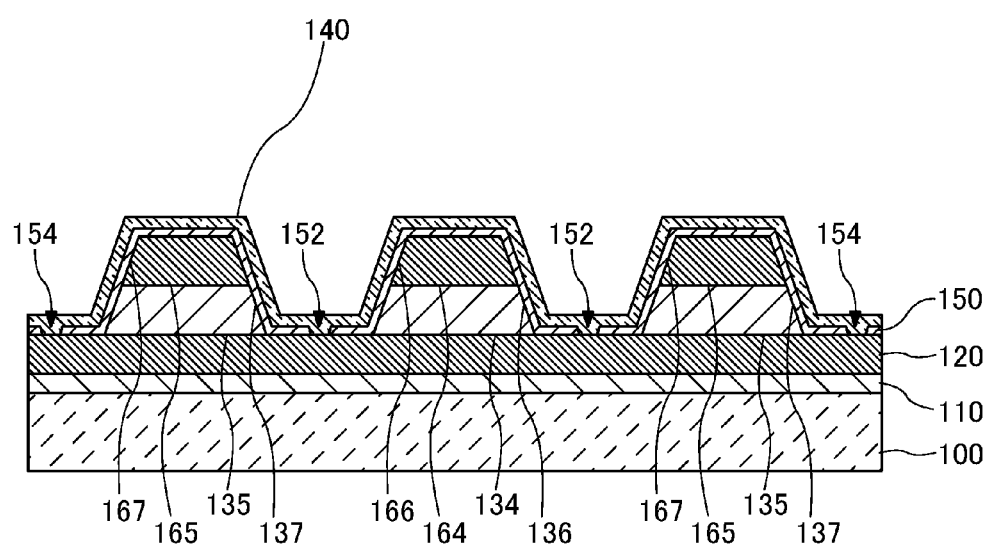
FIG. 41B is a cross-sectional view taken along line A-B in FIG. 41A.

FIG. 41A and FIG. 41B are respectively a plan view and a cross-sectional view showing a step of forming the oxide semiconductor layer 140 in the manufacturing method of the semiconductor device 50 in embodiment 5 according to the present invention. Referring to FIG. 41B, a film for the oxide semiconductor layer 140 is formed on the entirety of the substrate shown in FIG. 40B, and patterning is performed as shown in FIG. 41A to form the oxide semiconductor layer 140. As shown in FIG. 41A, as seen in a plan view, the oxide semiconductor layer 140 covers the first gate electrode 164 and the second gate electrode 165. The oxide semiconductor layer 140 at least partially overlaps the first opening 152 and the third opening 154 as seen in a plan view.

Figure 42A:
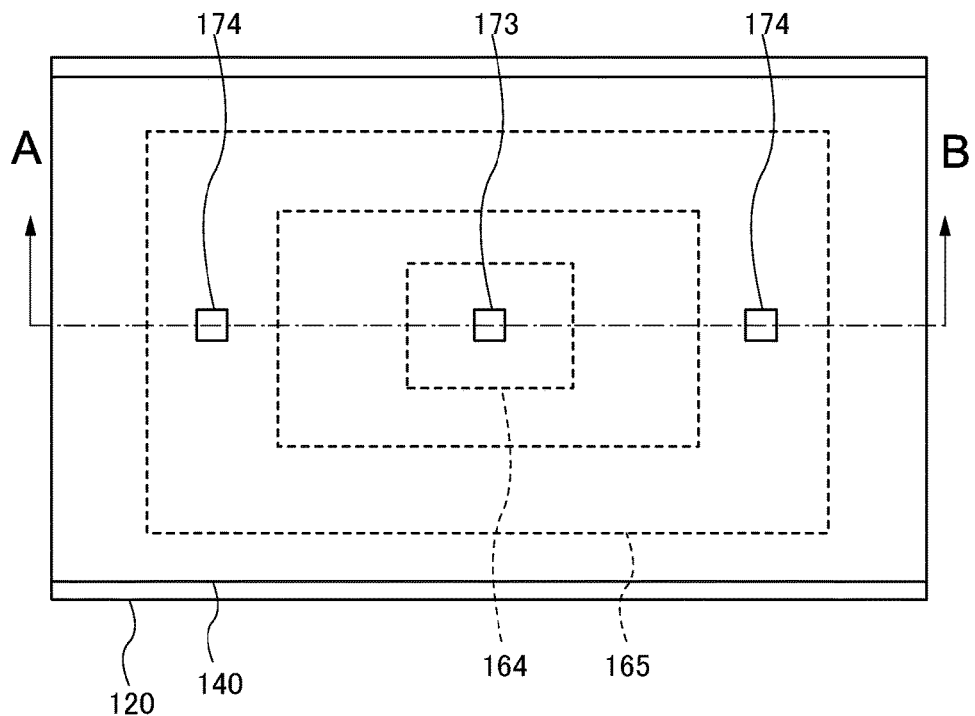
FIG. 42A is a plan view showing a step of forming a first insulating layer and also forming openings in the first insulating layer in the manufacturing method of the semiconductor device in the embodiment according to the present invention.
Figure 42B:
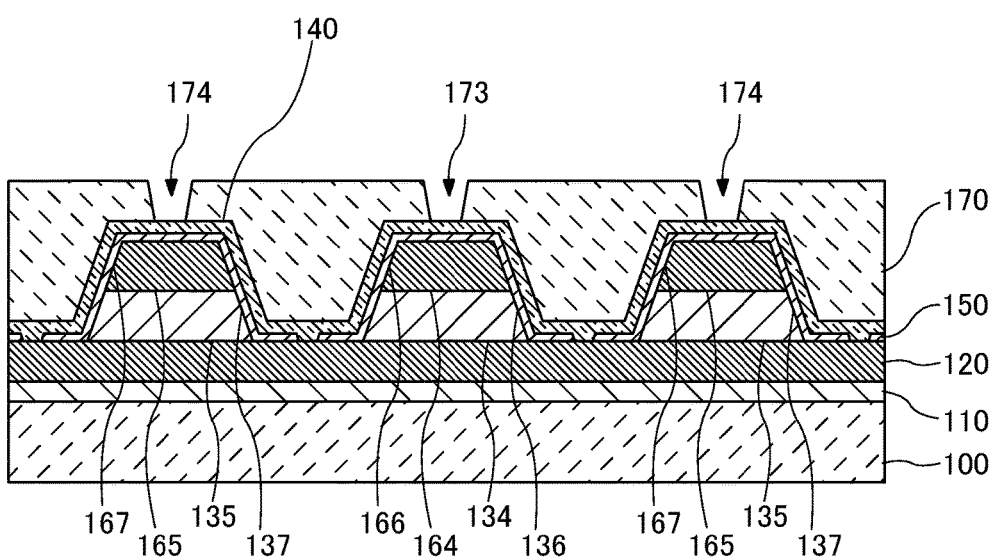
FIG. 42B is a cross-sectional view taken along line A-B in FIG. 42A.

FIG. 42A and FIG. 42B are respectively a plan view and a cross-sectional view showing a step of forming the first insulating layer 170 and also forming openings in the first insulating layer 170 in the manufacturing method of the semiconductor device 50 in embodiment 5 according to the present invention. Referring to FIG. 42B, the first insulating layer 170 is formed on the entirety of the substrate shown in FIG. 41B, and patterning is performed as shown in FIG. 42A by photolithography and etching to form a second opening 173 and fourth openings 174. The second opening 173 and the fourth openings 174 each expose the oxide semiconductor layer 140. Although not shown in FIG. 42A and FIG. 42B, there are openings that expose the lower electrode 120, the first gate electrode 164 and the second gate electrode 165 in areas not shown in FIG. 42A and FIG. 42B.

Then, a film for the upper electrode 180b is formed on the entirety of the substrate shown in FIG. 42B, and patterning is performed to form the upper electrode 180b as shown in FIG. 38A and FIG. 38B. The semiconductor device 50 in embodiment 5 according to the present invention is manufactured by the manufacturing method described above. Referring to FIG. 38B, portions of the oxide semiconductor layer 140 that are located on the ring-shaped first side wall 166 and the ring-shaped third side wall 167 respectively on the ends of the first gate electrode 164 and the second gate electrode 165 are each a part of the channel regions. More specifically, as shown in FIG. 38A, the first channel region 145 is formed in a ring shape along the outer circumferential surface of the first gate electrode 164. The second channel regions 146 are formed in a ring shape along an inner circumferential surface and an outer circumferential surface of the second gate electrode 165. The surround-type semiconductor device 50 in which an end of the oxide semiconductor layer 140 is not included in any of the channel regions 144 and 145 is manufactured by the above-described method.

The present invention is not limited to any of the above-described embodiments, and the embodiments may be modified appropriately without departing from the gist of the present invention.

What is claimed is:

1. A semiconductor device, comprising:
   a gate electrode having a first side wall at an end thereof;
   a gate insulating layer on a top surface and the first side wall of the gate electrode;
   an oxide semiconductor layer facing the first side wall, the gate insulating layer being between the first side wall and the oxide semiconductor layer;
   a first insulating layer on the oxide semiconductor layer, the oxide semiconductor layer being between the gate insulating layer and the first insulating layer;
   a first electrode connected with a first portion of the oxide semiconductor layer; and
   a second electrode connected with a second portion of the oxide semiconductor layer, wherein
   the first insulating layer is in contact with the oxide semiconductor layer,
   the oxide semiconductor layer is connected with the first electrode via a first opening in the gate insulating layer; and
   the second electrode is connected with the oxide semiconductor layer via a second opening in the first insulating layer.

2. The semiconductor device according to claim 1, wherein the first side wall is tapered.

3. The semiconductor device according to claim 1, further comprising a second insulating layer between the gate electrode and the first electrode;
   wherein the gate electrode overlaps the first electrode as seen in a plan view.

4. The semiconductor device according to claim 3, wherein:
   the second insulating layer has a second side wall at an end thereof;
   the gate insulating layer is on the second side wall; and
   the oxide semiconductor layer faces the second side wall, and the gate insulating layer is between the second side wall and the oxide semiconductor layer.

5. The semiconductor device according to claim 3, wherein the first side wall is ring-shaped and is along the end of the gate electrode.

6. The semiconductor device according to claim 3, wherein the first side wall is inner to the gate electrode, is ring-shaped, and exposed to an opening reaching the first electrode.

7. A semiconductor device, comprising:
   a gate electrode having a first side wall at an end thereof;
   an oxide semiconductor layer along the first side wall;
   a gate insulating layer between the gate electrode and the oxide semiconductor layer;
   a first insulating layer on the oxide semiconductor layer, the oxide semiconductor layer being between the gate electrode and the first insulating layer;
   a first electrode connected with a first portion of the oxide semiconductor layer; and
   a second electrode connected with a second portion of the oxide semiconductor layer, wherein
   the first insulating layer is in contact with the oxide semiconductor layer,
   the oxide semiconductor layer is connected with the first electrode via a first opening in the gate insulating layer; and
   the second electrode is connected with the oxide semiconductor layer via a second opening in the first insulating layer.

8. The semiconductor device according to claim 7, wherein the first side wall is tapered.

9. The semiconductor device according to claim 7, further comprising a second insulating layer between the gate electrode and the first electrode;
   wherein the gate electrode overlaps the first electrode as seen in a plan view.

10. The semiconductor device according to claim 9, wherein:
    the second insulating layer has a second side wall at an end thereof;
    the gate insulating layer is on the second side wall; and
    the oxide semiconductor layer faces the second side wall, and the gate insulating layer is between the second side wall and the oxide semiconductor layer.

11. The semiconductor device according to claim 9, wherein the first side wall is ring-shaped and is along the end of the gate electrode.

12. The semiconductor device according to claim 9, wherein the first side wall is inner to the gate electrode, is ring-shaped, and exposed to an opening reaching the first electrode.

13. A semiconductor device, comprising:
    a gate electrode having a first side wall at an end thereof;
    a gate insulating layer on a top surface and the first side wall of the gate electrode;
    an oxide semiconductor layer facing the first side wall, the gate insulating layer being between the first side wall and the oxide semiconductor layer;
    a first insulating layer on the oxide semiconductor layer, the oxide semiconductor layer being between the gate insulating layer and the first insulating layer;
    a first electrode connected with a first portion of the oxide semiconductor layer;
    a second electrode connected with a second portion of the oxide semiconductor layer, and
    a second insulating layer between the gate electrode and the first electrode;
    wherein the gate electrode overlaps the first electrode as seen in a plan view, and the first side wall is inner to the gate electrode, is ring-shaped, and exposed to an opening reaching the first electrode.

* * * * *